United States Patent
Takechi et al.

(10) Patent No.: US 6,329,125 B2
(45) Date of Patent: Dec. 11, 2001

(54) CHEMICALLY AMPLIFIED RESIST COMPOSITIONS AND PROCESS FOR THE FORMATION OF RESIST PATTERNS

(75) Inventors: Satoshi Takechi; Akiko Kotachi; Koji Nozaki; Ei Yano; Keiji Watanabe; Takahisa Namiki; Miwa Igarashi; Yoko Makino; Makoto Takahashi, all of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/739,259

(22) Filed: Dec. 19, 2000

Related U.S. Application Data

(60) Division of application No. 08/969,368, filed on Nov. 28, 1997, now Pat. No. 6,200,725, which is a continuation-in-part of application No. 08/673,739, filed on Jun. 27, 1996, now Pat. No. 6,013,416.

(30) Foreign Application Priority Data

| Jun. 28, 1995 | (JP) | 7-162287 |
| Jul. 14, 1995 | (JP) | 7-178717 |
| Nov. 30, 1995 | (JP) | 7-312722 |
| Mar. 7, 1996 | (JP) | 8-50264 |
| Nov. 29, 1996 | (JP) | 8-320105 |

(51) Int. Cl.$^7$ .............................. G03F 7/039; G03F 7/30; G03F 7/38
(52) U.S. Cl. ............................................. 430/326; 430/330
(58) Field of Search ........................... 430/326, 330, 430/270.1

(56) References Cited

U.S. PATENT DOCUMENTS 5,310,619 * 5/1994 Crivello et al. ................. 430/326
5,585,223 * 12/1996 Frechet et al. ................. 430/330

FOREIGN PATENT DOCUMENTS

| 0 663 616 A2 | 12/1994 | (EP) . |
| 4-26850 | * 1/1992 | (JP) . |
| 4-39665 | * 2/1992 | (JP) . |
| 5-257284 | * 10/1993 | (JP) . |
| 6-199770 | * 7/1994 | (JP) . |
| 6-289615 | * 10/1994 | (JP) . |
| 7-120927 | * 5/1995 | (JP) . |
| 7-128852 | * 5/1995 | (JP) . |
| 8-15863 | * 1/1996 | (JP) . |
| 8-29985 | * 2/1996 | (JP) . |
| 8-101509 | * 4/1996 | (JP) . |
| 8-123031 | * 5/1996 | (JP) . |
| 8-123032 | * 5/1996 | (JP) . |
| 8-137107 | * 5/1996 | (JP) . |
| 8-254828 | * 10/1996 | (JP) . |
| 268107 | 4/1993 | (TW) . |

* cited by examiner

Primary Examiner—Cynthia Hamilton
(74) Attorney, Agent, or Firm—Armstrong, Westerman, Hattori, McLeland & Naughton, LLP

(57) ABSTRACT

Alkali-developable, chemically amplified resist composition which comprises an alkali-insoluble compound having a structural unit containing a protected alkali-soluble group in which unit a protective moiety of said protected alkali-soluble group contains an alicyclic hydrocarbon group having bonded to a carbon atom thereof a —$CH_2$—$R_1'$ group wherein $R_1'$ is methyl, ethyl, propyl or isopropyl, and said alkali-soluble group is cleaved upon action of an acid generated from a photoacid generator used in combination with said compound, thereby releasing said protective moiety from the alkali-soluble group and converting said compound to an alkali-soluble one, and a photoacid generator capable of being decomposed upon exposure to a patterning radiation to thereby produce an acid capable of causing cleavage of said protective moiety. The resist composition can exhibit a high sensitivity (not more than 5 mJ/cm$^2$) and therefore is particularly suitable for ArF lithography and also can exhibit stable patterning properties.

1 Claim, 2 Drawing Sheets

CHEMICALLY AMPLIFIED RESIST COMPOSITIONS AND PROCESS FOR THE FORMATION OF RESIST PATTERNS

CROSS-REFERENCE TO RELATED APPLICATION

This application is a division of prior application Ser. No. 08/969,368, filed Nov. 28, 1997, now U.S. Pat. No. 6,200,725, which is a Continuation-In-Part of U.S. application Ser. No. 08/673,739 filed on Jun. 27, 1996, now U.S. Pat. No. 6,013,416.

BACKGROUND OF THE INVENTION

1. Field of the Invention

The present invention relates to a chemically amplified resist composition and a process for the formation of resist patterns using the same. More particularly, in one aspect, the present invention relates to a resist composition which can be exposed to any patterning radiation having a relatively short wavelength such as excimer laser light and can also utilize an alkaline solution as a developer. The chemically amplified resist composition of the present invention can provide fine positive-working resist patterns without swelling. Further, the thus produced resist patterns can provide a practically usable sensitivity and an excellent resistance to dry etching. In another aspect, the present invention relates to a resist composition which can exhibit a higher resolution, higher sensitivity and excellent resistance to dry etching, and also can effectively avoid cracking in the resulting resist patterns and peeling-off of the patterns from the substrate. In still another aspect, the present invention relates to a resist composition which can exhibit a high sensitivity and stable patterning properties which are particularly desired in the field of ArF lithography. Accordingly, the present invention can be advantageously utilized in the production of semiconductor devices such as semiconductor integrated circuits, for example, LSIs, VLSIs, ULSIs and other devices, using a lithographic process.

2. Description of the Related Art

Recently, in the production of semiconductor integrated circuits, the degree of integration thereof has been notably increased and accordingly LSIs and VLSIs have been produced on a commercial scale. The minimum line width of the circuit patterns in these devices approaches the sub-half micron or quarter micron order. In other words, in the production of these high performance devices, it is required to provide an established fine fabrication technology.

In the field of lithography, to satisfy the above requirements, an approach in which ultraviolet (UV) radiation as an exposure source is shifted to shorter wavelengths in the far or deep ultraviolet region has been suggested, along with research for providing new exposure devices provided with a light source capable of emitting such short wavelength radiation in the deep ultraviolet region.

Currently, photolithograpy using a krypton fluoride (KrF) excimer laser having a wavelength of 248 nm as an exposure source has been noted as a novel exposure technology, and it has also been urged to find novel resist materials suitable for exposure to such short wavelength radiation and stably showing a high sensitivity and high resolution. A chemical amplification system and a resist material based on said system, i.e., chemically amplified resist composition, have been disclosed by Ito et al. of IBM Corp. to be useful for KrF lithography (see, for example, J. M. Frechet et al., *Proc. Microcircuit Eng.*, 260 (1982); H. Ito et al., Digest of Technical Papers of 1982 Symposium on VLSI Technology, 86 (1983); H. Ito et al., "Polymers in Electronics", ACS Symposium Series 242, edited by T. Davidson, ACS 11 (1984); and U.S. Pat. No. 4,491,628). As will be easily understood by referring to these articles, the basic concept of the chemically amplified resist composition developed by Ito et al. resides in that a catalytic reaction is first induced in the coating from the resist composition, thereby increasing an apparent quantum yield to a level sufficient to highly increase a sensitivity of the resist composition.

The above concept of the chemically amplified resist composition will be further clarified with reference to one typical example of the well-known chemically amplified resist compositions which have been widely studied by the researchers in the field of resist chemistry, namely, the chemically amplified resist composition comprising t-buthoxycarbonyl polyvinylphenol (t-BOCPVP) and a photoacid generator (PAG) capable of releasing an acid upon action of the exposure radiation. After it was coated over the substrate, the resist composition is exposed to the exposure radiation, and as a result of such exposure, an acid is released from the PAG. Then, the exposed resist composition or coating is subjected to post-exposure baking (PEB). As a result of this baking, in the exposed areas of the resist coating, a t-BOC group is cleaved from t-BOCPVP to produce isobutene and carbon dioxide. Further, a protonic acid simultaneously produced during cleavage of the t-BOC group can act as a catalyst in the above-mentioned cleavage reaction which therefore proceeds like a chain reaction, thus largely varying the polarity of the exposed areas. In this resist composition, if a suitable developer which is compatible with such a large variation of the polarity in the exposed areas is selected, satisfactory resist patterns can be easily produced.

However, conventional chemically amplified resist materials including the above-discussed t-BOCPVP-based resist composition have one problem in that because of the restricted chemical structure of the resin used as a basic component thereof, they cannot fully satisfy the requirements concerning sensitivity, transparency to the exposure radiation, stability in storage, ease in procurement, resolution and the like. Among the possible restrictions to the chemical structure of the resist resin, the most important restriction is the restriction to a protective group which is attached to said resin, but is able to be cleaved therefrom upon baking of the exposed resin in the presence of a photoacid generator. Namely, in the film-forming resin in which a side chain of the monomeric unit of the resin contains a carboxylic acid ester attached thereto as a chemical amplification-concerning component, protective groups which are recognized to be suitable for the carboxyl group of said ester include only t-butyl group, 1,1-dimethylbenzyl group, tetrahydropyranyl group, 3-oxocyclohexyl group and isobornyl group. These protective groups are inappropriate, and therefore it is desired to provide a new protective group which can be more effectively utilized in the chemically amplified resist materials than the above protective groups.

In addition to the improvement in the protective group introduced into the resist resin, the conventional fine fabrication technology includes problems concerning some defects in the resulting resist patterns which defects will be described hereinafter.

Using the fine fabrication technology, fine resist patterns can be generally produced by coating a substrate having on a surface thereof a layer or coating to be fabricated, such as a layer to be selectively etched, with a resist material, and exposing the resist coating to a patterning radiation to thereby form a latent image corresponding to a pattern of said radiation. The latent image of the resist coating is then developed with a suitable developer. A desired resist pattern is thus obtained. The resist pattern can be effectively utilized as a masking means in the subsequent etching process to selectively etch the underlying layer. Said patterning radiation generally includes ultraviolet radiation such as the g-line (wavelength of 436 nm) and i-line (wavelength of 365 nm), however, as briefly mentioned in the above paragraphs, it also includes other radiations having shorter wavelengths such as deep ultraviolet radiation, vacuum ultraviolet radiation, electron beam (EB), X-ray and others as well as excimer laser such as KrF laser of the wavelength of 248 nm and ArF laser of the wavelength of 193 run. Note that the term "radiation" used herein means all of the above-mentioned radiations.

In the formation of submicron-ordered resist patterns using as a patterning radiation the radiation in the range of far ultraviolet or vacuum ultraviolet regions, it is necessary to use specific resist materials having an excellent transparency to the patterning radiation and also a high resistance to dry etching. The inventors of this application have zealously studied this and found that said need is satisfied by the radiation-sensitive material comprising a polymer or copolymer of acrylic acid ester or α-substituted acrylic acid ester in which the ester portion contains an adamantyl skeleton (see, Japanese Unexamined Patent Publication (Kokai) No. 4-39665). Similarly, the inventors have found that the chemically amplified radiation-sensitive material comprising a polymer or copolymer of acrylic acid ester or α-substituted acrylic acid ester in which the ester portion contains a norbornane skeleton (see, Japanese Unexamined Patent Publication (Kokai) No. 5-257284).

Surprisingly, the chemically amplified resist materials suggested by the inventors have an excellent resistance to dry etching, in addition to a higher transparency to radiation from wide variety of light sources, especially excimer laser light having a wavelength in the far ultraviolet and vacuum ultraviolet regions. However, these resist materials still have drawbacks concerning difficulty in obtaining stable patterning characteristics. For example, depending upon the conditions applied to the materials, for example, when they are coated at a relatively larger thickness or the exposed resist coating is developed with a developer having a higher solubility, the resist materials are liable to cause cracking of the resist patterns or separation or peeling off of the patterns from the underlying layer. The exact reason why such defective resist patterns are produced is unknown, however, the inventors of the present application understand from their experience that since alicyclic hydrocarbon moiety in the skeleton of the resist material has a strong hydrophobic nature and rigidity, the strain applied to the resist coating during development is increased.

Further, due to presence of the alicyclic hydrocarbon moiety therein, the above-mentioned chemically amplified resist materials suffer from the drawback that conventional alkaline developers cannot be used in the development process. Namely, it is understood that due to a strong hydrophobic nature of the alicyclic hydrocarbon moiety, the resist materials containing said alicyclic moiety cannot be sufficiently dissolved in the alkaline developers. Note, however, that the inventors have found that the above problem concerning use of the alkaline developers can be solved if the formation of resist patterns is made by using a resist material which comprises a polymer or copolymer having a repeating unit containing a protected alkali-soluble group capable of releasing a protective group upon exposure to an acid, thereby making the polymer or copolymer alkali-soluble, and a photoacid generator capable of producing an acid upon exposure to radiation, and developing the exposed resist coating with a developer containing an aqueous solution or alcoholic solution of the specified ammonium compound or morpholine compound (see, Japanese Patent Application No. 7-23053 filed on Feb. 10, 1995).

Furthermore, other problems in the above-mentioned chemically amplified resist materials are that due to its poor adhesion to the underlying layer or coating to be etched, the resist coating can separate from the substrate during development, and that when the patterning exposure of the resist coating is made through an exposure mask which is designed to prevent permeation of the patterning radiation corresponding the circuit pattern to be printed, the resulting resist patterns have an expanded configuration larger than that of the exposure mask used. It is therefore desired to provide a resist material capable of exactly and faithfully reproducing the fine patterns of the exposure mask used.

SUMMARY OF THE INVENTION

The present invention is directed to solve all the above-discussed problems in the prior art's chemically amplified resist materials, and in order to attain this aim, the inventors have selected one approach to improve the resist material itself, not selecting another approach to improve a developer used in the resist process.

One object of the present invention is to provide a novel chemically amplified resist composition which enables use of a conventional alkaline solution, especially aqueous alkaline solution, as a developer, and can provide unswelled fine patterns with a practically useful sensitivity.

Another object of the present invention is to provide a novel chemically amplified resist composition which can be used in lithography using exposure lights in the deep ultraviolet region, for example, KrF excimer laser light and the like, and can provide resist patterns having excellent resistance to dry etching.

Further, another object of the present invention is to provide a novel chemically amplified resist composition which can increase the difference in the polarity between exposed areas and unexposed areas, thereby simultaneously enabling a high sensitivity, high contrast and accordingly high resolution.

Furthermore, another object of the present invention is to provide a novel chemically amplified resist composition which has a high transparency to various radiations, particularly shorter wavelength radiations including KrF and ArF excimer laser light, and can form positive-working fine resist patterns having an excellent resistance to dry etching along with the diminished cracking and peeling off of the resist patterns during the development step, namely, stabilized patterning characteristics.

Still another object of the present invention is to provide a novel chemically amplified resist composition which can exhibit a good adhesion to the underlying substrate or layer, when applied thereto, and can faithfully reproduce in the resulting resist patterns the pattern of the exposure mask used.

In addition, still another object of the present invention is to provide a novel chemically amplified resist composition which has a high transparency to various radiations including excimer laser light, can form fine resist patterns having an excellent resistance to dry etching, along with a particularly high sensitivity.

Another object of the present invention is to provide a novel process for forming resist patterns, especially positive resist patterns, using the resist composition of the present invention. In this patterning process, it is desired that the resist coating from said composition can be developed with a conventional alkaline developer, after it is exposed to the patterning radiation.

The other objects of the present invention will be appreciated from the descriptions as set forth below with regard to the preferred embodiments thereof.

According to one aspect of the present invention, the above object can be attained by an alkali-developable, chemically amplified resist composition for forming resist patterns which comprises:

I. an alkali-insoluble, film-forming compound having a structural unit a containing a protected alkali-soluble group in which unit a protective moiety of said protected alkali-soluble group is cleaved upon action of an acid generated from a photoacid generator used in combination with said compound, thereby releasing a protective moiety from the alkali-soluble group and converting said compound to an alkali-soluble one, said alkali-soluble group being protected with the protective moiety selected from the group consisting of:

a lactone moiety (A) represented by the following formula (I):

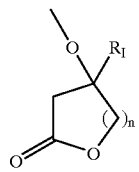
(I)

in which $R_I$ represents a substituted or unsubstituted, straight chain or branched chain alkyl group of 1 to 4 carbon atoms, and n represents an integer of 1 to 4; and an alicyclic hydrocarbon or alicyclic hydrocarbon group-containing moiety (B) represented by any one of the following formulae (II) to (VII):

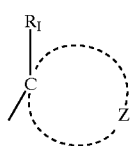
(II)

in which $R_I$ is as defined above, and

Z represents atoms necessary to complete an alicyclic hydrocarbon group along with a carbon atom to which said $R_I$ is bonded;

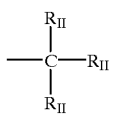
(III)

in which $R_{II}$ may be the same or different, and each represents a substituted or unsubstituted, straight chain or branched chain alkyl group of 1 to 12 carbon atoms or an alicyclic hydrocarbon group with the proviso that at least one of $R_{II}$ is an alicyclic hydrocarbon group;

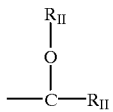
(IV)

in which $R_{II}$ is as defined above;

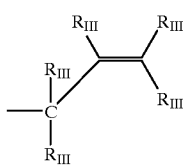
(V)

in which $R_{III}$ may be the same or different, and each represents a proton, a substituted or unsubstituted, straight chain or branched chain alkyl group of 1 to 12 carbon atoms or an alicyclic hydrocarbon group with the proviso that at least one of $R_{III}$ is an alicyclic hydrocarbon group and, in the above formula, at least one of two $R_{III}$ is a substituted or unsubstituted, straight chain or branched chain alkyl group of 1 to 12 carbon atoms or an alicyclic hydrocarbon group;

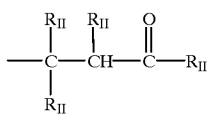
(VI)

in which $R_{II}$ is as defined above; and formula (VII):

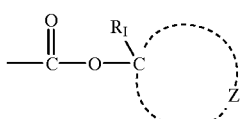
(VII)

in which $R_I$ and Z are as defined above; and

II. a photoacid generator capable of being decomposed upon exposure to a patterning radiation to thereby produce an acid capable of causing cleavage of said protective moiety.

According to another aspect of the present invention, the above object can be attained by a process for the formation of resist patterns which comprises the steps of:

coating the chemically amplified resist composition according to the present invention on a substrate to be fabricated in order to form a resist coating thereon;

selectively exposing said resist coating to a patterning radiation capable of causing generation of an acid from said photoacid generator;

heating the exposed resist coating to a temperature at which the cleavage of said protective moiety is induced; and developing the heated resist coating with an alkaline developer.

The present invention is directed to a chemically amplified resist composition for forming positive resist patterns on a substrate to be fabricated which composition, after coating and selective exposure to a patterning radiation, can be developed with a conventional alkaline solution. In particular, in one aspect thereof, the present invention is directed to a chemically amplified resist composition which comprises (I) a film-forming polymer or copolymer containing in a side chain of the monomer unit thereof the protected alkaline-soluble group, such as carboxyl group protected with the above-mentioned lactone moiety, said polymer or copolymer being insoluble in an alkaline solution such as an aqueous alkaline solution, however, being able to exhibit a good solubility upon cleavage of a protective moiety from the alkali-soluble group, and (II) a photoacid generator (PAG) capable of generating an acid upon decomposition thereof as a result of absorption of the patterning radiation, the acid being able to cause said cleavage of the protective moiety from the alkali-soluble group. The mechanism of the chemical amplification in this resist composition will be explained hereinafter referring to the film-forming polymer containing a carboxyl group protected with the lactone moiety.

Upon exposure of the resist coating to a patterning radiation, PAG in the resist composition constituting said resist coating can absorb an energy from said patterning radiation and generate an acid. The acid generated from PAG can catalytically act against the film-forming polymer during heating, i.e., post-exposure baking (PEB), of the exposed resist coating. Thus, the following reactions are observed in the exposed areas of the resist coating:

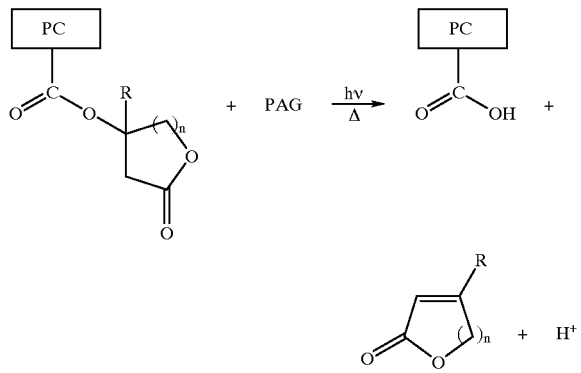

PC: main chain of the polymer

In the resist composition including the above-referenced composition of the present invention, since a functional group capable of being easily cleaved upon heating of the composition in the presence of an acidic catalyst was introduced into an ester portion of the monomer unit of the film-forming polymer as a principal component of the composition, a protonic acid can be regenerated through said cleavage of the functional group, thus enabling increase of the sensitivity. Further, since a carboxylic acid is produced after cleavage of the functional group, the exposed areas of the resist coating can exhibit a good solubility in the alkaline solution. Namely, the initially alkali-insoluble resist coating can be developed with an alkali solution after exposure followed by heating. After development, the thus obtained resist patterns are positive-working, because the exposed areas of the resist coating are dissolved and removed with the alkaline solution. Note also that swelling of the resist patterns can be avoided in the patterning process of the present invention, because the formation of the patterns relies upon variation of the polarity caused in said polymer.

Further, when the film-forming polymer used as a principal component in the resist composition of the present invention is in the form of a copolymer comprising at least first and second monomer units, it is possible to design that a functional group capable of being easily cleaved upon heating of the resist coating in the presence of an acid catalyst is introduced into an ester portion of the first monomer unit and at the same time, a similar functional group is introduced into the second monomer unit. In such a case, since double functional groups can be simultaneously cleaved from the copolymer as a function of the acid catalytic reaction, it is expected to simultaneously attain both higher sensitivity and higher resolution in comparison with the copolymer containing the functional group on only one monomer unit.

In the chemically amplified resist composition of the present invention, in addition to the lactone moiety referred to in the above explanation concerning the chemical amplification, the alicyclic hydrocarbon or alicyclic hydrocarbon group-containing moiety (briefly referred hereinafter to as "alicyclic hydrocarbon moiety") can effectively act as the protective group or moiety for the alkali-soluble group such as carboxyl group, if it is contained in the film-forming compound including a polymer or copolymer. It is considered that due to the strong hydrophobic nature thereof, the alicyclic hydrocarbon moiety can inhibit dissolution of the exposed areas of the resist coating in an alkaline solution in the developing process. Thus, it is contemplated in the resist composition to introduce an alicyclic hydrocarbon moiety as a cleavable protective group into the film-forming compound to form a protected alkali-soluble group capable of being released from the resist structure upon action of an acid, and to expose and bake the resist coating to thereby release the alicyclic hydrocarbon moiety followed by removing the same from the exposed areas of the coating.

However, since it has a ring structure, the alicyclic hydrocarbon moiety can be linked only at the restricted angle to the film-forming compound, and accordingly it is difficult to produce a double bond-containing compound after cleavage of said moiety, and it is also difficult to induce the cleavage reaction itself. The above problems are serious, and to solve these problems, as briefly described hereinabove, the inventors have found it to be effective, if the described moiety of the above formula (II) containing an alicyclic hydrocarbon group and a suitable lower alkyl substituent substituted at the position of the carbon atom constituting a ring skeleton of said alicyclic hydrocarbon group is introduced as at least a portion of the cleavable protective group to the resist compound to thereby make the cleavable protective group have an ester structure. Namely, it has been found that, making the cleavable protective group an ester structure facilitates cleavage of the protective group. Although the inventors do not wish to restrict the chemical amplification of the present invention to those groups of the below mentioned, it is thought that the protective group can be easily cleaved from the resist compound, because the formation of a double bond upon cleavage of the protective group is restricted to a specific site, i.e., an outer portion of the alicyclic ring showing a diminished "strain of linkage".

Thus, the resist material containing the moiety of the above formula (II) can induce the intended cleavage reaction in which a protonic acid generated upon exposure acts as a catalyst, thereby removing the alicyclic group from said moiety, along with production of a carboxylic acid and similar product. Accordingly, in the exposed areas of the resist material, a dissolution-inhibiting effect of the alicyclic group disappears, and the exposed areas become easily soluble in an alkali solution. As a result, it becomes possible to smoothly conduct the development process of the resist material, and attaining the intended stable patterning characteristics.

Further, it is thought that in the chemically amplified resist material in which an alicyclic hydrocarbon group is directly bonded to a carbon atom constituting the ring structure to form an ester structure, it is difficult to fully diminish the rigidity due to presence of the alicyclic hydrocarbon group. It is also thought that such undesirable rigidity is one cause of cracking or peeling in the resist patterns, for example, when a thickness of the resist coating is increased, i.e., when strain is liable to be produced during development. To solve these problems, the inventors found that if the cleavable protective groups represented by the above formulae (III) to (VII) are introduced into the resist structure, they will produce satisfactory results. Namely, in the structure of these cleavable protective groups, at least one alicyclic hydrocarbon group is contained, however, it is distinguished from the above mentioned moiety of the formula (II) in that an ester structure is produced through at least one or more atoms bonded to a carbon atom constituting the ring structure. The atom through which the ester structure is produced is generally a carbon atom, however, it is not restricted insofar as the intended cleavage function is attained, and includes, for example, oxygen, nitrogen, sulfur and the like. Although it does not restrict the present invention, the inventors understand that according to the present invention, a rigidity of the resist structure can be moderated as a result of positioning the alicyclic hydrocarbon group in a site remote from the main chain of the resist structure, namely, introduction of the cleavable protective group having an ester structure with the indirectly bonded ring structure.

Thus, the resist material containing the moiety of any one of the above formulae (III) to (VII) can induce the intended cleavage reaction in which a protonic acid generated upon exposure acts as a catalyst, thereby removing the alicyclic group from said moiety, along with production of a carboxylic acid and similar product. Accordingly, in the exposed areas of the resist material, the dissolution-inhibiting effect of the alicyclic group disappears, and the exposed areas become easily soluble in an alkali solution. As a result, it becomes possible to smoothly conduct the development process of the resist material, and attaining the intended stable patterning characteristics. The above processes and functions are substantially the same as those of the moiety of the above formula (II), however, for this particular resist material, in addition to the described processes and functions, it is expected that the rigidity of the resulting resist coating is moderated and therefore an adverse effect of the strain on the resist coating during development is diminished. Because of these excellent functions, it becomes possible to prevent cracking or peeling-off of the resist patterns during development, and accordingly, to obtain stable patterning characteristics.

In addition, according to one aspect thereof, the present invention provides an alkali-developable, chemically amplified resist composition for forming resist patterns which comprises:

I. an alkali-insoluble compound having a structural unit a containing a protected alkali-soluble group in which unit a protective moiety of said protected alkali-soluble group is cleaved upon action of an acid generated from a photoacid generator used in combination with said compound, thereby releasing said protective moiety from the alkali-soluble group and converting said compound to an alkali-soluble one, said alkali-soluble group being protected with an alicyclic hydrocarbon group-containing moiety represented by the following formulae (II'):

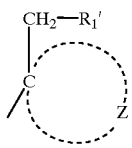

(II')

in which $R_1'$ is a methyl, ethyl, propyl or isopropyl group which may be substituted or unsubstituted, and Z represents atoms necessary to complete an alicyclic hydrocarbon group along with a carbon atom to which said —$CH_2$—$R_1'$ is bonded; and II. a photoacid generator capable of being decomposed upon exposure to a patterning radiation to thereby produce an acid capable of causing cleavage of said protective moiety.

According to another aspect thereof, the present invention provides a process for the formation of resist patterns which comprises the steps of:

coating the above-described chemically amplified resist composition containing the moiety represented by the above formula (II') according to the present invention on a substrate to be fabricated in order to form a resist coating thereon;

selectively exposing said resist coating to a patterning radiation capable of causing generation of an acid from said photoacid generator;

heating the exposed resist coating to a temperature at which the cleavage of said protective moiety is induced; and developing a latent image in the exposed and heated resist coating with an alkaline developer.

According to the present invention, as a result of use of the chemically amplified resist composition containing the moiety represented by the above formula (II'), it becomes possible to obtain a high sensitivity (below 5 mJ/cm$^2$) required for the ArF lithography, and also stable patterning properties. In addition to these advantages, according to the present invention, if the resist composition is used in combination with a specific developing solution such as an aqueous or alcoholic solution of specific ammonium compound or morpholine compound, it becomes possible to control a compatibility of the developing solution with the resist composition and solubility of the composition in the developing solution to thereby moderate a generated stress in the resist composition during development, thereby diminishing cracking and peeling off of the resist patterns. Further, since the exposure margin can be expanded, it becomes possible to stably form fine resist patterns.

DESCRIPTION OF THE PREFERRED EMBODIMENTS

Figure 1:
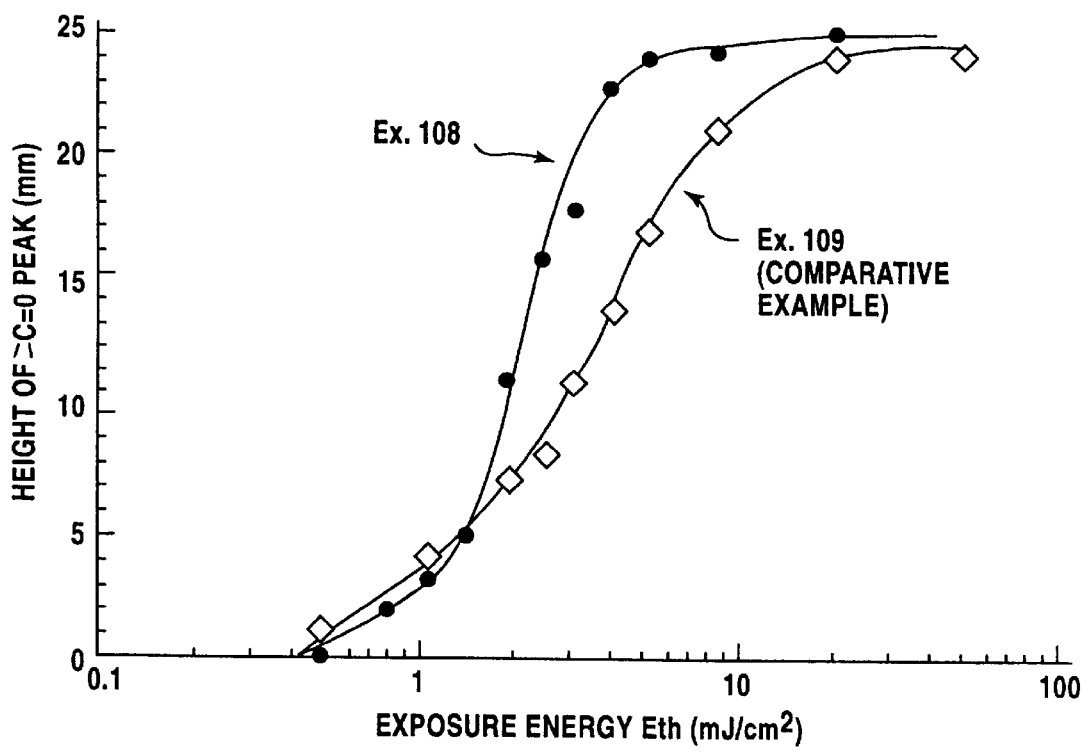
FIG. 1 is an IR absorption spectrum illustrating an exposure dose dependency of chemically amplified resist composition according to the present invention.

The inventors have found that the above-discussed problems of the prior art resist materials can be solved, if a protected alkali-soluble group is introduced into a side chain (not skeleton) of the film-forming compound including the polymer or copolymer used as a principal component of the chemically amplified resist composition, and the described lactone moiety or alicyclic hydrocarbon or alicyclic hydrocarbon group-containing moiety is used for a protective group or moiety of said protected alkali-soluble group.

In one aspect thereof, the present invention resides in an alkali-developable, chemically amplified resist composition for forming resist patterns which comprises:

I. an alkali-insoluble, film-forming compound having a structural unit containing a protected alkali-soluble group in which unit a protective moiety of said protected alkali-soluble group is cleaved upon action of an acid generated from a photoacid generator used in combination with said compound, thereby releasing a protective moiety from the alkali-soluble group and converting said compound to an alkali-soluble one; and II. a photoacid generator capable of being decomposed upon exposure to a patterning radiation to thereby produce an acid capable of causing cleavage of said protective moiety.

In the film-forming compound used as a principal component of the resist composition according to the present invention, the protected alkali-soluble group is contained in the structural unit thereof, particularly a side chain thereof. Examples of suitable alkali-soluble groups for forming the protected alkali-soluble group, although they are not restricted to those below-mentioned, include a carboxylic acid group, sulfonic acid group, amide group, imide group, phenol group, thiol group, azalactone group and hydroxyoxime group.

The above-described alkali-soluble group has to be initially protected for the purpose of inhibiting dissolution of said film-forming compound in an alkali, and the protective moiety for said alkali-soluble group is preferably selected from the moieties consisting of (1) a lactone moiety (A) represented by the following formula (I), and (2) an alicyclic hydrocarbon or alicyclic hydrocarbon group-containing moiety (B) represented by any one of the following formulae (II) to (VII)

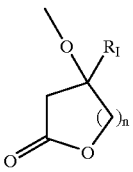

(I)

in which $R_I$ represents a substituted or unsubstituted, straight chain or branched chain alkyl group of 1 to 4 carbon atoms such as methyl group, ethyl group and propyl group, and n represents an integer of 1 to 4.

The substituent $R_1$ on the carbon atom of the above-indicated lactone ring or the below-indicated alicyclic ring contains 1 to 4 carbon atoms. Higher carbon atoms should be avoided, because they do not ensure satisfactory cleavage of the protective group from the alkali-soluble group, although the hydrophobic nature of the compound is increased with an increase of the number of carbon atoms in the alkyl group. The alkyl group may be unsubstituted or substituted with any substituent. Suitable substituents include, for example, halogens such as chlorine, fluorine and bromine. Use of substituents having a high polarity should be avoided, because they can adversely affect a stability of the alkali-soluble group.

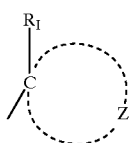

(II)

in which $R_I$ is as defined above, and

Z represents atoms necessary to complete an alicyclic hydrocarbon group along with a carbon atom to which said $R_I$ is bonded. Formula (III):

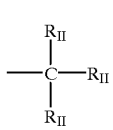

(III)

in which $R_{II}$ may be the same or different, and each represents a substituted or unsubstituted, straight chain or branched chain alkyl group of 1 to 12 carbon atoms or an alicyclic hydrocarbon group with the proviso that at least one of $R_{II}$ is an alicyclic hydrocarbon group.

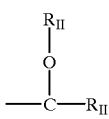
(IV)

in which $R_{II}$ is as defined above.

Formula (V):

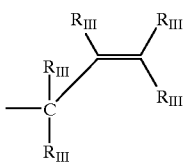
(V)

in which $R_{III}$ may be the same or different, and each represents a proton, a substituted or unsubstituted, straight chain or branched chain alkyl group of 1 to 12 carbon atoms or an alicyclic hydrocarbon group with the proviso that at least one of $R_{III}$ is an alicyclic hydrocarbon group and, in the above formula, at least one of two $R_{III}$ is a substituted or unsubstituted, straight chain or branched chain alkyl group of 1 to 12 carbon atoms or an alicyclic hydrocarbon group.

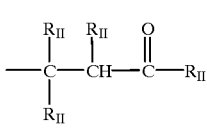
(VI)

in which $R_{II}$ is as defined above.

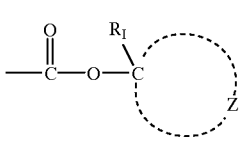
(VII)

in which $R_I$ and Z are as defined above.

The alkali-insoluble, film-forming compound which is sensitive to an acid generated from the photoacid generator used in combination with said film-forming compound includes a wide variety of compounds ranging from low molecular weight compounds to high molecular weight compounds, and they may be used alone or as a mixture of two or more compounds. Generally, the film-forming compound can be classified into two groups, i.e., (1) a polymer or copolymer comprising said structural unit as a repeating unit thereof, and (2) a nonpolymeric compound which is used in combination with one or more alkali-soluble polymer or copolymer.

Said film-forming compound may be in the form of a polymer or copolymer. The polymer may be a homopolymer consisting essentially of a single monomer unit or a copolymer comprising two or more monomer units such as dimer, terpolymer and the like. Suitable monomer units for the polymer or copolymer, although they are not restricted to those below-mentioned, include (meth)acrylic acid esters and derivatives thereof, itaconic acid esters and derivatives thereof, fumaric acid esters and derivatives thereof, vinyl phenols and derivatives thereof, N-substituted maleimides and derivatives thereof, styrene substituents and derivatives thereof as well as monomeric units containing two or more or polycyclic cycloaliphatic hydrocarbon moieties. In the monomeric units containing two or more or polycyclic cycloaliphatic hydrocarbon moieties, the cycloaliphatic hydrocarbon moieties are preferably adamantyl group, norbornyl group and similar groups. It should be noted that when the film-forming compound is in the form of the polymer, said polymer may contain two or more protected alkali-soluble groups in the same monomer unit, if desired, and that when the film-forming compound is in the form of the copolymer, said copolymer may contain two or more protected alkali-soluble groups, in combination, in the same or different monomer units, if desired.

When said film-forming compound is in the form of copolymer, the copolymeric compound is preferably a copolymer containing said repeating unit containing the protected alkali-soluble group as the first repeating unit, and the repeating units of said copolymer other than said first repeating unit include a repeating unit containing an unprotected alkali-soluble group in a side chain thereof and/or a repeating unit containing in a side chain thereof an additional protected alkali-soluble group capable of being cleaved upon action of the acid generated from said photoacid generator. The unprotected alkali-soluble group advantageously used herein, although it is not restricted to those below-mentioned, includes, a carboxylic acid group, sulfonic acid group, amide group, imide group, phenol group, acid anhydride group, thiol group, lactonic acid ester group ($\alpha$-$\alpha$,$\beta$-dimethyl-$\gamma$-butylolactone group), azalactone group, carbonate group, oxazone group, pyrolidone group, hydroxyoxime group, nitrile group, nitro group, aldehyde group, acetyl group, hydroxyl group and thioether group.

As above mentioned, the film-forming compound used as a principal component of the resist composition may be in the form of any nonpolymeric compound, if desired, and in such a case, the nonpolymeric compound is preferably used in combination with one or more alkali-soluble polymers or copolymers in order to obtain the desired resist properties. The alkali-soluble polymer or copolymer suitable in this embodiment includes those described herein and others.

Further, in the resist composition of the present invention, the film-forming compound may additionally contain one or more similar acid-sensitive compounds, if desired. The film-forming compounds useful as an additional component, although they not restricted to the below mentioned, include those containing one or more alkali-soluble groups, typical examples of which groups were described above with reference to the unprotected alkali-soluble group in the film-forming copolymer.

In the practice of the present invention, the lactone moiety (A) of the formula (I) can be advantageously introduced as a protective moiety into the alkali-soluble group of the film-forming compound. The lactone moiety may be any desired structure, however, preferably, it includes ($\pm$)-mevalonic lactone represented by the following formula:

in which $R_I$ is as defined above. Other suitable lactone moieties (A) will be described hereinafter.

Similarly, the alicyclic hydrocarbon or alicyclic hydrocarbon group-containing moieties (B) of the formulae (II) to (VII) advantageously introduced as the protective moiety in the practice of the present invention may be any desired structure which is well-known in the field of chemically amplified resist compositions, and the alicyclic hydrocarbon group of said alicyclic moieties (B) is preferably one member selected from the group consisting of:

(1) adamantane and derivatives thereof;
(2) norbornane and derivatives thereof;
(3) perhydroanthracene and derivatives thereof;
(4) perhydronaphthalene and derivatives thereof;
(5) tricyclo[5. 2. 1. 0$^{2,6}$]decane and derivatives thereof;
(6) bicyclohexane and derivatives thereof;
(7) spiro[4. 4]nonane and derivatives thereof;
(8) spiro[4. 5]decane and derivatives thereof; and
(9) bicyclo[2. 2. 2]octane and derivatives thereof.

These compounds have the following structures:

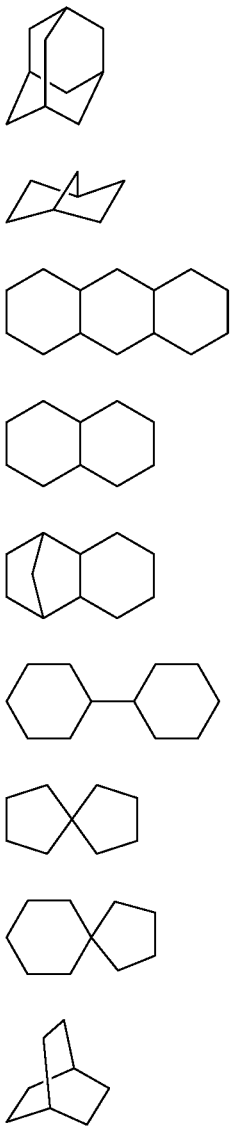

In the practice of the present invention, the above-described and other alicyclic hydrocarbon moieties (B) which contain two or more ring structures or condensed rings can be advantageously used, because if the alicyclic moiety (B) contains only a single ring, i.e., it is a cyclohexyl group, for example, a satisfactory resistance to dry etching cannot be obtained. Further, among the above-indicated examples of suitable alicyclic hydrocarbon groups for said alicyclic moieties (B), if it is intended to obtain an excellent resistance to dry etching equivalent to or higher than that of the conventional novolak resists, it is more preferred to use the alicyclic hydrocarbon moieties (B) containing condensed ring(s).

More particularly, suitable alicyclic moieties (B) include, for example, 2-alkyl-2-adamantyl represented by the following formula:

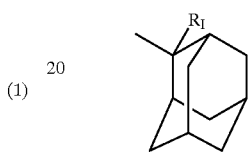

in which $R_I$ is as defined above, and the moieties of the following formulae:

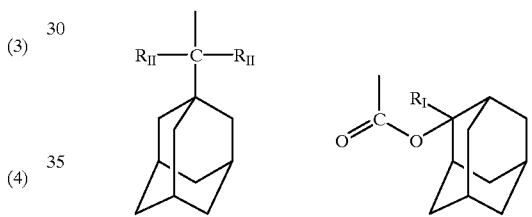

in which $R_I$ and $R_{II}$ are as defined above. Still other suitable moieties (B) will be described hereinafter.

The alkali-soluble group to be temporarily protected by said protective moiety is preferably a member selected from the group consisting of a carboxylic acid group, sulfonic acid group, amide group, imide group, phenol group, thiol group, azalactone group and hydroxyoxime group.

For example, the carboxylic acid group as the alkali-soluble group is a unit capable of producing a carboxylic acid upon cleavage of the protective moiety therefrom as a result of the action of the acid, and includes, for example, tertiary carbon esters such as t-butylester, t-amylester and α,α-dimethylbenzylester, acetal esters such as tetrapyranylester, β-oxyketone esters such as 3-oxycyclohexylester, and others. Suitable protective moieties for these carboxylic acid groups and other alkali-soluble groups include, for example, tertiary hydrocarbon groups such as t-butyl group or β-oxyketone groups such as 3-oxocyclohexyl group, cyclic β-hydroxyketone groups such as mevalonic lactone group, and others.

More particularly, assuming that the alkali-soluble group is a carboxylic acid group, the protected carboxylic acid group is preferably represented by any one of the following formulae (VIII) to (XIII):

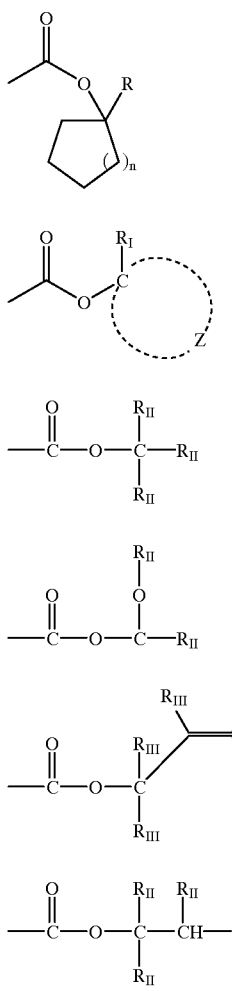

(VIII)

(IX)

(X)

(XI)

(XII)

(XIII)

in which $R_I$, $R_{II}$ and $R_{III}$, Z as well as n each is as defined above.

Assuming that the alkali-soluble group is a sulfonic acid group, the protected sulfonic acid group is preferably represented by the following formula (XIV) or (XV):

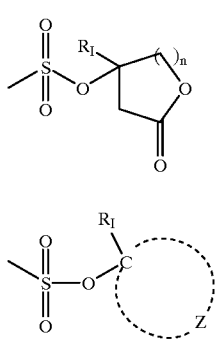

(XIV)

(XV)

in which $R_I$, Z and n each is as defined above.

Assuming that the alkali-soluble group is an imide group, the protected imide group is preferably represented by the following formula (XVI) or (XVII):

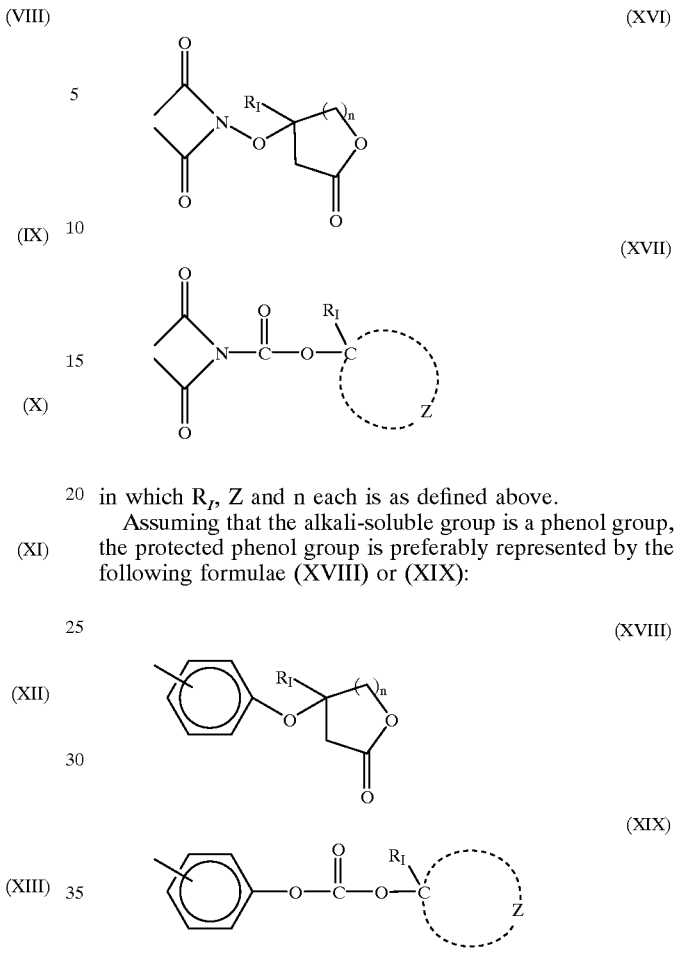

(XVI)

(XVII)

(XVIII)

(XIX)

in which $R_I$, Z and n each is as defined above.

Assuming that the alkali-soluble group is a phenol group, the protected phenol group is preferably represented by the following formulae (XVIII) or (XIX):

in which $R_I$, Z and n each is as defined above.

In the above-indicated protected alkali-soluble groups except for those containing the lactone ring, the alicyclic hydrocarbon group completed by Z atoms may include any hydrocarbon groups, preferably those containing a ring structure with one or more rings or a condensed ring. The alicyclic hydrocarbon group may be unsubstituted or substituted with any conventional substituent. Some typical examples of suitable alicyclic hydrocarbon groups were indicated above with reference to the structure thereof. Most preferably, the alicyclic hydrocarbon group used as the protective group is adamantane and derivatives thereof.

The alkali-insoluble, film-forming compounds, particularly film-forming polymers or copolymers, effectively used as a principal component or basic resin in the chemically amplified resist composition according to the present invention were described particularly with reference to the alkali-soluble groups and the protective moieties for said groups, both included in the structure of said compounds. The film-forming compounds useful in the resist composition of the present invention will be further described particularly with reference to the film-forming polymers or copolymers which can be advantageously used in the present invention. Note that the following descriptions will be made first with reference to the lactone moiety (A)-containing polymers or copolymers, and then with reference to the alicyclic moiety (B)-containing polymers or copolymers, however, the descriptions may be generally applied to both types of the polymers or copolymers, unless otherwise specified.

The film-forming polymers or copolymers containing the lactone moiety (A) as a protective moiety for the alkali-soluble group are not restricted when they are used in the resist composition of the present invention, insofar as they can satisfy the above-mentioned requirements for the basic resin, particularly the requirements for ensuring the above-described mechanism of chemical amplification. If it is desired to obtain an excellent resistance to dry etching equivalent to at least that of a conventional novolak resin, suitable polymers or copolymers include, for example, those containing (meth)acrylate monomer unit, vinyl phenol monomer unit, N-substituted maleimide monomer unit, styrene monomer unit and others solely or in combination. Especially, use of the (meth)acrylate polymers or copolymers is recommended, because such polymers or copolymers can exhibit a diminished absorption of the radiation having wavelengths in the deep ultraviolet region, when deep ultraviolet radiation is used as an exposure source. In other words, using deep ultraviolet radiation as an exposure source, it is generally desired to use specific polymers or copolymers having no aromatic rings capable of absorbing the radiation in the range of the deep ultraviolet region to a great extent or having no conjugated double bonds and other chromophores showing a large molar absorption coefficient.

Further, if any radiation in the range of ultrashort wavelengths such as an argon fluoride (ArF) excimer laser is used as the exposure source, it is recommended to use specific film-forming polymers or copolymers which are basically similar to those described above, and, in addition, which do not contain any aromatic ring showing a high absorption of the laser light, but, however, contain an ester moiety with two or more or polycyclic alicyclic hydrocarbon groups showing a high resistance to dry etching, for example, adamantyl or norbornyl groups. Particularly suitable polymers or copolymers for this purpose include (meth)acrylate polymers or copolymers containing the described alicyclic moiety. Typical examples of suitable alicyclic moieties have been described above along with the structural formulae thereof.

Furthermore, the molecular weight (weight average molecular weight, Mw) of the (meth)acrylate and other film-forming polymers or copolymers used in the resist composition of the present invention may be widely varied, depending upon various factors such as the desired properties of the resist patterns. Generally, the polymers or copolymers used herein have a molecular weight in the range of 2,000 to 1,000,000, more preferably 3,000 to 50,000.

More particularly, the film-forming polymers advantageously used in the practice of the present invention include the polymers (1) to (7) described hereinafter, although the present invention should not be restricted to these polymers. Note in the described formulae of the film-forming polymers that m is the number of monomer units or repeating units necessary to obtain the intended weight average molecular weight, LAC represents the above-described lactone moiety of the formula (I), and X represents any substituent such as a hydrogen atom, a halogen atom such as chlorine and bromine, a lower alkyl group such as methyl and ethyl, a cyano group and others.

(1)

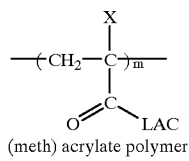
(meth) acrylate polymer (2)

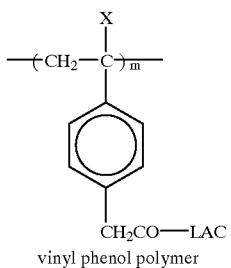
vinyl phenol polymer (3)

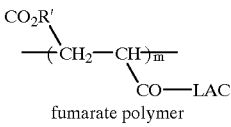
fumarate polymer in which R' represents either LAC or an alkoxy group such as methoxy, isopropoxy or t-butoxy, an aryloxy group such as phenoxy or benzyloxy, and others.

(4)

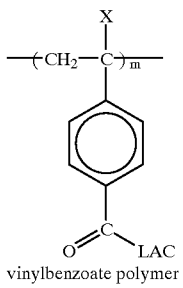
vinylbenzoate polymer (5)

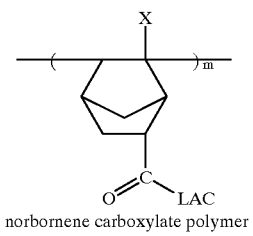
norbornene carboxylate polymer (6)

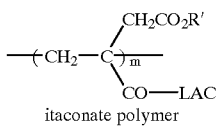
itaconate polymer in which R' is as defined above.

(7)

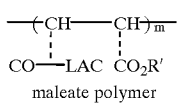
maleate polymer in which R' is as defined above.

Further, as will be appreciated from the above descriptions concerning the film-forming compounds in the form of polymer or copolymers that the monomer unit (first monomer unit) constituting said polymers (1) to (7) may be used in combination with one or more suitable monomer units which may be the same or different from said first monomer unit, to form any desired copolymers such as two component copolymer, terpolymer and the like.

The film-forming copolymers advantageously used in the practice of the present invention, if they are shown with reference to those based on the above-described (meth) acrylate polymers, include the copolymers represented by the following formulae (XX) and (XXI):

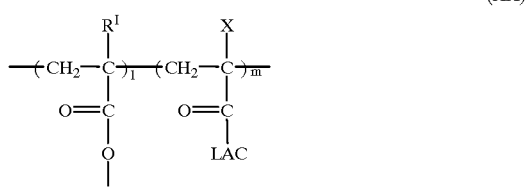

(XX)

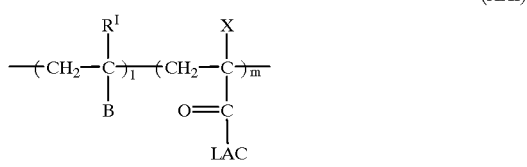

(XXI)

in which
$R^1$ represents a hydrogen atom or any substituent such as halogen atom, alkyl group or methylol group,
Y represents any substituent, for example, alkyl group such as t-butyl, alicyclic group such as adamantyl, norbornyl, cyclohexyl and tricyclo [5. 2. 1. 0] decane,
B represents any substituent such as carboxyl group,
l and m each represents a molar ratio of each monomer unit, and the sum of l and m is 1, and
X and LAC each is as defined above.

Furthermore, it should be noted that among the above-mentioned (meth)acrylate polymers, the specific (meth) acrylate polymers found by the inventors, i.e., (meth) acrylate polymers containing (±)-mevalonic lactone (meth) acrylic acid ester as a constitutional component thereof, are novel.

These and other (meth)acrylate polymers as well as other polymers and copolymers of the present invention can be prepared in accordance with the conventional polymerization methods well-known in polymer chemistry. For example, the (meth)acrylate polymers and copolymers, as will be described in detail in the below-mentioned examples, can be advantageously prepared by conducting a free-radical polymerization of one or more starting monomers in the presence of 2,2'-azobisisobutylonitrile (AIBN) as a free-radical initiator. Similarly, the film-forming polymers and copolymers other than the (meth)acrylate polymers and copolymers can be prepared in accordance with well-known polymerization methods.

When the film-forming polymers are especially in the form of copolymers, a ratio or content of the monomer unit containing the above-mentioned lactone moiety (A) of the formula (I) in the total amount of the copolymer is preferably in the range of 20 to 70% by weight. A content of less than 20% by weight should be avoided, because it does not ensure satisfactory patterning of the resist coating. On the other hand, a content higher than 70% by weight will modify the copolymer so that it can be dissolved in an alkaline solution. More preferably, the content of the lactone moiety (A)-containing monomer unit is in the range of 30 to 60% by weight.

Moreover, the inventors have found that when the film-forming copolymer is used in the resist composition of the present invention, it is also preferred to constitute the copolymer so that one monomer unit of the copolymer is the unit containing the protected alkali-soluble group, and another monomer unit to be copolymerized with said monomer unit contains additional protected alkali-soluble group in the structure thereof, as previously mentioned. Namely, the film-forming copolymer may contain a second monomer unit containing second protected alkali-soluble group, in addition to a first monomer unit containing a first protected alkali-soluble group such as the carboxyl group protected with the lactone moiety (A), and such combination of the first and second monomer units is advantageously applied in the formation of the film-forming copolymer used in the present invention. Note that, as previously mentioned, the above-mentioned second monomer unit may include any desired structure, however, the second monomer unit is preferably the monomer unit, a side chain of which unit contains an additional carboxyl group which further contains a protective moiety capable of being cleaved upon action of an acid generated from a photoacid generator also contained in the resist composition, the protective moiety being preferably the alicyclic moiety (B) such as the moiety of the above formula (II). In the second monomer unit, the second protected alkali-soluble group may include any desired structure, and preferably it can be that of the above formula (VII).

More particularly, the film-forming copolymers in which each monomer unit contains the protected alkali-soluble group and which can be advantageously used in the practice of the present invention preferably include the copolymer represented by the following formula (XXII):

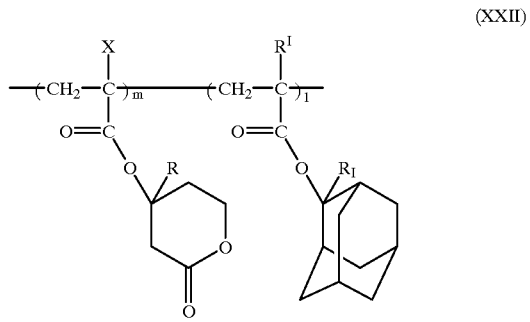

(XXII)

in which

R, $R_I$, $R^1$, X, m and l each is as defined above, and
the substituents $R^1$ and X attached to carbon atoms of the main chain may be the same or different and preferably represents a hydrogen atom or a lower alkyl group such as methyl.

Accordingly, the film-forming copolymer which can be more advantageously used in the practice of the present invention is a copolymer of methacrylic acid (±)-mevalonic lactone and methacrylic acid 2-methyl-2-adamantyl represented by the following formula (XXIII):

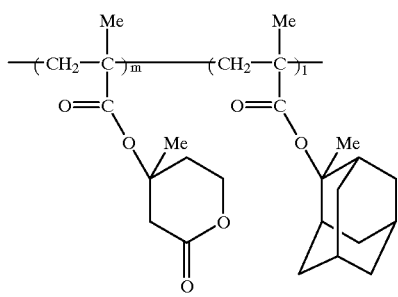

(XXIII)

in which Me represents a methyl group with the proviso that the substituent Me attached to a carbon atom of the main chain may be a hydrogen atom, if desired, and m and l each is as defined above. In the above-mentioned and other similar copolymers, a highly improved resistance to dry etching (RIE resistance) can be accomplished, because they contain an adamantyl group in an ester portion thereof. Further, if it is desired to obtain excellent RIE resistance equivalent to that of the conventional novolak resists, it is necessary to adjust the content of the second monomer unit, i.e., methacrylic acid 2-methyl-2-adamantyl unit, in the copolymer to about 50% by mole. Further, since no aromatic ring showing a strong absorption of ultrashortwave radiation is included in the structure of the copolymer, the described copolymer can exhibit an excellent transparency to radiation in the ultrashort region (193 nm) such as ArF excimer laser light.

In the above-mentioned film-forming copolymer, generally, the content of the first monomer unit, i.e., methacrylic acid (±)-mevalonic lactone ester, is preferably about 20 to 70% by weight, more preferably about 30 to 60% by weight. And, generally, the content of the second monomer unit, i.e., methacrylic acid 2-methyl-2-adamantyl, in the described copolymer is preferably about 20 to 80% by weight, more preferably about 30 to 70% by weight. As previously explained, if each monomer unit is included in an amount below or above the described limit, some drawbacks will result such as difficulty in obtaining satisfactory resist patterns and developing the exposed resist coating with an alkaline solution.

In addition, the mechanism in the chemical amplification in the above-described film-forming copolymer containing the first and second monomer units is substantially identical with that of the film-forming polymer containing, in a side chain of the monomer unit thereof, the protected alkaline-soluble group, i.e., carboxyl group protected with the lactone moiety, described above, except that another chemical amplification reaction based on the second monomer unit is added to the chemical amplification reaction based on the first, lactone moiety-containing monomer unit.

Namely, the (meth)acrylate polymers are well-known to be highly transparent to radiation in the deep ultraviolet region. Further, since neither of its two ester portions, included in the structure thereof, contains a chromophore showing a large molar absorption coefficient at the wavelength of 190 to 250 nm, if it is used in combination with a specific compound, i.e. a so-called "photoacid generator" (PAG) capable of being decomposed upon absorption of suitable level of patterning radiation, thereby producing an acid which can then cleave said ester portions, the copolymer of methacrylic acid (±)-mevalonic lactone and methacrylic acid 2-methyl-2-adamantyl represented by the above formula (XXIII) can act as a high sensitivity resist which can be advantageously subjected to patterning radiation in the range of deep ultraviolet radiation.

Upon exposure of the resist coating to the patterning radiation, the PAG in the resist composition of the resist coating can absorb an energy from said patterning radiation and generate an acid. The acid generated from the PAG can catalytically act against the film-forming copolymer during post-exposure baking (PEB), of the exposed resist coating. Thus, the following reactions are observed in the exposed areas of the resist coating:

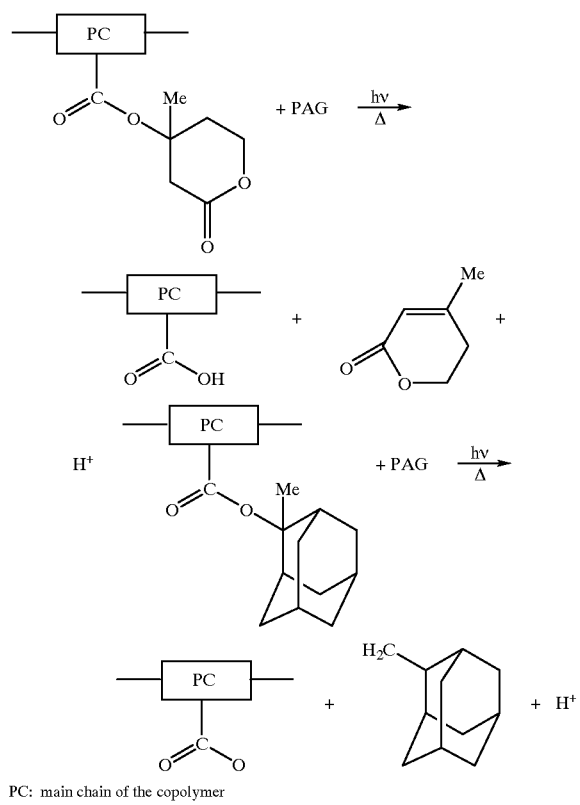

PC: main chain of the copolymer

In the above-described film-forming copolymer, since a functional group capable of being easily cleaved upon heating of the composition in the presence of an acidic catalyst was introduced into an ester portion of the monomer units of the copolymer, a protonic acid can be regenerated through said cleavage of the functional group, thus enabling increase of the sensitivity. Further, since a carboxylic acid is produced after cleavage of the functional group, the exposed areas of the resist coating can exhibit a good solubility in an alkaline solution. Namely, the initially alkali-insoluble resist coating can be developed with an alkali solution after exposure followed by heating. After development, the thus obtained resist patterns are positive-working, because the exposed areas of the resist coating are dissolved and removed with the alkaline solution. Note also that swelling of the resist patterns can be avoided in the patterning process of the present invention, because the formation of the resist patterns relies upon a variation in the polarity in said copolymer.

The inventors have further found that the chemically amplified resist composition according to the present invention can be also defined with reference to a transmittance measured through a 1 μm-thick coating of said resist composition on a quartz substrate at a wavelength of 180 to 300 nm, i.e. in the deep ultraviolet region, of exposure radiation. The resist composition of the present invention preferably exhibits a transmittance of at least 30%, when measured through a 1 μm-thick coating of said resist composition on a quartz substrate at a wavelength of 180 to 300 nm, i.e., in the deep ultraviolet region, of exposure radiation.

The above requirement concerning the transmittance of at least 30% at the exposure wavelength is important in the resist design, i.e., the constitution of the resist composition of the present invention. Accordingly, in the resist composition of the present invention, which is expected to be patternwise exposed to the radiation in the deep ultraviolet region, it becomes necessary to use as the first monomer unit of the copolymer to be included in the resist composition a monomer unit which contains at least one carbon-carbon double bond which does not concern itself with any polymerization reaction, but can be crosslinked, exhibits a low absorption at the exposure wavelength, and is able to be copolymerized with an acrylic acid or methacrylic acid ester so that the transmittance of the copolymer at the exposure wavelength (the transmittance measured through a 1 μm-thick resist coating on a quartz substrate; the "transmittance" referred to hereinafter means a value measured under this condition) amounts to 30% or more. For example, it is contemplated to use monomers in which no aromatic ring capable of highly absorbing deep ultraviolet radiation and/or chromophore of higher molar absorptivity, such as conjugated double bond, is contained.

As an alternative to using the above-described lactone moiety (A)-containing polymers or copolymers, the alicyclic moiety (B)-containing polymers or copolymers can be advantageously used in the practice of the present invention. The film-forming polymers or copolymers containing the alicyclic moiety (B) as a protective moiety for the alkali-soluble group can be freely selected from a wide variety of polymers or copolymers satisfying the above-described requirements, depending on various factors such as properties of the resist patterns. Suitable film-forming polymers or copolymers are generally identical to those mentioned above with regard to the lactone moiety (A)-containing polymers or copolymers, and some typical examples thereof, although they are not restricted to those below-mentioned, include those containing as a repeating unit thereof (meth)acrylic acid and derivatives thereof, itaconic acid and derivatives thereof, fumaric acid and derivatives thereof, styrene substituent and derivatives thereof, and others. These repeating units may be contained solely or in combination. The inventors have found that the above-listed repeating units, if they are introduced in the polymer or copolymer, can provide notable advantages concerning preparation of the polymer or copolymer and coating of the resist composition, in comparison to other conventional polymers or copolymers.

In addition, if desired, the film-forming copolymers for use in the present invention may have associated with said repeating unit(s) one or more other repeating units such as acrylonitriles, olefines, dienes and derivatives thereof, although the present invention should not be restricted to these repeating units.

In the film-forming polymers or copolymers used in the present invention, in order to attain a good adhesion of the resist composition to the underlying substrate or layer, it is more preferred that the polymers or copolymers contain a repeating unit which is by itself soluble in an alkali solution, in addition to the essential component, i.e., alkali-soluble group. Such combination of the repeating units in the polymers or copolymers enables the resulting resist composition to be developed with an alkaline solution, as a function of a minor amount of carboxylic acid originated from the protected alkali-soluble group, and others.

According to one aspect of the present invention, a resist composition is provided in which a film-forming compound as a principal component of the composition is in the form of a copolymer, and the repeating units of said copolymer contain at least one repeating unit selected from the repeating unit containing an alkali-soluble group in a side chain thereof and the repeating unit containing additional, protected alkali-soluble group, capable of being cleaved upon action of an acid produced from the photoacid generator (PAG), in a side chain thereof, in addition to the above-mentioned repeating unit containing the alicyclic moiety (B).

Preferably, the film-forming copolymers useful in the resist composition of the present invention have the structural unit represented by the following

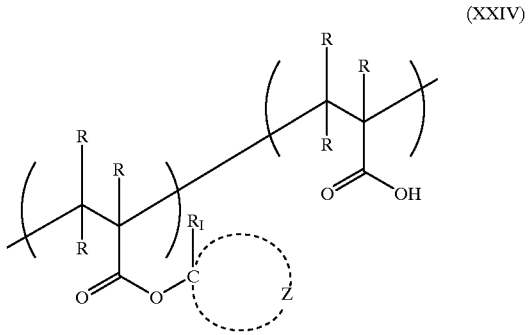

(XXIV)

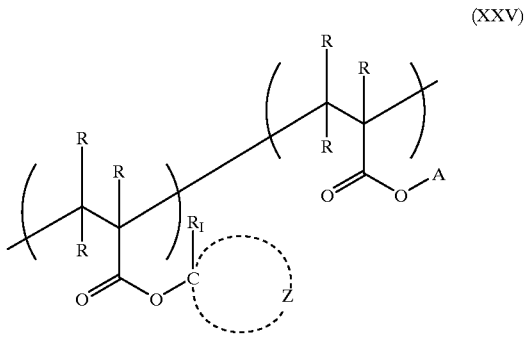

(XXV)

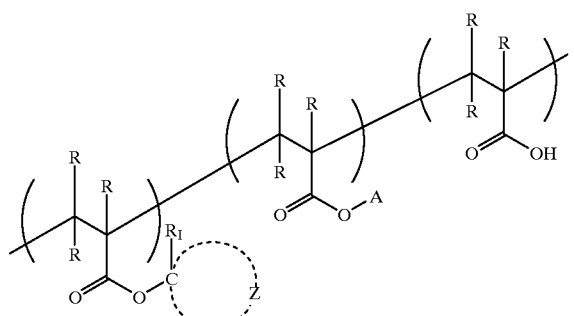

(XXVI)

in which

R may be the same or different, and each represents a hydrogen, halogen or a substituted or unsubstituted, straight chain or branched chain alkyl group of 1 to 4 carbon atoms, A represents a protective moiety capable of being released upon action of said acid, and $R_f$ and Z each is as defined above. The substituted or unsubstituted, straight chain or branched chain alkyl group of 1 to 4 carbon atoms and the protective moiety capable of being released upon action of the acid have been already defined in the above paragraphs.

The structural unit represented by the above formula (XXIV) is illustrative of introducing in the structure of the copolymer, in combination, a protective group containing an acyclic moiety such as adamantane or norbornane and capable of being cleaved upon exposure to an acid produced from a photoacid generator, and an alkali-soluble carboxylic acid group. After exposure of the resist coating to a patterning radiation, an exposed area of the resist coating can be smoothly dissolved in an alkaline solution as a developer, since said copolymer contains an acidic group in the structure thereof. Further, the control of the content of the acidic group in the copolymer makes the exposed resist coating developable with a currently standardized alkaline developer such as an aqueous solution of 2.38% tetramethylammonium hydroxide (TMAH). In this instance, the content of the carboxylic acid-containing unit in the copolymer is preferably not less than 5% by mole and less than 2% by mole.

Further, the structural unit represented by the above formula (XXV) is illustrative of introducing in the structure of the copolymer, in combination, a protective group containing an alicyclic moiety such as adamantane or norbornane and capable of being cleaved upon exposure to an acid produced from a photoacid generator and a conventional protective group which is distinguished from said alicyclic moiety-containing protective and which can be cleaved upon exposure to the acid originated from the photoacid generator.

Furthermore, the structural unit represented by the above formula (XXVI) is illustrative of introducing in the structure of the copolymer, in combination, a protective group containing an alicyclic moiety such as adamantane or norbornane and capable of being cleaved upon exposure to an acid produced from a photoacid generator, a conventional protective group which is distinguished from said alicyclic moiety-containing protective and which is able to be cleaved upon exposure to the acid originated from the photoacid generator, and an alkali-soluble carboxylic acid group. If the resist composition containing the described copolymer is intended to be used in excimer lithography using ArF excimer laser light having a wavelength of 193 nm as an exposure source, it is desired to exclude aromatic rings from the conventional protective group introduced as the second component. Using the described structural unit, it becomes possible to attain a smooth development of the exposed resist coating with an alkaline developer, even if the intended cleavage of the protective group could not be induced due to any problem.

In the above structural units of the formulae (XXIV), (XXV) and (XXVI), the substituent $R_f$ may include methyl, ethyl, and halides thereof such as chloride and bromide, as in the above-mentioned instances. Similarly, the substituent A may include the above-described conventional protective groups such as quaternary carbon group or β-oxyketone group such as t-butyl, t-amyl, 3-oxycyclohexyl and the like. Moreover, the alicyclic hydrocarbon group completed by the atoms Z may include adamantyl and derivatives thereof, norbornane and derivatives thereof, perhydroanthacene and derivatives thereof, perhydronaphthalene and derivatives thereof, tricyclo[5. 2. 1. $0^{2,6}$]decane and derivatives thereof, spiro[4. 4]nonane and derivatives thereof as well as spiro[4. 5]decane and derivatives thereof, mentioned above with the structures thereof.

The film-forming polymers or copolymers useful in the present invention will be further described particularly with reference to those containing a carboxylic group as the alkali-soluble group.

Preferably, the film-forming polymer is (meth)acrylate polymer represented by the

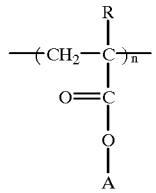

(XXVII)

in which

R represents a proton (hydrogen), halogen or substituted or unsubstituted alkyl group such as methyl, ethyl or methylol, A corresponds to the above-mentioned moieties (II) to (VII), and represents a protected alicyclic hydrocarbon group, for example, adamantyl, norbornyl, cyclohexyl, tricyclo[5. 2. 1. $0^{2,6}$]decane and other alicyclic groups protected with quaternary carbon group or β-oxyketone group such as t-butyl, t-amyl, 3-oxycyclohexyl and the like, and n is any positive integer.

And, the film-forming copolymer is preferably (meth)acrylate copolymer represented by the formula (XXVIII) or (XXIX). Although not shown, the (meth)acrylate terpolymer can be represented by the similar structure except for the third repeating unit added.

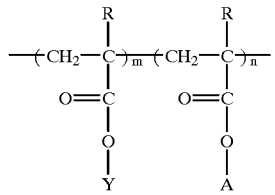

(XXVIII)

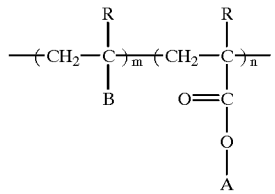

(XXIX)

in which

R, A and n each is as defined above,

Y represents any substituent such as, preferably, an alkyl group, for example, t-butyl and the like, an ether group, for example, phenoxy and the like, an alicyclic hydrocarbon group, for example, adamantyl, norbornyl, cyclohexyl, tricyclo[5. 2. 1. $0^{2,6}$]decane and the like, or the groups represented by the following formulae:

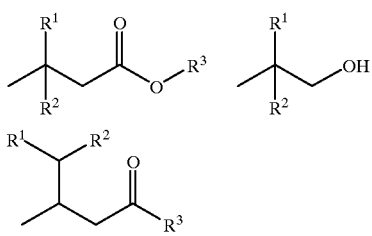

in which $R^1$, $R^2$ and $R^3$ each represents hydrogen, substituted or unsubstituted alkyl group such as methyl, ethyl or methylene, and others, B represents any substituent, for example, preferably, a carboxyl group or the group represented by the following formula:

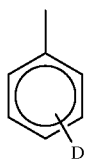

in which D represents —$OR^4$, —$COOR^4$ or —OCO—$R^4$ wherein $R^4$ in the substituent D each represents hydrogen or substituted or unsubstituted alkyl group such as methyl or ethyl, and l and m each is any positive integer.

More particularly, the film-forming copolymers advantageously used in the present invention include the following copolymers, although the present invention should not be restricted to these copolymers. Note in the described structures that m and n each is as defined above.

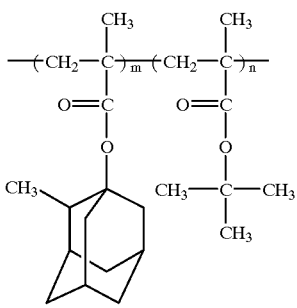
(XXX)

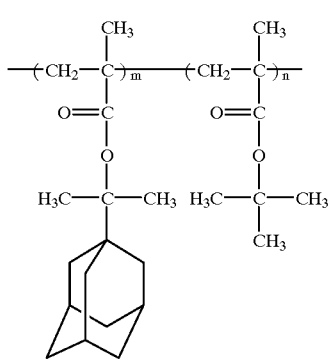
(XXXI)

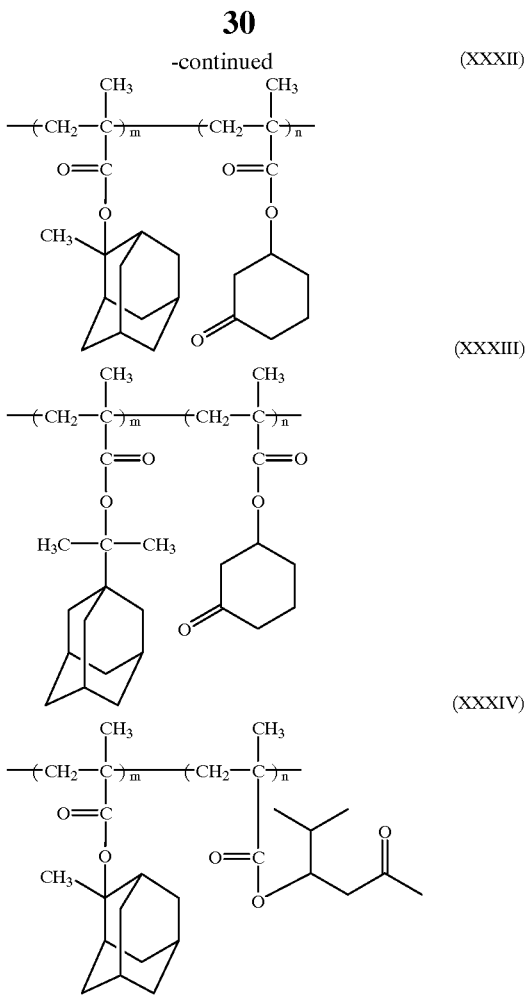
(XXXII)

(XXXIII)

(XXXIV)

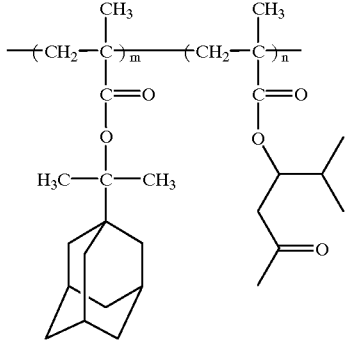
(XXXV)

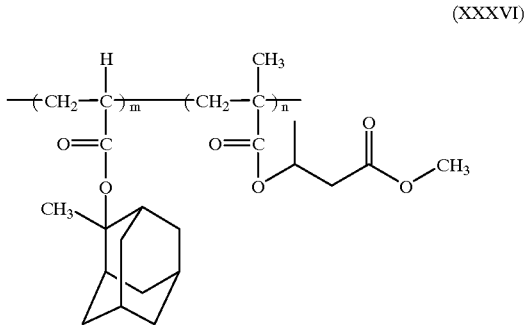
(XXXVI)

(XXXVII) 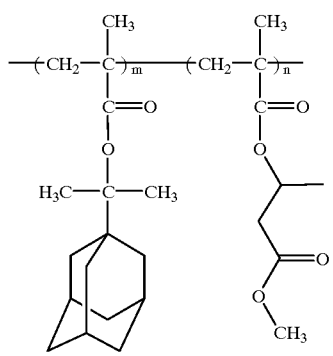

(XXXVIII) 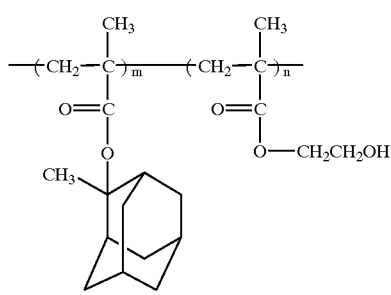

(XXXIX) 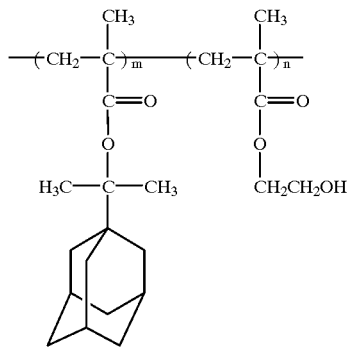

(XL) 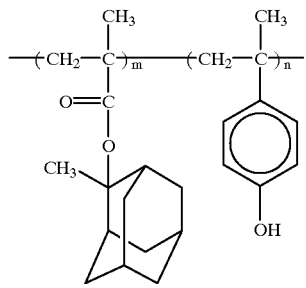

(XLI) 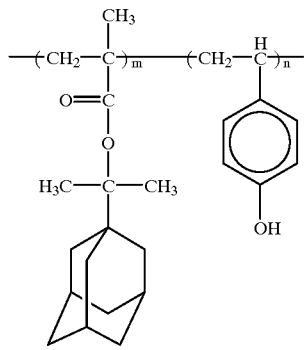

(XLII) 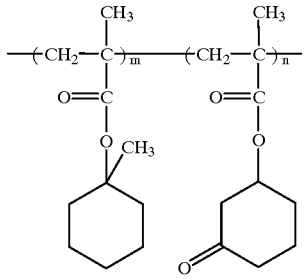

(XLIII) 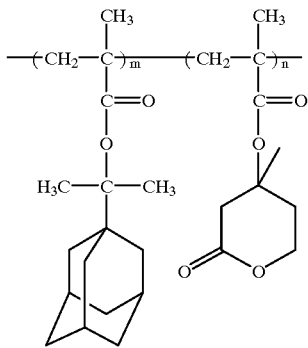

In addition, if desired, the above-described film-forming polymers or copolymers may contain alkali-soluble polymers or copolymers such as novolak resin, phenol resin, imide resin, carboxylic acid-containing resin and the like.

Moreover, in the practice of the present invention, any unpolymerized compound having a relatively low molecular weight (hereinafter referred to as a "non-polymeric compound") may be used for the same purpose, in place of the above-described film-forming polymers or copolymers. The nonpolymeric compounds used herein, as described above, include any alkali-insoluble and acid-sensitive compound capable of showing a good solubility in alkali, if the protected alkali-soluble group contained therein is cleaved with an acid originated from the photoacid generator used in combination with said non-polymeric compound. Said non-polymeric compound should not be restricted, insofar as its protected alkali-soluble group contains any one of the above-mentioned alicyclic moieties (B) of the formulae (II) to (VII). Typical examples of suitable film-forming, non-polymeric compounds include the following compounds, although the present invention should not be restricted to these compounds. Note that in the below-mentioned general formulae, $R_I$, $R_{II}$, Z and n each is as defined above.

(XLIV) 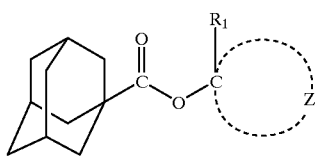

(XLV) 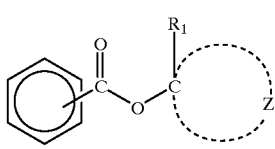

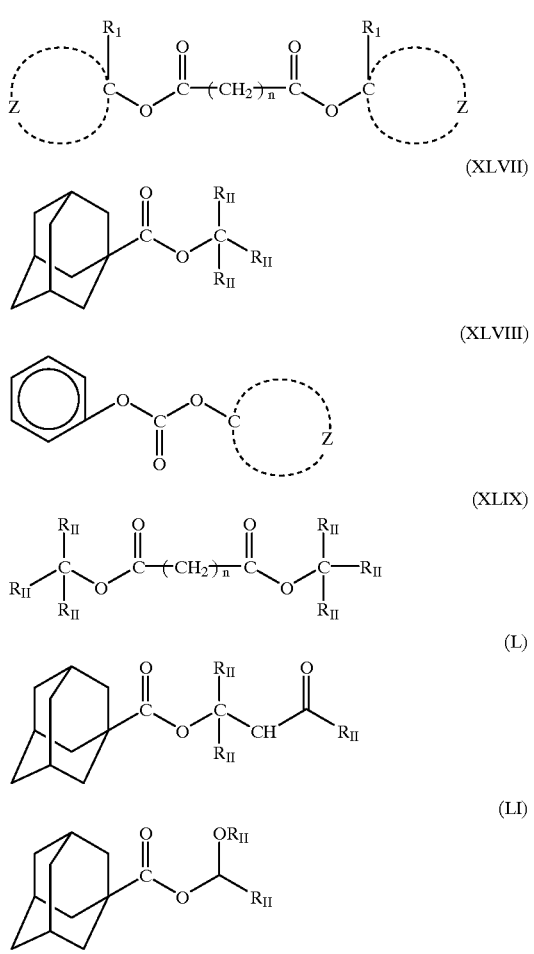

These nonpolymeric compounds, if desired, may contain any other protected moiety in which the protective group can be cleaved with an acid to thereby produce a carboxylic acid and other alkali-soluble compound, for example, tertiary carbon esters such as t-butylester, t-amylester, α,α-dimethylester and the like, acetal esters such as tetrahydropyranyl ester and the like, α-oxyketone esters such as 3-oxycyclohexyl ester and the like.

Since they cannot exhibit the expected resist characteristics when used alone, the above-mentioned nonpolymeric compounds have to be used in combination with any alkali-soluble polymer or copolymer. Typical examples of suitable alkali-soluble polymer or copolymer include novolak resins, phenol resins, imide resins, carboxylic acid-containing resins and the like, although the present invention should not be restricted to these resins. The mixing ratio of the nonpolymeric compound with the alkali-soluble polymer or copolymer may be widely varied depending upon various factors such as the used nonpolymeric compound, the expected resist characteristics and others.

The present invention resides in a chemically amplified resist composition which, as described above, comprises:

I. an acid-sensitive compound which has a structural unit containing an alkali-soluble group protected with an alicyclic hydrocarbon group-containing moiety of the above formula (II') in which unit said alkali-soluble group can be cleaved upon action of an acid, thereby making said compound alkali-soluble; and II. a photoacid generator (PAG) capable of producing an acid upon patterning exposure.

In the above formula (II'), it is essential that $R_1$' is a methyl, ethyl, propyl or isopropyl group which may be substituted, if desired. When $R_1$' in the formula (II') represents a hydrogen atom, a satisfactory high sensitivity cannot obtained, although satisfactory results can be obtained in other properties. Note that, as will be further clarified in the below-mentioned explanations, the present invention was particularly completed as a result of an improvement of the $R_1$' substituent in the alicyclic hydrocarbon group-containing moiety acting as the protective group.

In the acid-sensitive and film-forming compound used as a principal component of the resist composition according to the present invention, the protected alkali-soluble group is contained in the structural unit thereof, preferably a side chain thereof. Examples of suitable alkali-soluble groups for forming the protected alkali-soluble group, although they are not restricted to those below-mentioned, include a carboxylic acid group, sulfonic acid group, amide group, imide group and phenol group.

The above-described alkali-soluble group has to be initially protected for the purpose of inhibiting dissolution of said film-forming compound in an alkaline developer, and the protective moiety for said alkali-soluble group is preferably an alicyclic hydrocarbon group-containing moiety. The protected alkali-soluble group is preferably a carboxylic acid group represented by the following formula (VII').

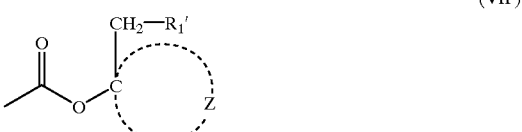

(VII')

in which $R_1$' and Z each is as defined above.

The alicyclic hydrocarbon group to be contained in the alkali-soluble group include a variety of groups which are well-known in the field of chemistry, and it may be substituted, if desired. Preferably, the alicyclic hydrocarbon group, as will be described in detail hereinafter, can contain two or more ring structures or condensed rings. More preferably, the alicyclic hydrocarbon group is an adamantane and derivatives thereof.

Further, the alkali-insoluble, film-forming compound which is sensitive to an acid generated from the photoacid generator used in combination with said film-forming compound includes a wide variety of compounds ranging from low molecular weight compounds to high molecular weight compounds, insofar as it can satisfy the described requirements, and they may be used alone or as a mixture of two or more compounds. Generally, the film-forming compound can be classified into two groups, i.e., (1) a polymer or copolymer comprising said structural unit as a repeating unit thereof, and (2) a nonpolymeric compound which is used in combination with one or more alkali-soluble polymer or copolymer.

Said film-forming compound may be in the form of a polymer or copolymer having a wide variety of molecular weight from a low range to a high range. The polymer may be a homopolymer consisting essentially of a single monomer unit or a polymer comprising two or more monomer units such as copolymer, terpolymer and the like. Suitable monomer units for the polymer or copolymer, although they are not restricted to those below-mentioned, include acrylic acid esters including methacrylic acid esters and derivatives thereof, itaconic acid esters and derivatives thereof, fumaric acid esters and derivatives thereof, and styrene substituents and derivatives thereof. When said film-forming compound is in the form of a nonpolymeric compound, to obtain the expected resist characteristics, it is necessary to use any alkali-soluble polymer or copolymer in combination with said compound.

In the parent application of this CIP application, as described above, the inventors have disclosed their following findings, that is, (1) in the chemically amplified resist composition, if an alicyclic hydrocarbon group is contained in the resist structure, dissolution of the exposed film in an aqueous alkaline solution can be inhibited due to a strong hydrophobic property of said hydrocarbon group during development of the exposed film with the alkaline solution; (2) in view of this fact, it is preferred to introduce a moiety containing an alicyclic group as a protective group (protected alkali-soluble group capable of being cleaved from the resist composition upon action of an acid) into the resist structure to thereby remove the alicyclic group from the exposed region upon exposure and post exposure baking (PEB); and (3), to ease said cleaving reaction of the alicyclic group, it is preferred to introduce a moiety which contains an alicyclic group wherein a carbon atom constituting the ring skeleton of the alicyclic group is suitably substituted with a lower alkyl groups, as a part of the protective group. However, at the stage of filing this parent application, the invented resist composition was insufficient to provide a remarkably increased sensitivity which is required in the ArF lithography.

The inventors have further continued their studies to fully solve the problem concerning a high sensitivity of the resist and, as described above, they now found that a significantly increases sensitivity can be obtained by using as a moiety of the protective group in the resist structure the group: —$CH_2$—$R_1'$ wherein $R_1'$ is a methyl, ethyl, propyl or isopropyl.

The chemically amplified resist composition according to the present invention, as described above, is a chemically amplified resist composition which contains, in combination, as acid-sensitive compound in which the protected alkali-soluble group is cleaved with an acid to thereby make the compound alkali-soluble, preferably a polymer or copolymer in which "copolymer" includes a terpolymer or other copolymers of four or more components, or a non polymeric compound, and a photoacid generator. The chemically amplified resist composition and its preparation as well as the formation of resist patterns using this resist composition will be described hereinafter with reference to preferred embodiments thereof. Note, however, that the present invention should not be restricted to the described embodiments.

In the chemically to amplified resist composition according to the present invention, a protected alkali-soluble group to be contained in the structure of the acid-sensitive compound which is a principal component of the composition is preferably one member selected from the group consisting of a carboxylic acid group, a sulfonic acid group, an amide group, an imido group and a phenol group, and, more preferably, a carboxylic acid group of the above-described formula (VII'), an imide group of the following formula (XVII') or a phenol group of the following formula (XIX'):

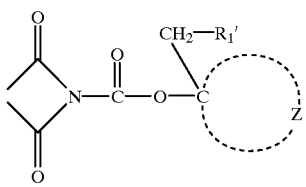

(XVII')

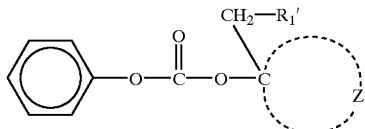

(XIX')

wherein $R_1'$ and Z each is as defined above.

For example, the carboxylic acid group as the alkali-soluble group is a unit capable of producing a carboxylic acid upon cleavage of the protective moiety therefrom as a result of the action of the acid, and includes, for example, tertiary carbon esters such as t-butylester, t-amylester and α,α-dimethylbenzylester, acetal esters such as tetrapyranylester, β-oxyketone esters such as 3-oxycyclohexylester, lactone esters such as mevalonic lactone ester, and others.

Further, the acid-sensitive compound used in the chemically amplified resist composition of the present invention may preferably contain any esters derived from trialkyl carbinols, acetals, β-oxyketones, α-oxyalkenes, α-oxycycloalkenes and others in the structural unit thereof.

Furthermore, the alicyclic hydrocarbon group contained in the alkali-soluble group includes a variety of groups which are well-known in the field of chemically amplified resists. Some typical examples of suitable alicyclic hydrocarbon groups were indicated above with reference to the structure thereof, and include those containing the following compounds as the skeleton:

(1) adamantane and derivatives thereof;
(2) norbornane and derivatives thereof;
(3) perhydroanthracene and derivatives thereof;
(4) perhydronaphthalene and derivatives thereof;
(5) tricyclo[5. 2. 1. 0$^{2,6}$]decane and derivatives thereof;
(6) bicyclohexane and derivatives thereof;
(7) spiro[4. 4]nonane and derivatives thereof; and
(8) spiro[4. 5]decane and derivatives thereof.

In the practice of the present invention, the alicyclic hydrocarbon groups which contain two or more ring structures or condensed rings can be advantageously used, because if the alicyclic group contains only a single ring, i.e., it is a cyclohexyl group, for example, a satisfactory resistance to dry etching cannot be obtained. Further, among the above-indicated examples of suitable alicyclic hydrocarbon groups, if it is intended to obtain an excellent resistance to dry etching equivalent to or higher than that of the conventional novolak resists, it is more preferred to use as the alicyclic hydrocarbon group those containing condensed ring(s), such as adamantane.

In the chemically amplified resist composition according to the present invention, the acid-sensitive, film-forming compound contained therein is preferably in the form of a polymer or copolymer. The film-forming polymers or copolymers can be freely selected from a wide variety of polymers or copolymers satisfying the above-described requirements, depending on various factors such as properties of the resist patterns. Suitable film-forming polymers or copolymers, although they are not restricted to those below-mentioned, include those containing as a repeating unit thereof (meth)acrylic acid ester and derivatives thereof, itaconic acid ester and derivatives thereof, fumaric acid ester and derivatives thereof, styrene substituent and derivatives thereof, and others. These repeating units may be contained solely or in combination. The inventors have found that the above-listed repeating units, if they are introduced in the polymer or copolymer, can provide notable advantages concerning preparation of the polymer or copolymer and coating of the resist composition, in comparison to other conventional polymers or copolymers.

In addition, if desired, the film-forming copolymers for use in the present invention may have associated with said repeating unit(s) one or more other repeating units such as acrylonitriles, olefines, dienes and derivatives thereof, although the present invention should not be restricted to these repeating units.

In the film-forming polymers or copolymers used in the present invention, in order to attain a good adhesion of the resist to the underlying substrate or layer, it is more preferred that the polymers or copolymers contain a repeating unit having a strong polarity. Particularly, if they contain a repeating unit which is by itself soluble in an alkali solution, in addition to the essential component, i.e., alkali-soluble group, such combination of the repeating units in the polymers or copolymers enables the resulting resist composition to be developed with an alkaline solution, as a function of a small amount of carboxylic acid originated from the protected alkali-soluble group, and others.

According to one aspect of the present invention, a resist composition is provided in which a film-forming compound as a principal component of the composition is in the form of a copolymer, and the repeating units of said copolymer contain at least one repeating unit selected from the repeating unit containing an alkali-soluble group in a side chain thereof and the repeating unit containing additional, protected alkali-soluble group, capable of being cleaved upon action of an acid produced from the photoacid generator (PAG), in a side chain thereof, in addition to the above-mentioned repeating unit containing the alicyclic hydrocarbon group.

Preferably, the film-forming copolymers useful in the resist composition of the present invention have the structural unit represented by the following formula (XXIV') or (XXVI'):

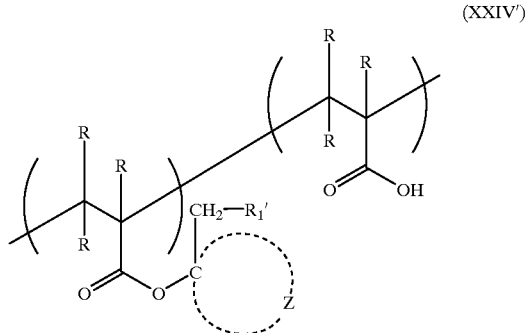

(XXIV')

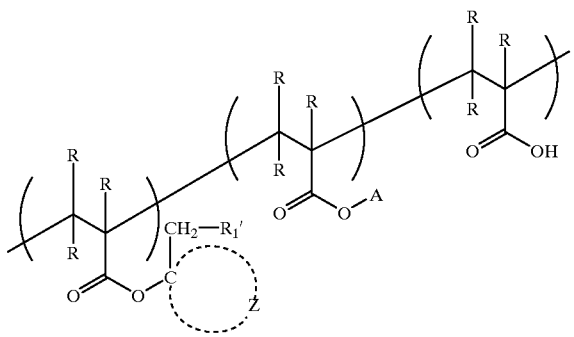

(XXVI')

in which
R may be the same or different, and each represents a hydrogen, halogen or a substituted or unsubstituted, straight chain or branched chain alkyl group of 1 to 4 carbon atoms,
A represents a protective moiety capable of being cleaved upon action of said acid, and
$R_1'$ and Z each is as defined above.

The structural unit represented by the above formula (XXIV') is illustrative of introducing in the structure of the copolymer, in combination, a protective group containing an alicyclic skeleton such as adamantane or norbornane and capable of being cleaved upon producing an acid from a photoacid generator, and producing an alkali-soluble carboxylic acid group. After exposure of the resist film, an exposed area of the resist film can be smoothly dissolved in an alkaline solution as a developer, since said copolymer contains a carboxylic group in the structure thereof. Further, the control of the content of the carboxylic group in the resist copolymer makes the exposed resist film developable with a currently standard alkaline developer such as an aqueous solution of 2.38% tetramethylammonium hydroxide (TMAH). In this instance, the content of the carboxylic acid-containing unit in the resist copolymer is preferably not less than 5% by mole or less than 50% by mole.

Further, the structural unit represented by the above formula (XXVI') is illustrative of introducing in the structure of the copolymer, in combination, a protective group containing an alicyclic skeleton such as adamantane or norbornane and capable of being cleaved upon producing an acid from a photoacid generator, a conventional protective group which is distinguished from said alicyclic skeleton-containing protective and which is able to be cleaved upon the acid originated from the photoacid generator, and an alkali-soluble carboxylic acid group. If the resist composition containing the described copolymer is intended to be used in excimer lithography using ArF excimer laser light having a wavelength of 193 nm as an exposure source, it is preferred to exclude aromatic ring(s) from the protective group. Using the described structural unit, it becomes possible to attain a smooth development of the exposed resist film with an alkaline developer, even if the intended cleavage of the protective group could not be induced due to any problem.

In the above structural units of the formulae (XXIV') and (XXVI'), the substituent $R_1'$ may be methyl, ethyl, and halides thereof such as chloride and bromide. The substituent A may be the conventional protective groups such as quaternary carbon group such as t-butyl or t-amyl, or β-oxyketone group such as 3-oxycyclohexyl, mevalonic lactone, and the like. Moreover, the alicyclic hydrocarbon group completed by the atoms Z may be adamantyl and derivatives thereof, norbornane and derivatives thereof, perhydroanthacene and derivatives thereof, perhydronaphthalene and derivatives thereof, tricyclo[5. 2. 1. 0$^{2,6}$]decane and derivatives thereof, spiro[4. 4]nonane and derivatives thereof as well as spiro[4. 5]decane and derivatives thereof, mentioned above with the structures thereof.

The film-forming polymers or copolymers useful in the present invention will be further described particularly with reference to those containing a carboxylic group as the alkali-soluble group.

Preferably, the film-forming polymer is (meth)acrylate polymer represented by the (XXVII')

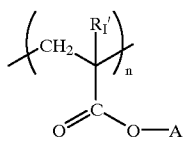

in which $R_1'$ represents a proton (hydrogen), halogen or substituted or unsubstituted alkyl group such as methyl, ethyl or methylol, A corresponds to the above-mentioned moiety (II'), and represents a protective group, preferably a protected group of alicyclic hydrocarbon group containing an ester bond as a part of the ring structure and being substituted with a higher alkyl group than ethyl, more preferably, adamantyl, norbornyl, cyclohexyl, tricyclo[5. 2. 1. 0$^{2,6}$]decane and other alicyclic groups protected with quaternary carbon group or β-oxyketone group such as t-butyl, t-amyl, 3-oxycyclohexyl and the like, and n is any positive integer.

And, the film-forming copolymer is preferably (meth) acrylate copolymer represented by the formula (XXVIII') or (XXIX'). Although not shown, the (meth)acrylate terpolymer can be represented by the similar structure except for the third repeating unit added.

(XXVIII')

(XXIX')

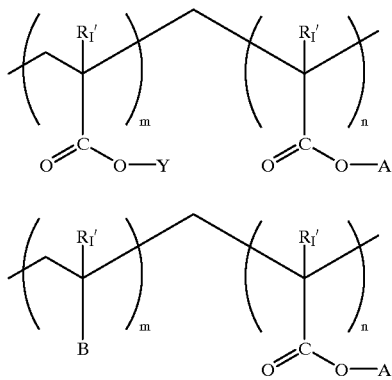

in which $R_I'$, A and n each is as defined above,

Y represents any substituent such as, preferably, an alkyl group, for example, t-butyl and the like, an ether group, for example, phenoxy and the like, an alicyclic hydrocarbon group, for example, adamantyl, norbornyl, cyclohexyl, tricyclo[5. 2. 1. 0$^{2,6}$]decane and the like, or the groups represented by the following formulae:

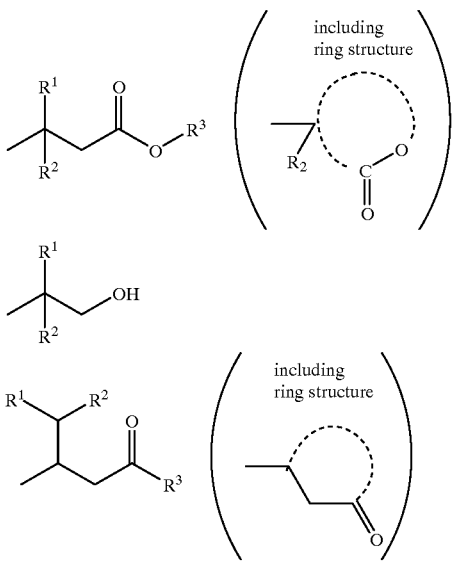

(including ring structure)

(including ring structure)

in which $R^1$, $R^2$ and $R^3$ each represents hydrogen, substituted or unsubstituted alkyl or alkylene group such as methyl, ethyl or methylene, and others, B represents any substituent, for example, preferably, a carboxyl group or the group represented by the following formula:

in which D represents —OR$^4$, —COOR$^4$ or —OCO—R$^4$ wherein R$^4$ in the substituent D each represents hydrogen or substituted or unsubstituted alkyl group such as methyl or ethyl, and m and n each is any positive integer.

In addition, if desired, the above-described film-forming polymers or copolymers may contain alkali-soluble polymers or copolymers such as novolak resin, phenol resin, imide resin, carboxylic acid-containing resin and the like.

Moreover, in the practice of the present invention, any unpolymerized compound having a relatively low molecular weight (hereinafter referred to as a "non-polymeric compound") may be used for the same purpose, in place of the above-described film-forming polymers or copolymers. The nonpolymeric compounds used herein, as described above, include any alkali-insoluble and acid-sensitive compound capable of showing a good solubility in an alkaline developer, if the protected alkali-soluble group contained therein is cleaved with an acid originated from the photoacid generator used in combination with said non-polymeric compound. Said non-polymeric compound should not be restricted, insofar as said compound contains an alicyclic ring skeleton, aromatic ring skeleton such as benzene ring, or alkyl skeleton, and a part of the skeleton is substituted with a group containing any moiety of the formula (II'). Typical examples of suitable film-forming, non-polymeric compounds include the following compounds, although the present invention should not be restricted to these compounds. Note that in the below-mentioned general formulae, $R_1'$ and Z each is as defined above.

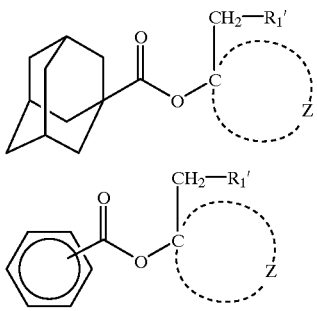

In addition to the group containing the moiety represented by the formula (II'), the nonpolymeric compounds, if desired, may contain any other protected moiety or unit in which the protective group can be cleaved with an acid to thereby produce a carboxylic acid and other alkali-soluble compound, for example, tertiary carbon esters such as t-butylester, t-amylester, α,α-dimethylester and the like, acetal esters such as tetrahydropyranyl ester and the like, β-oxyketone esters such as 3-oxycyclohexyl ester and the like.

Since they cannot exhibit the expected resist characteristics when used alone, the above-mentioned nonpolymeric compounds have to be used in combination with any alkali-soluble polymer or copolymer. Typical examples of suitable alkali-soluble polymer or copolymer include novolak resins, phenol resins, imide resins, carboxylic acid-containing resins and the like, although the present invention should not be restricted to these resins. The mixing ratio of the nonpolymeric compound with the alkali-soluble polymer or copolymer may be widely varied depending upon various factors such as the used nonpolymeric compound, the expected resist characteristics and others.

In the chemically amplified resist composition according to the present invention, a photoacid generator (PAG) capable of being decomposed upon exposure to a patterning radiation to thereby produce an acid capable of causing cleavage of a protective moiety of the protected alkali-soluble group is used in association with the above-described film-forming compound such as film-forming polymer or copolymer as well as a nonpolymeric compound. The photoacid generator used herein may be any conventional agent which is well-known as a photoacid generator (PAG) in resist chemistry, namely, compounds capable of generating a protonic acid upon exposure of the coating of the resist composition to a patterning radiation such as ultraviolet radiation, far ultraviolet radiation, vacuum ultraviolet radiation, electron beam, X-ray and laser light. Typical examples of the photoacid generator suitably used in the practice of the present invention include various compounds described hereinafter, although the present invention should not be restricted to these compounds.

(1) diazonium salts represented by the following formula:

in which

Ar represents a substituted or unsubstituted aromatic group, for example, phenyl group or phenyl group substituted with halogen such as chlorine, bromine, iodine or fluorine, alkyl such as methyl or t-butyl, aryl or other substituent groups, or a substituted or unsubstituted alicyclic hydrocarbon group, and X represents halogen, $BF_4$, $BF_6$, $PF_6$, $AsF_6$, $SbF_6$, $CF_3SO_3$, $ClO_4$ or anion of organic sulfonic acids.

(2) iodonium salts represented by the following formulae:

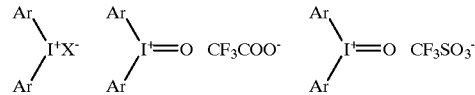

in which Ar and X are as defined above.

(3) sulfonium salts represented by the following formulae:

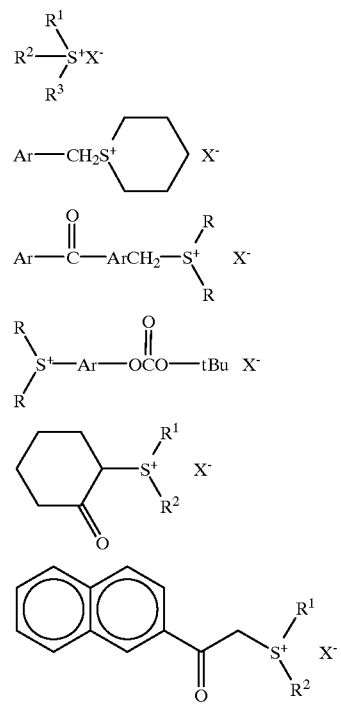

in which R, $R^1$, $R^2$, $R^3$, Ar and X each is as defined above, and, for example, R is methyl and $R^1$, $R^2$ and $R^3$ each is phenyl, and tBu is t-butyl.

(4) sulfonic esters represented by the following formulae:

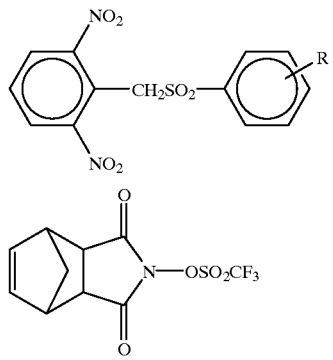

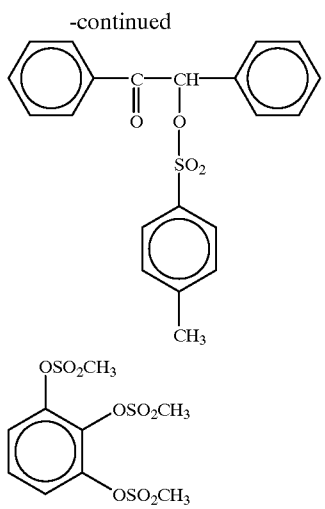

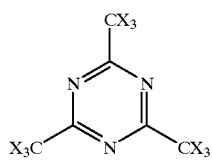

in which Ar and R are as defined above.

(5) oxazole derivatives represented by the following formula:

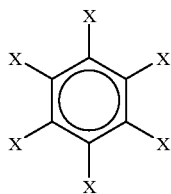

in which X is as defined above with the proviso that at least one of the substituents —CX$_3$ is a substituted or unsubstituted aryl or alkenyl.

(6) halides represented by the following formula:

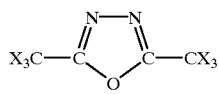

in which X is as defined above.

(7) s-triazine derivatives represented by the following formula:

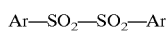

in which X is as defined above with the proviso that at least one of the substituents —CX$_3$ is a substituted or unsubstituted aryl or alkenyl.

(8) disulfone derivatives represented by the following formula:

Ar—SO$_2$—SO$_2$—Ar in which
Ar is as defined above.

(9) imide compounds represented by the following formulae:

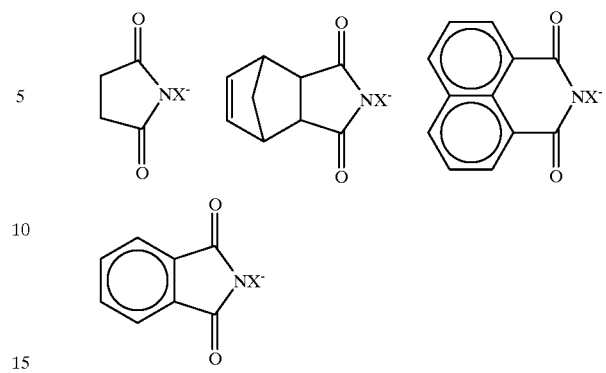

in which X is as defined above.

(10) others such as oxime sulfonate, diazonaphtoquinone, benzoine tosylate and the like.

More particularly, some of the above-described compounds can be represented by the following formulae:

triphenylsulfonium hexafluoroantimonate:

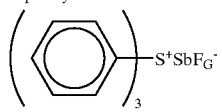

triphenylphosphonium hexafluorophosphate:

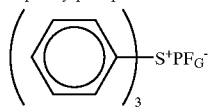

diphenyliodo hexafluorophosphate:

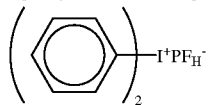

benzoine tosylate:

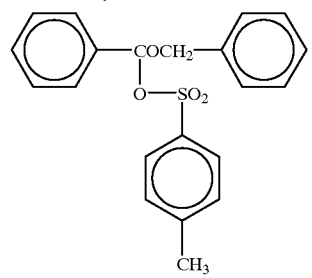

The content of the PAG compounds in the resist composition may be widely varied depending upon factors such as the acid releasing capability of the PAG compound used, the level of the patterning radiation and the like. The content of the PAG compounds in the resist composition is preferably in the range of 0.1 to 50% by weight, based on the total weight of the film-forming compound. A content of more than 50% by weight should be avoided, because it does not ensure satisfactory patterning due to excess absorption of the patterning radiation. More preferably, the content of the PAG compounds in the resist composition is in the range of 1 to 30% by weight, especially 1 to 15% by weight, based on the total weight of the film-forming compound.

Using the above-described film-forming compound as a principal component and the above-described photoacid generator (PAG), the chemically amplified resist composition according to the present invention can be produced by conventional methods well-known in resist chemistry. The resist solution is preferably provided in the form of solution. For example, if the film-forming compound constituting the resist composition is the above-mentioned polymer or copolymer, it is contemplated that suitable monomers for use in the formation of said polymer or copolymer are first polymerized in the presence to a suitable polymerization initiator, followed by adding a photoacid generator to a solution of the resulting polymer or copolymer, thereby providing the resist solution. The conditions for the polymerization and the initiators used may be freely selected from wide variety of well-known conditions and initiators. Typical examples of suitable polymerization initiators include, for example, the following compounds. AIBN (azoisobutylonitrile):

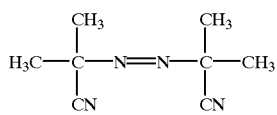

MAIB (dimethyl-2,2-azoisobisbutylate):

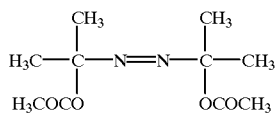

In the preparation of the resist solution, any organic solvent may be used to dissolve said film-forming compound and photoacid generator. The organic solvent used may be widely varied depending on various factors such as the resist composition used, coating conditions and the like, and typical examples of suitable organic solvents, although they are not restricted to the below-mentioned, include ethyl lactate, methyl amyl ketone, methyl-3-methoxypropionate, ethyl-3-ethoxypropionate, propyleneglycol methyletheracetate (PGMEA), diacetoalcohol, cyclohexanone, ethyl pyruvicate and similar solvents. These organic solvents may be used alone or, if desired, may be used as a mixture of two or more solvents. The amount of the organic solvent used is not restricted, however, it is preferred that the solvent be used in an amount sufficient to provide a resist coating having a desired layer thickness and a viscosity for coating such as spin coating.

In the preparation of the resist solution, if desired, an auxiliary solvent may be used in addition to the above-described organic solvent (hereinafter referred to as "main solvent"). The auxiliary solvent is not required if the resist components can be easily dissolved in the main solvent, however, if the resist components can hardly be dissolved in the main solvent, the auxiliary solvent will assist in dissolving the resist components in the main solvent. Useful auxiliary solvents, although they are not restricted to those below-mentioned, include butyl acetate, γ-butylolactone, propyleneglycol methylether and similar solvents. Generally, these auxiliary solvents are preferably used in an amount of about 1 to 30% by weight, more preferably, about 10 to 20% by weight, with regard to the main solvent.

In another aspect thereof, the present invention resides in a novel process for forming resist patterns, particularly positive-working resist patterns, on a substrate to be fabricated, said process comprising the steps of:

coating the chemically amplified resist composition according to the present invention on the substrate;

selectively exposing a coating of said resist composition, produced in the above coating step, to a patterning radiation capable of causing generation of an acid from the photoacid generator in said resist composition;

heating or baking the exposed resist coating to a temperature at which the cleavage of a protective moiety of the protected alkali-soluble group in the film-forming compound in said resist composition is induced; and developing the heated resist coating with an alkaline developer.

Preferably, in the described process for the formation of resist patterns, in addition to the Post-Exposure Baking (PEB) made after patternwise exposure of the resist coating, the resist coating may be subjected to another heating or baking process, i.e., "prebaking". In other words, it is preferred that the patterning process of the present invention may further comprise the step of heating the resist coating before exposure thereof to the patterning radiation.

More preferably, the patterning process of the present invention comprises the steps of:

spin-coating the resist composition from a solution thereof in an organic solvent on the substrate to form a resist coating having a thickness of 0.1 to 200 μm;

prebaking the resist coating at 60 to 160° C. for 60 to 180 seconds;

selectively exposing the prebaked resist coating to a patterning radiation from an excimer laser or deep UV source;

post-exposure baking the exposed resist coating at 60 to 150° C. for 60 to 120 seconds; and developing the baked resist coating with an alkaline developer, thereby forming positive resist patterns.

The patterning process according to the present invention, including the above-mentioned preferred embodiments thereof, can be carried out in a manner based on conventional lithographic processes. A series of process steps which can be advantageously adopted in the practice of the present invention will be described hereinafter. Note, however, that the present invention should not be restricted to the described steps, and accordingly any modifications or variations can be applied to the described process of the present invention within the spirit and scope of the present invention.

First, the resist composition is coated on a substrate to be fabricated, to thereby form a resist coating having a predetermined thickness. The substrate used herein may be any conventional substrate used in the field of semiconductor devices and other devices, and typical examples of suitable substrates include a silicon substrate, a glass substrate, a SOS substrate, a non-magnetic substrate such as ceramic substrate and the like. If desired, the substrate may additionally contain one or more overlaying layers such as polysilicon layer, oxide layer, for example, silicon oxide layer, nitride layer, for example, silicon nitride layer, metallic layer, for example, aluminum layer, insulating interlayer, magnetic layer and the like. Further, the substrate and/or the overlaying layer(s) may contain any elements such as wiring or circuits fabricated therein. Furthermore, in order to increase the adhesion strength of the resist coating to the substrate, a surface of the substrate may be subjected to a conventional hydrophobic treatment. Typical examples of the chemicals advantageously used in this treatment are 1,1,1,3,3,3-hexamethyldisilazane (HMDS) and the like.

Coating of the resist composition can be made from a resist solution containing the same composition as set forth in the above paragraphs. The resist solution can be preferably coated over the substrate surface by spin-coating, although any other conventional coating method such as roller coating and dip coating may be used, if desired. The layer thickness of the resist coating is preferably in the range of about 0.1 to 200 µm, and it is preferably in the range of about 0.1 to 2.0 µm for KrF lithography and in the range of about 0.1 to 2.0 µm for ArF lithography. Moreover, if the resist composition used contains the alicyclic moiety (B)-containing compound, it is generally preferred that the layer thickness be in the range of about 0.3 to 2.0 µm. Note, however, that the layer thickness of the resist coating may be varied depending upon different factors such as the intended use of the resulting resist patterns.

The resist coating formed on the substrate is generally, and preferably, prebaked at a temperature of about 60 to 200° C., more preferably about 60 to 150° C., for about 60 to 180 seconds, before selective exposure of the coating to patterning radiation. Prebaking may be carried out by using any heating means conventionally used in the resist process. Suitable heating means include, for example, a hot plate, infrared (IR) heating oven, microwave heating oven and the like.

In addition, if a topcoat layer or protective layer is to be applied over the resist coating, it is contemplated to spin-coat a solution of olefinic resin over the resist coating, followed by baking the olefinic coating at a temperature of about 100° C.

Next, the optionally prebaked resist coating is selectively exposed to a patterning radiation in conventional exposure devices or aligners. Suitable exposure devices include commercially available devices such as ultraviolet (far UV, deep UV or vacuum UV) exposure devices, X-ray exposure devices, electron beam exposure systems and excimer steppers, for example. The conditions of exposure can be varied to select the optimum condition in each process, taking various factors into consideration. Particularly, in the practice of the present invention, as can be appreciated from the above descriptions, the patterning exposure can be advantageously made by using an excimer laser such as a KrF laser (wavelength of 248 nm) and an ArF laser (wavelength of 193 nm) as the exposure source. Note, in this connection, that the term "radiation" used herein is intended to mean any radiation from various available light sources such as UV radiation, far UV radiation, deep UV radiation, vacuum UV radiation, electron beam (EB), laser light and the like. As a result of the selective exposure, the photoacid generator (PAG) in the exposed areas of the resist coating is decomposed, and thus the exposed resist coating is now ready for dissolving off from the substrate in the subsequent development step using an alkaline developer.

After completion of the selective exposure, the exposed resist coating is heated on a heating means such as a hot plate. As mentioned above, the heating is called Post-Exposure Baking (PEB), and PEB is preferably carried out at a temperature sufficient to cause cleavage of the protective group from the protected alkali-soluble group in the film-forming compound in the resist coating in the presence of a catalytic acid produced from the photoacid generator. PEB may be carried out in a manner similar to that of the above-described prebaking, and generally it can be carried out at a temperature of about 60 to 160° C., preferably about 100 to 150° C., for about 30 to 240 seconds. Further, when the resist coating is used in combination with the topcoat layer, it is suggested to separate and remove the topcoat layer in any suitable manner such as use of an organic solvent, after PEB and before the development.

As a final step of the present process, the heated resist coating is developed with an alkaline solution such as an aqueous alkaline solution or alcoholic alkaline solution as a developer in accordance with any conventional method. Suitable apparatuses for use in this development step include the well-known developers such as a spin developer, dip developer and spray developer.

Typical examples of the alkaline solution suitable as the developer include an aqueous or alcoholic solution of hydroxides of metals belonging to the groups I and II of the periodic table such as potassium hydroxide or an aqueous or alcoholic solution of organic bases free from metal ions such as tetraalkylammonium hydroxide, typical examples of which will be described hereinafter with reference to the chemical formulas thereof. Further, if desired, the alkaline solution used as the developer may additionally contain any additives such as a surface active agent in order to improve the resulting development effect. Furthermore, if it is appropriate, as the inventors have suggested in the above-cited Japanese Unexamined Patent Publication (Kokai) No. 7-23053, the developer used herein may be an aqueous or alcoholic solution containing as the developer an ammonium compound represented by the following formula:

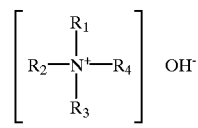

in which $R_1$, $R_2$, $R_3$ and $R_4$ may be the same or different, and each represents a substituted or unsubstituted alkyl group of 1 to 6 carbon atoms, a morpholine compound represented by the following formula:

or a mixture thereof. The ammonium compound useful as the developer, although it is not restricted to the below-mentioned, includes:

tetramethylammonium hydroxide (TMAH),
tetraethylammonium hydroxide (TEAH),
tetrapropylammonium hydroxide (TPAH),
tetrabutylammonium hydroxide (TBAH), and the like. More preferably, tetramethylammonium hydroxide (TMAH) can be used as the developer.

The developer is dissolved in water or an alcohol such as methanol, ethanol, isopropyl alcohol and the like to obtain a developing solution. The concentration of the developer in the developing solution may be widely varied, however, it is generally in the range of about 0.1 to 15% by weight, preferably in the range of about 0.1 to 10% by weight. The developing time may also be widely varied, however, it is generally about 1 to 5 minutes, preferably for about 1 to 3 minutes. As a result of development, the exposed areas of the resist coating are dissolved and removed from a surface of the substrate, thereby forming the desired positive resist patterns corresponding to the exposure pattern. Finally, the resulting resist patterns are rinsed with deionized water, and dried in accordance with the conventional manner.

As can be understood from the above-mentioned descriptions and the appended working examples, according to the present invention, it becomes possible to produce fine positive resist patterns having a good sensitivity suitable for practical use and having no swelling. Further, if the film-forming compound as a principal component of the resist composition is constituted from the film-forming copolymer in which the specific monomer skeleton is introduced in one monomer unit and at the same time said monomer unit is copolymerized with another monomer unit containing two or more alicyclic or polycyclic hydrocarbon groups, it becomes possible to effectively form resist patters at a high sensitivity upon exposure to ultrashortwave radiation such as ArF exicimer laser light. Furthermore, if the film-forming copolymer used contains a second monomer unit having a side chain containing a carboxyl group protected with a second protective group (ester group), in addition to a first monomer unit having a side chain containing a carboxyl group protected with a first protective group (ester group), since both first and second ester groups protecting the carboxyl groups can be cleaved upon the acid catalytic reaction, it becomes possible to easily attain higher sensitivity and resolution in comparison with the conventional resist compositions. Moreover, such a film-forming copolymer can also provide a high sensitivity resist composition suitable for exposure to ultrashortwave radiation such as ArF exicimer laser light, if the second monomer unit thereof contains, for example, a polycyclic hydrocarbon group such as adamantyl group, thereby ensuring a higher resistance to RIE, and the copolymer itself does not contain any chromophore showing a large absorption coefficient in the deep ultraviolet region.

In addition to these advantages, using the described chemically amplified resist composition according to the present invention, and an aqueous or alcoholic solution of the specific ammonium compound or morpholine compound as the developer in combination with said use of the specific resist composition, it becomes possible to diminish peeling-off or cracking of the resist patterns, thereby enabling stable obtention of patterning characteristics. Note that the combined use of the specific resist composition and the specific developer is effective to control the compatibility of the resist composition with the developer and the solubility of the resist composition in the developer, thus moderating the stress generated during the development. Further, since strain generated in the resist coating during development can be reduced to a moderate level, it becomes possible to stably obtain the patterning characteristics. Furthermore, using the resist composition of the present invention, fine resist patterns can be stably produced because of the extended margin of exposure, in addition to the improved adhesion of the resist patterns to the underlying layer or substrate. Moreover, when an exposure mask for selectively shielding the patterning radiation in conformity with the circuit pattern to be printed is used in the exposure step, it becomes possible to produce a positive resist pattern exactly corresponding to the pattern of the exposure mask, namely, undesirable expansion of the pattern can be effectively prevented in the resulting resist pattern. It should be noted that these advantages particularly rely upon use of the specific film-forming compounds containing the alkali-soluble group protected with the described lactone moiety (A) or alicyclic moiety (B) wherein one carbon atom constituting the ring skeleton thereof is substituted with a suitable lower alkyl group $R_f$, the protective moiety (A) or (B) being directly or indirectly, i.e., through at least one linkage atom, bonded with said alkali-soluble group.

In addition, according to the present invention, since the chemically amplified resist composition contains a compound having a protective group represented by the above formula (II') in the structure thereof, the protective group containing an alicyclic group, a cyclic skeleton of which has an ester bond formed through one or more other atoms, it becomes possible to reduce or moderate a rigidity of the composition due to presence of the alicyclic hydrocarbon group contained, thus enabling stable patterning properties.

The protective group used in the present invention can particularly exhibit its excellent effects when it is used in the chemically amplified resist compositions consisting of an alicyclic unit and a protective unit, however, it is also expected that it can provide satisfactory effects in other types of the resist compositions. Note, as mentioned above, that the most remarkable effects can be obtained if the present protective group is used in the resist resins containing an alicyclic hydrocarbon group originated from, for example, adamantane and its derivatives, norbornane and its derivatives, tricyclo [5. 2. 1. $0^{2,6}$] decane and its derivatives, and others.

EXAMPLES

The present invention will be further described with reference to the appended working examples. Note, however, that the examples are included herein for only explanation purpose and they are not restrictive of the present invention.

Example 1

To a sufficiently dried 100 mL-volume eggplant-shaped flask containing a Teflon™-coated stirring bar, was added 30 mL of anhydrous methylene chloride, 6 g (46.1 mmol) of (±)-mevalonic lactone and 4.82 g (46.1 mmol) of methacryloyl chloride, and the content in the flask was stirred at 0° C. in a dry nitrogen atmosphere. To the resulting solution, 5.1 g (50.4 mmol) of triethylamine and 10 mg of N,N-dimethylaminopyridine were added, and the mixture was stirred at 0° C. for one hour. After dissipation of the starting materials was confirmed by a thin layer chromatography, the reaction solution was transferred to a 300 mL-volume separating funnel, and washed with 100 mL of water. The'separated aqueous phase was thrice extracted with methylene chloride. An organic phase was separated, washed with a saturated solution of sodium chloride, and dried over anhydrous sodium sulfate. The dried organic phase was filtered through a filter paper, and a solvent in the filtrate was distilled off at a reduced pressure. A brown oil was thus obtained. The oil was then purified on a silica gel chromatography to obtain a colorless and transparent oily product, namely, (±)-mevalonic lactone methacrylate, at a yield of 94 g (65%).

The results of the analysis of the thus obtained product are as follows:

$^1$H NMR (CDCL$_3$, δ, J in Hz): 6.05, 5.58 (each 1H), 4.44–4.35 (2H, m), 3.19 (1H, d, J=17.5), 2.62 (1H, m), 2.60 (1H, d, J=17.5), 2.03 (1H, m), and 1.91, 1.66 (each 3H, s). In the parenthesized characters, s, d and m represent a "singlet", "doublet" and "multiplet", respectively.

Further, the results of the IR analysis of the product are as follows:

IR (KBr, neat, cm$^{-1}$): 2980 (w), 1743 (s), 1714 (s), 1271 (m), 1173 (s), 1161 (s) and 1074 (m). In the parenthesized characters, s, m and w are abbreviations for "strong", "medium" and "weak", respectively.

Example 2

To a sufficiently dried 100 mL-volume eggplant-shaped flask containing a Teflon™-coated stirring bar, was added 5.94 g (30 mmol) of (±)-mevalonic lactone methacrylate prepared in Example 1, 5.04 g (30 mmol) of cyclohexyl methacrylate, 20 mL of dioxane and 1.48 g (9 mmol) of 2,2'-azobisisobutylonitrile (AIBN) as a polymerization initiator, and the content in the flask was stirred at 80° C. for 8 hours in a nitrogen atmosphere. After dilution with tetrahydrofuran (THF), the reaction solution was dropped to one liter of water-ethanol (1:1) solution containing a small amount of hydroquinone. The thus produced precipitate was filtered off on a glass filter, and dried at 0.1 mmHg and 45° C. for 16 hours. The obtained white powders were again dissolved in THF, and the above-mentioned steps of from precipitation to drying were twice repeated. The target copolymer, namely, copolymer of (±)-mevalonic lactone methacrylate and cyclohexyl methacrylate, as a white product was obtained at a yield of 69 g (70%).

The $^1$H NMR analysis of the thus produced copolymer indicated that the molar ratio of each monomeric component in the copolymer is 1:1. The transmittance of the copolymer at the wavelength of 248 nm, measured through a 1-$\mu$m thick coating on a quartz substrate, was 95%, evidencing excellent transparency. The results of other analysises are as follows:

Weight average molecular weight (Mw): 11,860 (polystyrene standard-equivalent).

Degree of polydispersion (Mw/Mn): 1.45.

IR (KRS-5, cm$^{-1}$): 2937, 1726, 1259, 1149 and 1112.

Example 3

To a sufficiently dried 100 mL-volume eggplant-shaped flask containing a Teflon™-coated stirring bar, was added 5.94 g (30 mmol) of (±)-mevalonic lactone methacrylate prepared in Example 1, 4.87 g (30 mmol) of p-acetoxystyrene, 20 mL of dioxane and 1.48 g (9 mmol) of 2,2'-azobisisobutylonitrile (AIBN), and the content in the flask was stirred at 80° C. for 8 hours in a nitrogen atmosphere. After dilution with tetrahydrofuran (THF), the reaction solution was dropped to one liter of water-methanol (1:1) solution containing a small amount of hydroquinone. The thus produced precipitate was filtered off on a glass filter, and dried at 0.1 mmHg and 45° C. for 16 hours. The obtained white powders were again dissolved in THF, and the above-mentioned steps of from precipitation to drying were twice repeated. The target copolymer, namely, copolymer of (±)-mevalonic lactone methacrylate and p-acetoxystyrene, as a white product was obtained at a yield of 7.78g (72%).

The $^1$H NMR analysis of the thus produced copolymer indicated that the molar ratio of each monomeric component in the copolymer is 1:1. The transmittance of the copolymer at the wavelength of 248 nm, determined through a 1-$\mu$m thick coating on a quartz substrate, was 75%, evidencing excellent transparency. The results of other analysises are as follows:

Weight average molecular weight (Mw): 7,620 (polystyrene standard-equivalent).

Degree of polydispersion (Mw/Mn): 1.41.

IR (KRS-5, cm$^{-1}$): 3193, 1751, 1726, 1218 and 1201.

Example 4

The copolymer prepared in Example 2 was dissolved in propyleneglycol methylether acetate to make a 17 wt. % solution thereof. Note that 8 wt. % of γ-butylolactone as an auxiliary solvent was also contained in said copolymer solution. Then, triphenylsulfonium trifluoromethane sulfonate as a photoacid generator (PAG) in an amount of 5 wt. % with regard to the copolymer was added and dissolved in the copolymer solution to make a resist solution. After it was filtered on a Teflon™ membrane filter having a thickness of 0.2 $\mu$m, the resist solution was spin-coated at 2,000 rpm on a silicon substrate which has been treated with HMDS to form a hydrophobic surface, and prebaked at 110° C. for 60 seconds to form a 0.7-$\mu$m thick resist coating. The resist coating was patternwise exposed on a KrF excimer laser stepper (commercially available from Nikon, NA=0.45). The exposed resist coating was developed with an aqueous solution of 2.38% tetramethylammonium hydroxide (TMAH), and rinsed for 60 seconds in a deionized water. The positive resist patterns were thus obtained. The resolution of the patterns was 0.3 $\mu$m line and space (L/S) at an exposure level of 40 mJ/cm$^2$.

The resist patterns were then evaluated with regard to the dry etching resistance, namely, resistance to Reactive Ion Etching (RIE). The plasma etching rates were determined by disposing the resist-coated silicon substrate in a parallel plate reactive ion etcher and conducting the argon (Ar) sputtering etching under the conditions: Rf power (P$\mu$) of 200W, pressure of 0.02 Torr and flow rate of Ar gas of 50 sccm. From the thickness of the retained resist patterns on the silicon substrate, it was observed that the resistance to RIE is comparable to that of the commercially available Novolak resist: Nagase Positive Resist NPR-820 (Nagase & Co.).

Example 5

The copolymer prepared in Example 3 was dissolved in ethyl lactate to make a 18 wt. % solution thereof. Then, triphenylsulfonium trifluoromethane sulfonate in an amount of 2 wt. % with regard to the copolymer was added and dissolved in the copolymer solution to make a resist solution. After it was filtered on a Teflon™ membrane filter having a thickness of 0.2 $\mu$m, the resist solution was spin-coated at 2,000 rpm on a silicon substrate which has been treated with HMDS, and prebaked at 110° C. for 60 seconds to form a 0.7-$\mu$m thick resist coating. The resist coating was patternwise exposed on a KrF excimer laser stepper (Nikon, NA=0.45). The exposed resist coating was developed with an aqueous solution of 2.38% tetramethylammonium hydroxide (TMAH), and rinsed for 60 seconds in a deionized water. The positive resist patterns were thus obtained. The resolution of the patterns was 0.3 $\mu$m L/S at an exposure level of 40 mJ/cm$^2$.

The resist patterns were then evaluated with regard to the resistance to RIE in accordance with the manner similar to that of Example 4. From the thickness of the retained resist patterns on the silicon substrate, it was observed that the resistance to RIE is comparable to that of Nagase Positive Resist NPR-820 (Nagase & Co.).

Example 6

The copolymer prepared in Example 2 was dissolved in ethyl lactate to make a 18 wt. % solution thereof. Then, diphenyliodonium trifluoromethane sulfonate as . photoacid generator (PAG) in an amount of 2 wt. % with regard to the copolymer was added and dissolved in the copolymer solution to make a resist solution. After it was filtered on a Teflon™ membrane filter having a thickness of 0.2 $\mu$m, the resist solution was spin-coated at 2,000 rpm on a silicon substrate which has been treated with HMDS, and prebaked at 110° C. for 60 seconds to form a 0.7-$\mu$m thick resist coating. The resist coating was patternwise exposed on a ArF excimer laser exposure system (commercially available from Nikon, NA=0.55). The exposed resist coating was developed with an aqueous solution of 2.38% tetramethylammonium hydroxide (TMAH), and rinsed for 60 seconds in a deionized water. The positive resist patterns were thus obtained. The resolution of the patterns was 0.2 μm L/S at an exposure level of 10 mJ/cm$^2$.

The resist patterns were then evaluated with regard to the resistance to RIE in accordance with the manner similar to that of Example 4. From the thickness of the retained resist patterns on the silicon substrate, it was observed that the resistance to RIE is comparable to that of Nagase Positive Resist NPR-820 (Nagase & Co.).

Example 7

To a sufficiently dried 200 mL-volume eggplant-shaped flask containing a Teflon™-coated stirring bar, was added 10 g (50.5 mmol) of (±)-mevalonic lactone methacrylate prepared in Example 1, 9.90 g (50.5 mmol) of norbornyl methacrylate, 33.7 mL of dioxane and 2.49 g (15.2 mmol) of 2,2'-azobisisobutylonitrile (AIBN), and the content in the flask was stirred at 80° C. for 8 hours in a nitrogen atmosphere. After dilution with tetrahydrofuran (THF), the reaction solution was dropped to 3L of water-methanol (1:1) solution containing a small amount of hydroquinone. The thus produced precipitate was filtered off on a glass filter, and dried at 0.1 mmHg and 45° C. for 16 hours. The obtained white powders were again dissolved in THF, and the above-mentioned steps of from precipitation to drying were twice repeated. The target copolymer, namely, copolymer of (±)-mevalonic lactone methacrylate and norbornyl methacrylate, as a white product was obtained at a yield of 14.33 g (72%).

The $^1$H NMR analysis of the thus produced copolymer indicated that the molar ratio of each monomeric component in the copolymer is 1:1. The transmittance of the copolymer at the wavelength of 248 nm, measured through a 1-μm thick coating on a quartz substrate, was 95%, evidencing excellent transparency. The results of other analysises are as follows:

Weight average molecular weight (Mw): 13,600 (polystyrene standard-equivalent).

Degree of polydispersion (Mw/Mn): 1.52.

IR (KRS-5, cm$^{-1}$): 2960, 1727, 1259 and 1148.

Example 8

To a sufficiently dried 200 mL-volume eggplant-shaped flask containing a Teflon™-coated stirring bar, was added 10 g (50.5 mmol) of (±)-mevalonic lactone methacrylate prepared in Example 1, 11.13 g (50.5 mmol) of adamantyl methacrylate, 33.7 mL of dioxane and 2.49 g (15.2 mmol) of 2,2'-azobisisobutylonitrile (AIBN), and the content in the flask was stirred at 80° C. for 8 hours in a nitrogen atmosphere. After dilution with tetrahydrofuran (THF), the reaction solution was dropped to 3L of water-methanol (1:1) solution containing a small amount of hydroquinone. The thus produced precipitate was filtered off on a glass filter, and dried at 0.1 mmHg and 45° C. for 16 hours. The obtained white powders were again dissolved in THF, and the above-mentioned steps of from precipitation to drying were twice repeated. The target copolymer, namely, copolymer of (±)-mevalonic lactone methacrylate and adamantyl methacrylate, as a white product was obtained at a yield of 15.85 g (75%).

The $^1$H NMR analysis of the thus produced copolymer indicated that the molar ratio of each monomeric component in the copolymer is 1:1. The transmittance of the copolymer at the wavelength of 248 nm, measured through a 1-μm thick coating on a quartz substrate, was 95%, evidencing excellent transparency. The results of other analysises are as follows:

Weight average molecular weight (Mw): 14,100 (polystyrene standard-equivalent).

Degree of polydispersion (Mw/Mn): 1.41.

IR (KRS-5, cm$^{-1}$): 2912, 1722, 1259 and 1093.

Example 9

The copolymer prepared in Example 7 was dissolved in ethyl lactate to make a 17 wt. % solution thereof. Then, triphenylsulfonium trifluoromethane sulfonate in an amount of 5 wt. % with regard to the copolymer was added and dissolved in the copolymer solution to make a resist solution. After it was filtered on a Teflon™ membrane filter having a thickness of 0.2 μm, the resist solution was spin-coated at 2,000 rpm on a silicon substrate which has been treated with HMDS, and prebaked at 120° C for 60 seconds to form a 0.7-μm thick resist coating. The resist coating was patternwise exposed on a KrF excimer laser stepper (Nikon, NA=0.45). The exposed resist coating was developed with an aqueous solution of 2.38% tetramethylammonium hydroxide (TMAH), and rinsed for 60 seconds in a deionized water. The positive resist patterns were thus obtained. The resolution of the patterns was 0.3 μm L/S at an exposure level of 38 mJ/cm$^2$.

Example 10

The copolymer prepared in Example 8 was dissolved in ethyl lactate to make a 17 wt. % solution thereof. Then, triphenylsulfonium trifluoromethane sulfonate in an amount of 5 wt. % with regard to the copolymer was added and dissolved in the copolymer solution to make a resist solution. After it was filtered on a Teflon™ membrane filter having a thickness of 0.2 μm, the resist solution was spin-coated at 2,000 rpm on a silicon substrate which has been treated with HMDS, and prebaked at 120° C. for 60 seconds to form a 0.7-μm thick resist coating. The resist coating was patternwise exposed on a KrF excimer laser stepper (Nikon, NA=0.45). After post-exposure baking (PEB) was made at 100° C. for 60 seconds, the exposed and baked resist coating was developed with an aqueous solution of 2.38% tetramethylammonium hydroxide (TMAH), and rinsed for 60 seconds in a deionized water. The positive resist patterns were thus obtained. The resolution of the patterns was 0.3 μm L/S at an exposure level of 30 mJ/cm$^2$.

Example 11

The copolymer prepared in Example 7 was dissolved in ethyl lactate to make a 17 wt. % solution thereof. Then, triphenylsulfonium trifluoromethane sulfonate in an amount of 2 wt. % with regard to the copolymer was added and dissolved in the copolymer solution to make a resist solution. After it was filtered on a Teflon™ membrane filter having a thickness of 0.2 μm, the resist solution was spin-coated at 2,000 rpm on a silicon substrate which has been treated with HMDS, and prebaked at 120° C. for 60 seconds to form a 0.7-μm thick resist coating. The resist coating was patternwise exposed on a KrF excimer laser stepper (Nikon, NA=0.45). After post-exposure baking (PEB) was made at 100° C. for 60 seconds, the exposed and baked resist coating was developed with an aqueous solution of 2.38% tetramethylammonium hydroxide (TMAH), and rinsed for 60 seconds in a deionized water. The positive resist patterns were thus obtained. The resolution of the patterns was 0.3 μm L/S at an exposure level of 20 mJ/cm$^2$.

Example 12

The copolymer prepared in Example 8 was dissolved in ethyl lactate to make a 17 wt. % solution thereof. Then, triphenylsulfonium trifluoromethane sulfonate in an amount of 2 wt. % with regard to the copolymer was added and dissolved in the copolymer solution to make a resist solution. After it was filtered on a Teflon™ membrane filter having a thickness of 0.2 µm, the resist solution was spin-coated at 2,000 rpm on a silicon substrate which has been treated with HMDS, and prebaked at 120° C. for 60 seconds to form a 0.7-µm thick resist coating. The resist coating was patternwise exposed on a KrF excimer laser stepper (Nikon, NA=0.45). After post-exposure baking (PEB) was made at 100° C. for 60 seconds, the exposed and baked resist coating was developed with an aqueous solution of 2.38% tetramethylammonium hydroxide (TMAH), and rinsed for 60 seconds in a deionized water. The positive resist patterns were thus obtained. The resolution of the patterns was 0.3 µm L/S at an exposure level of 23 mJ/cm$^2$.

Example 13

To a sufficiently dried 100 mL-volume eggplant-shaped flask containing a Teflon™ -coated stirring bar, was added 10 g (50.5 mmol) of (±)-mevalonic lactone methacrylate prepared in Example 1, 5.87 g (25 mmol) of 2-methyl-2-adamantyl methacrylate, 16.7 mL of dioxane and 1.23 g (9 mmol) of 2,2'-azobisisobutylonitrile (AIBN), and the content in the flask was stirred at 80° C. for 8 hours in a nitrogen atmosphere. After dilution with tetrahydrofuran (THF), the reaction solution was dropped to one liter of methanol containing a small amount of hydroquinone. The thus produced precipitate was filtered off on a glass filter, and dried at 0.1 mmHg and 45° C. for 16 hours. The obtained white powders were again dissolved in THF, and the above-mentioned steps of from precipitation to drying were twice repeated. The target copolymer, namely, copolymer of (±)-mevalonic lactone methacrylate and 2-methyl-2-adamantyl methacrylate (MLMA-MAdMA), as a white product was obtained at a yield of 7.44 g (68.7%).

The $^1$H NMR analysis of the thus produced copolymer indicated that the molar ratio of lactone component: adamantyl component in the copolymer is 46.5:53.5. The transmittance of the copolymer at the wavelengths of 248 nm and 193 nm, measured through a 1-µm thick coating on a quartz substrate, were 96% and 64%, respectively, both evidencing excellent transparency. The results of other analysises are as follows:

Weight average molecular weight (Mw): 13,900 (polystyrene standard-equivalent).

Degree of polydispersion (Mw/Mn): 1.78.

IR (KRS-5, cm$^{-1}$): 2914, 1724, 1259, 1147 and 1103.

Example 14

The copolymer prepared in Example 13 was dissolved in propyleneglycol methylether acetate to make a 19 wt. % solution thereof. Note that 8 wt. % of γ-butylolactone as an auxiliary solvent was also contained in said copolymer solution. Then, triphenylsulfonium trifluoromethane sulfonate in an amount of 5 wt. % with regard to the copolymer was added and dissolved in the copolymer solution to make a resist solution. After it was filtered on a Teflon™ membrane filter having a thickness of 0.2 µm, the resist solution was spin-coated at 2,000 rpm on a silicon substrate which has been treated with HMDS, and prebaked at 120° C. for 60 seconds to form a 0.7-µm thick resist coating. The resist coating was patternwise exposed on a KrF excimer laser stepper (Nikon, NA=0.45). After post-exposure baking (PEB) was made at 100° C. for 60 seconds, the exposed and baked resist coating was developed with an aqueous solution of 2.38% tetramethylammonium hydroxide (TMAH), and rinsed for 60 seconds in a deionized water. The positive resist patterns were thus obtained. The resolution of the patterns was 0.25 µm L/S at an exposure level of 8.3 mJ/cm$^2$.

The resist patterns were then evaluated with regard to the dry etching resistance, namely, resistance to RIE. The plasma etching rates were determined by disposing the resist-coated silicon substrate in a parallel plate reactive ion etcher and conducting the tetrafluorocarbon (CF$_4$) sputtering etching for 5 minutes under the conditions: Rf power (Pµ) of 200W, pressure of 0.02 Torr and flow rate of CF$_4$ gas of 100 sccm. The results (etching rate and its ratio to that of Nagase Positive Resist NPR-820) are summarized in the following table.

Further, for the comparison purpose, the above procedure was repeated by using as the resist material the commercially available Novolak resist: Nagase Positive Resist NPR-820 (Nagase & Co.) and poly(methylmethacrylate) (PMMA). The following results were obtained.

| resist | etching rate (Å/min) | rate ratio |
| --- | --- | --- |
| NPR-820 | 523 | 1.00 |
| PMMA | 790 | 1.51 |
| MLMA-MAdMA | 610 | 1.17 | rate ratio: a ratio of the etching rate of the tested resist to that of NPR-820

The results in the above table indicate that MLMA-MAdMA, i.e., resist according to the present invention, has the resistance to RIE which is comparable to that of Nagase Positive Resist NPR-820 and is remarkably excellent in comparison with that of PMMA.

Example 15

The copolymer prepared in Example 13 was dissolved in ethyl lactate to make a 18 wt. % solution thereof. Then, triphenylsulfonium trifluoromethane sulfonate in an amount of 5 wt. % with regard to the copolymer was added and dissolved in the copolymer solution to make a resist solution. After it was filtered on a Teflon™ membrane filter having a thickness of 0.2 µm, the resist solution was spin-coated at 2,000 rpm on a silicon substrate which has been treated with HMDS, and prebaked at 120° C. for 60 seconds to form a 0.7-µm thick resist coating. The resist coating was patternwise exposed on a KrF excimer laser stepper (Nikon, NA=0.45). After post-exposure baking (PEB) was made at 100° C. for 60 seconds, the exposed and baked resist coating was developed with an aqueous solution of 2.38% tetramethylammonium hydroxide (TMAH), and rinsed for 60 seconds in a deionized water. The positive resist patterns were thus obtained. The resolution of the patterns was 0.25 µm L/S at an exposure level of 7.4 mJ/cm$^2$.

The resist patterns were then evaluated with regard to the resistance to RIE in accordance with the manner similar to that of Example 14. It was observed from the test results that the tested MLMA-MADMA has the resistance to RIE which is comparable to that of Nagase Positive Resist NPR-820 and is remarkably excellent in comparison with that of PMMA.

Example 16

The copolymer prepared in Example 13 was dissolved in ethyl lactate to make a 18 wt. % solution thereof. Then, diphenyliodonium trifluoromethane sulfonate in an amount of 2 wt. % with regard to the copolymer was added and dissolved in the copolymer solution to make a resist solution. After it was filtered on a Teflon™ membrane filter having a thickness of 0.2 µm, the resist solution was spin-coated at 2,000 rpm on a silicon substrate which has been treated with HMDS, and prebaked at 120° C. for 60 seconds to form a 0.7-µm thick resist coating. The resist coating was patternwise exposed on a ArF excimer laser exposure system (Nikon, NA=0.55). After post-exposure baking (PEB) was made at 100° C. for 60 seconds, the exposed and baked resist coating was developed with an aqueous solution of 2.38% tetramethylammonium hydroxide (TMAH), and rinsed for 60 seconds in a deionized water. The positive resist patterns were thus obtained. The resolution of the patterns was 0.2 µm L/S at an exposure level of 6 mJ/cm$^2$.

The resist patterns were then evaluated with regard to the resistance to RIE in accordance with the manner similar to that of Example 14. It was observed from the test results that the tested MLMA-MAdMA has the resistance to RIE which is comparable to that of Nagase Positive Resist NPR-820 and is remarkably excellent in comparison with that of PMMA.

Example 17

2-methyl-2-adamantyl methacrylate and t-butyl acrylate in a ratio of 4:6 as starting monomers were charged into a polymerization container to make a 1,4-dioxane solution containing 2 mole/L of the monomers. After addition of 5 mole % of 2,2'-azobisisobutylonitrile (AIBN) as a polymerization initiator to the 1,4-dioxane solution, the monomers were polymerized at 80° C. for 8 hours. After completion of the polymerization, the polymerization product was purified by using n-hexane as a precipitant. The copolymer of 2-methyl-2-adamantyl methacrylate and t-butyl acrylate represented by the following formula was obtained.

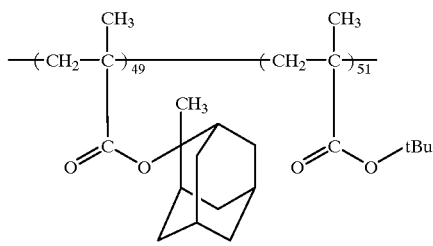

The resulting copolymer had a composition ratio (m:n) of 49:51, weight average molecular weight (Mw) of 6,890 (polystyrene standard-equivalent) and degree of polydispersion (Mw/Mn) of 1.89.

Example 18

Triphenylsulfonium hexafluoroantimonate as a photoacid generator (PAG) in an amount of 15 wt. % with regard to the copolymer was added to the copolymer of 2-methyl-2-adamantyl methacrylate and t-butyl acrylate prepared in Example 17, and the mixture was dissolved in cyclohexanone to make a resist solution. The resist solution was spin-coated at 2,000 rpm on a silicon substrate which has been treated with HMDS, and prebaked at 100° C. for 100 seconds on a hot plate to form a 0.7-µm thick resist coating.

After prebaking, the resist coating was selectively exposed to a pattern of laser light having a wavelength of 248 nm on a KrF excimer laser stepper (Nikon, NA=0.45). The exposed resist coating was then subjected to the post-exposure baking (PEB) at 130° C. for 60 seconds. The postbaked resist coating was developed with an aqueous solution of 0.27N tetramethylammonium hydroxide (TMAH) for 60 seconds, and rinsed for 30 seconds in a purified water. The positive resist patterns which correspond to the pattern of the laser light as an exposure source were thus obtained without peeling-off of the patterns from the substrate. In this example, a threshold energy Eth of the exposure dose was 21.2 mJ/cm$^2$, and the resolution of the patterns was 0.275 µm L/S.

Example 19

The procedure of Example 18 was repeated with the proviso that in the development step, the same concentration (0.27N) of tetrabutylammonium hydroxide (TBAH) was used as a developer in place of 0.27N tetramethylammonium hydroxide (TMAH). Satisfactory positive resist patterns comparable to those of Example 18 were obtained. The threshold energy Eth was 28.6 mJ/cm$^2$, and the resolution was 0.275 µm L/S.

Example 20

This example is a comparative example.

The procedures of Examples 17 and 18 were repeated. However, in this example, for the comparison purpose, the copolymer used as the resist material was a copolymer of adamantyl methacrylate and t-butyl acrylate represented by the following formula:

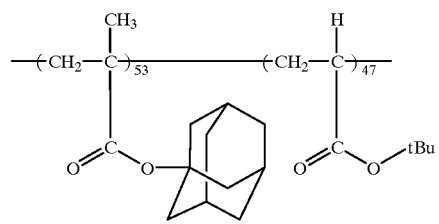

The above copolymer had a composition ratio (m:n) of 53:47, weight average molecular weight (Mw) of 3,830 (polystyrene standard-equivalent) and degree of polydispersion (Mw/Mn) of 2.1.

Using this copolymer, the resist process was carried out in accordance with the method described in Example 18, however, no resist pattern was formed on the silicon substrate.

Example 21

2-methyl-2-adamantyl acrylate as a starting monomer was charged into a polymerization container to make a toluene solution containing 2 mole/L of the monomer. After addition of 2 mole % of 2,2'-azobisisobutylonitrile (AIBN) to the toluene solution, the monomer was polymerized at 80° C. for 8 hours. After completion of the polymerization, the polymerization product was purified by using methanol as a precipitant. The polymer of 2-methyl-2-adamantyl acrylate represented by the following formula:

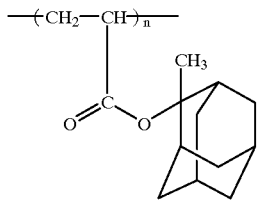

in which n represents a number of the repeating units necessary to obtain the desired molecular weight, was obtained.

The resulting polymer had a weight average molecular weight (Mw) of 8,950 (polystyrene standard-equivalent) and degree of polydispersion (Mw/Mn) of 1.8.

Example 22

Triphenylsulfonium hexafluoroantimonate in an amount of 15 wt. % with regard to the polymer was added to the polymer of 2-methyl-2-adamantyl acrylate prepared in Example 21, and the mixture was dissolved in cyclohexanone to make a resist solution. The resist solution was spin-coated at 2,000 rpm on a silicon substrate which has been treated with HMDS, and prebaked at 100° C. for 100 seconds on a hot plate to form a 0.7-μm thick resist coating.

After prebaking, the resist coating was selectively exposed to a pattern of laser light having a wavelength of 248 nm on a KrF excimer laser stepper (Nikon, NA=0.45). The exposed resist coating was then subjected to the post-exposure baking (PEB) at 130° C. for 60 seconds. The postbaked resist coating was developed with an aqueous solution of 0.27N tetramethylammonium hydroxide (TMAH) for 60 seconds, and rinsed for 30 seconds in a purified water. The positive resist patterns which correspond to the pattern of the laser light as an exposure source were thus obtained without peeling-off of the patterns from the substrate. In this example, a threshold energy Eth of the exposure dose was 32 mJ/cm$^2$, and the resolution of the patterns was 0.30 μm L/S.

Example 23

2-methyl-2-adamantyl methacrylate and 3-oxocyclohexyl methacrylate in a ratio of 4:6 as starting monomers were charged into a polymerization container to make a toluene solution containing 2 mole/L of the monomers. After addition of 5 mole % of 2,2'-azobisisobutylonitrile (AIBN) to the toluene solution, the monomers were polymerized at 80° C. for 8 hours. After completion of the polymerization, the polymerization product was purified by using methanol as a precipitant. The copolymer of 2-methyl-2-adamantyl methacrylate and 3-oxocyclohexyl methacrylate represented by the following formula was obtained.

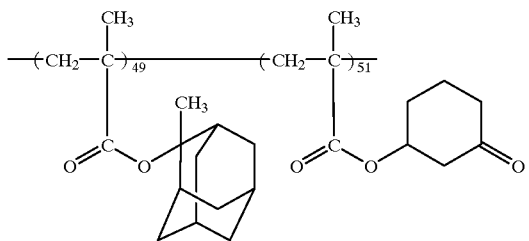

The resulting copolymer had a composition ratio (m:n) of 49:51, weight average molecular weight (Mw) of 14,400 (polystyrene standard-equivalent) and degree of polydispersion (Mw/Mn) of 2.30.

Example 24

Triphenylsulfonium hexafluoroantimonate in an amount of 5 wt. % with regard to the copolymer was added to the copolymer of 2-methyl-2-adamantyl methacrylate and 3-oxocyclohexyl methacrylate prepared in Example 23, and the mixture was dissolved in cyclohexanone to make a resist solution. The resist solution was spin-coated at 2,000 rpm on a silicon substrate which has been treated with HMDS, and prebaked at 100° C. for 100 seconds on a hot plate to form a 0.7-μm thick resist coating.

After prebaking, the resist coating was selectively exposed to a pattern of laser light having a wavelength of 248 nm on a KrF excimer laser stepper (Nikon, NA=0.45). The exposed resist coating was then subjected to the post-exposure baking (PER) at 150° C. for 60 seconds. The postbaked resist coating was developed with an aqueous solution of 0.27N tetramethylammonium hydroxide (TMAH) for 60 seconds, and rinsed for 30 seconds in a purified water. The positive resist patterns which correspond to the pattern of the laser light as an exposure source were thus obtained without peeling-off of the patterns from the substrate. In this example, a threshold energy Eth of the exposure dose was 9.6 mJ/cm$^2$, and the resolution of the patterns was 0.275 μm L/S.

Example 25

2-methyl-2-adamantyl methacrylate and 3-oxo-1,1-dimethylbutyl methacrylate in a ratio of 4:6 as starting monomers were charged into a polymerization container to make a 1,4-dioxane solution containing 2 mole/L of the monomers. After addition of 5 mole % of 2,2'-azobisisobutylonitrile (AIBN) to the 1,4-dioxane solution, the monomers were polymerized at 80° C. for 8 hours. After completion of the polymerization, the polymerization product was purified by using n-hexane as a precipitant. The copolymer of 2-methyl-2-adamantyl methacrylate and 3-oxo-1,1-dimethylbutyl methacrylate represented by the following formula was obtained.

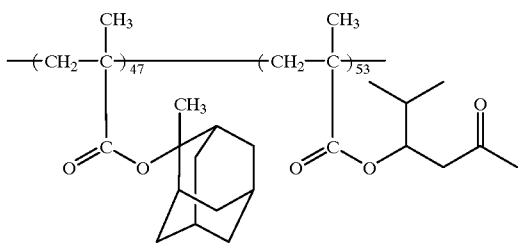

The resulting copolymer had a composition ratio (m:n) of 47:53, weight average molecular weight (Mw) of 7,420 (polystyrene standard-equivalent) and degree of polydispersion (Mw/Mn) of 2.40.

Example 26

Triphenylsulfonium hexafluoroantimonate in an amount of 5 wt. % with regard to the copolymer was added to the copolymer of 2-methyl-2-adamantyl methacrylate and 3-oxo-1,1-dimethylbutyl methacrylate prepared in Example 25, and the mixture was dissolved in cyclohexanone to make a resist solution. The resist solution was spin-coated at 2,000 rpm on a silicon substrate which has been treated with HMDS, and prebaked at 100° C. for 100 seconds on a hot plate to form a 0.7-μm thick resist coating.

After prebaking, the resist coating was selectively exposed to a pattern of laser light having a wavelength of 248 nm on a KrF excimer laser stepper (Nikon, NA=0.45). The exposed resist coating was then subjected to the post-exposure baking (PEB) at 130° C. for 60 seconds. The postbaked resist coating was developed with an aqueous solution of 0.27N tetramethylammonium hydroxide (TMAH) for 60 seconds, and rinsed for 30 seconds in a purified water. The positive resist patterns which correspond to the pattern of the laser light as an exposure source were thus obtained without peeling-off of the patterns from the substrate. In this example, a threshold energy Eth of the exposure dose was 32 mJ/cm$^2$, and the resolution of the patterns was 0.325 μm L/S.

Example 27

2-methyl-2-adamantyl methacrylate and 3-methacryloyloxymethylbutylate methacrylate in a ratio of 4:6 as starting monomers were charged into a polymerization container to make a 1,4-dioxane solution containing 2 mole/L of the monomers. After addition of 2 mole % of 2,2'-azobisisobutylonitrile (AIBN) to the 1,4-dioxane solution, the monomers were polymerized at 80° C. for 8 hours. After completion of the polymerization, the polymerization product was purified by using n-hexane as a precipitant. The copolymer of 2-methyl-2-adamantyl methacrylate and 3-methacryloyloxymethylbutylate methacrylate represented by the following formula was obtained.

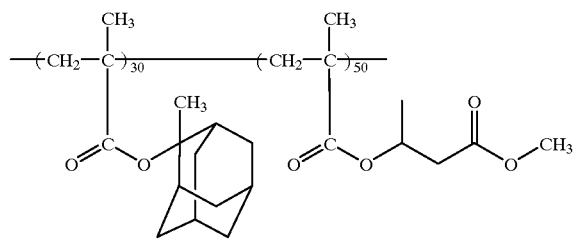

The resulting copolymer had a composition ratio (m:n) of 50:50, weight average molecular weight (Mw) of 12,090 (polystyrene standard-equivalent) and degree of polydispersion (Mw/Mn) of 1.95.

Example 28

Triphenylsulfonium hexafluoroantimonate in an amount of 15 wt. % with regard to the copolymer was added to the copolymer of 2-methyl-2-adamantyl methacrylate and 3-methacryloyloxymethylbutylate methacrylate prepared in Example 27, and the mixture was dissolved in cyclohexanone to make a resist solution. The resist solution was spin-coated at 2,000 rpm on a silicon substrate which has been treated with HMDS, and prebaked at 100° C. for 100 seconds on a hot plate to form a 0.7-μm thick resist coating.

After prebaking, the resist coating was selectively exposed to a pattern of laser light having a wavelength of 248 nm on a KrF excimer laser stepper (Nikon, NA=0.45). The exposed resist coating was then subjected to the post-exposure baking (PEB) at 130° C. for 60 seconds. The postbaked resist coating was developed with an aqueous solution of 0.27N tetramethylammonium hydroxide (TMAH) for 60 seconds, and rinsed for 30 seconds in a purified water. The positive resist patterns which correspond to the pattern of the laser light as an exposure source were thus obtained without peeling-off of the patterns from the substrate. In this example, a threshold energy Eth of the exposure dose was 29 mJ/cm$^2$, and the resolution of the patterns was 0.30 μm L/S.

Example 29

The procedure of Example 27 was repeated with the proviso that 3-methacryloyloxymethylbutylate methacrylate as the starting monomer was replaced with 2-hydroxyethyl methacrylate. The copolymer of 2-methyl-2-adamantyl methacrylate and 2-hydroxyethyl methacrylate represented by the following formula was obtained.

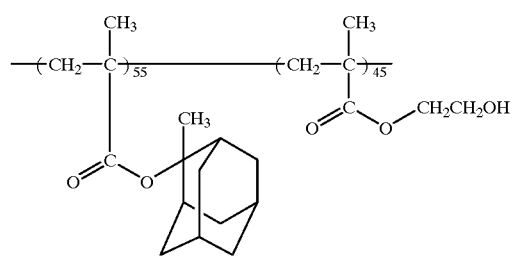

The resulting copolymer had a composition ratio (m:n) of 55:45, weight average molecular weight (Mw) of 11,520 (polystyrene standard-equivalent) and degree of polydispersion (Mw/Mn) of 2.38.

Using this copolymer as the resist material, resist patterns were produced in accordance with the manner similar to that of Example 28.

Triphenylsulfonium hexafluoroantimonate in an amount of 15 wt. % with regard to the copolymer was added to the copolymer of 2-methyl-2-adamantyl methacrylate and 2-hydroxyethyl methacrylate, and the mixture was dissolved in cyclohexanone to make a resist solution. The resist solution was spin-coated at 2,000 rpm on a silicon substrate which has been treated with HMDS, and prebaked at 100° C. for 100 seconds on a hot plate to form a 0.7-μm thick resist coating.

After prebaking, the resist coating was selectively exposed to a pattern of laser light having a wavelength of 248 nm on a KrF excimer laser stepper (Nikon, NA=0.45). The exposed resist coating was then subjected to the post-exposure baking (PEB) at 130° C. for 60 seconds. The postbaked resist coating was developed with an aqueous solution of 0.27N tetramethylammonium hydroxide (TMAH) for 60 seconds, and rinsed for 30 seconds in a purified water. The positive resist patterns which correspond to the pattern of the laser light as an exposure source were thus obtained without peeling-off of the patterns from the substrate. In this example, a threshold energy Eth of the exposure dose was 12 mJ/cm$^2$, and the resolution of the patterns was 0.325 μm L/S.

Example 30

2-methylcyclohexyl methacrylate and 3-oxocyclohexyl methacrylate in a ratio of 4:6 as starting monomers were charged into a polymerization container to make a toluene solution containing 2 mole/L of the monomers. After addition of 5 mole % of 2,2'-azobisisobutylonitrile (AIBN) to the toluene solution, the monomers were polymerized at 80° C. for 8 hours. After completion of the polymerization, the polymerization product was purified by using methanol as a precipitant. The copolymer of 2-methylcyclohexyl methacrylate and 3-oxocyclohexyl methacrylate represented by the following formula was obtained.

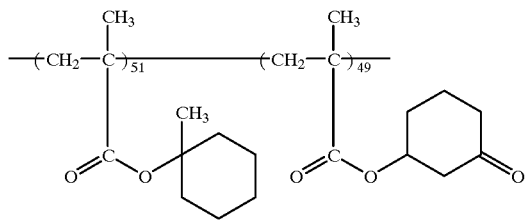

The resulting copolymer had a composition ratio (m:n) of 51:49, weight average molecular weight (Mw) of 7,115 (polystyrene standard-equivalent) and degree of polydispersion (Mw/Mn) of 1.9.

Example 31

Triphenylsulfonium hexafluoroantimonate in an amount of 5 wt. % with regard to the copolymer was added to the copolymer of 2-methylcyclohexyl methacrylate and 3-oxocyclohexyl methacrylate prepared in Example 30, and the mixture was dissolved in cyclohexanone to make a resist solution. The resist solution was spin-coated at 2,000 rpm on a silicon substrate which has been treated with HMDS, and prebaked at 100° C. for 100 seconds on a hot plate to form a 0.7-μm thick resist coating.

After prebaking, the resist coating was selectively exposed to a pattern of laser light having a wavelength of 248 nm on a KrF excimer laser stepper (Nikon, NA=0.45). The exposed resist coating was then subjected to the post-exposure baking (PEB) at 130° C. for 60 seconds. The postbaked resist coating was developed with an aqueous solution of 0.27N tetramethylammonium hydroxide (TMAH) for 60 seconds, and rinsed for 30 seconds in a purified water. The positive resist patterns which correspond to the pattern of the laser light as an exposure source were thus obtained without peeling-off of the patterns from the substrate. In this example, a threshold energy Eth of the exposure dose was 7.2 mJ/cm$^2$, and the resolution of the patterns was 0.275 μm L/S Example 32

2-oxocyclohexylmethylcyclohexylsulfonium trifluorosulfonate of the following formula:

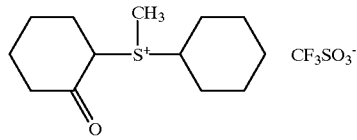

as a photoacid generator (PAG) in an amount of 5 wt. % with regard to the copolymer was added to the copolymer of 2-methyl-2-adamantyl methacrylate and 3-oxocyclohexyl methacrylate prepared in Example 23, and the mixture was dissolved in cyclohexanone to make a resist solution. The resist solution was spin-coated at 2,000 rpm on a silicon substrate which has been treated with HMDS, and prebaked at 100° C. for 100 seconds on a hot plate to form a 0.7-μm thick resist coating.

After prebaking, the resist coating was selectively exposed to a pattern of laser light having a wavelength of 193 nm on a ArF excimer laser exposure system (Nikon, NA=0.55). The exposed resist coating was then subjected to the post-exposure baking (PEB) at 130° C. for 60 seconds. The postbaked resist coating was developed with an aqueous solution of 0.27N tetramethylammonium hydroxide (TMAH) for 60 seconds, and rinsed for 30 seconds in a purified water. The positive resist patterns which correspond to the pattern of the laser light as an exposure source were thus obtained without peeling-off of the patterns from the substrate. In this example, a threshold energy Eth of the exposure dose was 6 mJ/cm$^2$, and the resolution of the patterns was 0.20 μm L/S.

Example 33

Triphenylsulfonium hexafluoroantimonate in an amount of 2 wt. % with regard to the copolymer was added to the copolymer of 2-methyl-2-adamantyl methacrylate and p-vinylphenol represented by the following formula:

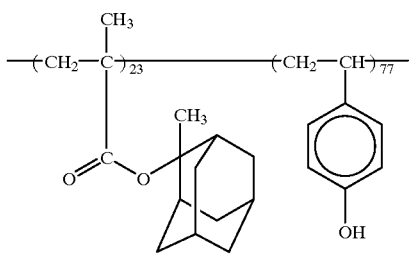

and having a composition ratio (m:n) of 23:77, weight average molecular weight (Mw) of 6,480 (polystyrene standard-equivalent) and degree of polydispersion (Mw/Mn) of 3.1, and the mixture was dissolved in cyclohexanone to make a resist solution. The resist solution was spin-coated at 2,000 rpm on a silicon substrate which has been treated with HMDS, and prebaked at 100° C. for 100 seconds on a hot plate to form a 0.7-μm thick resist coating.

After prebaking, the resist coating was selectively exposed to a pattern of laser light having a wavelength of 248 nm on a KrF excimer laser stepper (Nikon, NA=0.45). The exposed resist coating was then subjected to the post-exposure baking (PEB) at 130° C. for 60 seconds. The postbaked resist coating was developed with an aqueous solution of 0.27N tetramethylammonium hydroxide (TMAH) for 60 seconds, and rinsed for 30 seconds in a purified water. The positive resist patterns which correspond to the pattern of the laser light as an exposure source were thus obtained without peeling-off of the patterns from the substrate. In this example, a threshold energy Eth of the exposure dose was 82 mJ/cm$^2$, and the resolution of the patterns was 0.325 μm L/S.

Example 34

The polymer of 2-methyl-2-adamantyl acrylate, produced in Example 21, having a weight average molecular weight (Mw) of 8,950 (polystyrene standard-equivalent) and degree of polydispersion (Mw/Mn) of 1.8 in an amount of 20 wt. % with regard to the total amount of the polymers was added to poly(vinyl phenol) represented by the following formula:

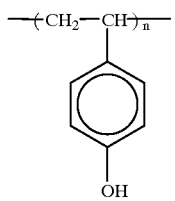

and having a weight average molecular weight (Mw) of 5,150 (polystyrene standard-equivalent) and degree of polydispersion (Mw/Mn) of 2.8, followed by addition of triphenylsulfonium hexafluoroantimonate in an amount of 5 wt. % with regard to the total amount of the polymers. The resulting mixture was dissolved in cyclohexanone to make a resist solution. The resist solution was spin-coated at 2,000 rpm on a silicon substrate which has been treated with HMDS, and prebaked at 100° C. for 100 seconds on a hot plate to form a 0.7-μm thick resist coating.

After prebaking, the resist coating was selectively exposed to a pattern of laser light having a wavelength of 248 nm on a KrF excimer laser stepper (Nikon, NA=0.45). The exposed resist coating was then subjected to the post-exposure baking (PEB) at 110° C. for 60 seconds. The postbaked resist coating was developed with an aqueous solution of 0.27N tetramethylammonium hydroxide (TMAH) for 60 seconds, and rinsed for 30 seconds in a purified water. The positive resist patterns which correspond to the pattern of the laser light as an exposure source were thus obtained without peeling-off of the patterns from the substrate. In this example, a threshold energy Eth of the exposure dose was 8.9 mJ/cm$^2$, and the resolution of the patterns was 0.325 μm L/S.

Example 35

The adamantyl compound, 1-adamantyl carboxylate 2-methyladamantylester of the following formula:

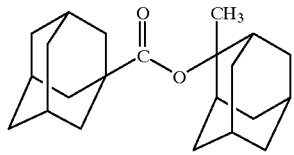

in an amount of 30 wt. % with regard to the total amount of the mixture was added to poly(vinyl phenol) which is the same as that used in Example 34 and has a weight average molecular weight (Mw) of 5,150 (polystyrene standard-equivalent) and degree of polydispersion (Mw/Mn) of 2.8, followed by addition of triphenylsulfonium hexafluoroantimonate in an amount of 5 wt. % with regard to the total amount of the mixture. The resulting mixture was dissolved in cyclohexanone to make a resist solution. The resist solution was spin-coated at 2,000 rpm on a silicon substrate which has been treated with HMDS, and prebaked at 100° C. for 100 seconds on a hot plate to form a 0.7-μm thick resist coating.

After prebaking, the resist coating was selectively exposed to a pattern of laser light having a wavelength of 248 nm on a KrF excimer laser stepper (Nikon, NA=0.45). The exposed resist coating was then subjected to the post-exposure baking (PEB) at 110° C. for 60 seconds. The postbaked resist coating was developed with an aqueous solution of 0.27N tetramethylammonium hydroxide (TMAH) for 60 seconds, and rinsed for 30 seconds in a purified water. The positive resist patterns which correspond to the pattern of the laser light as an exposure source were thus obtained without peeling-off of the patterns from the substrate. In this example, a threshold energy Eth of the exposure dose was 11 mJ/cm$^2$, and the resolution of the patterns was 0.35 μm L/S.

Example 36

The copolymer represented by the following formula was prepared in accordance with the manner described in the above examples.

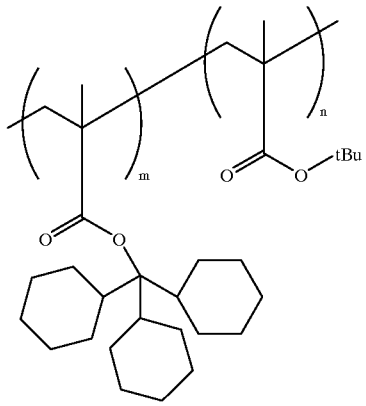

The resulting copolymer had a composition ratio (m:n) of 5:5 and weight average molecular weight (Mw) of 23,000 (polystyrene standard-equivalent).

Using this copolymer as the resist material, resist patterns were produced in accordance with the manner described in the above examples.

Triphenylsulfonium triflate (TPSSO$_3$CF$_3$) as a photoacid generator (PAG) in an amount of 2 wt. % with regard to the copolymer was added to the above-mentioned copolymer, and the mixture was dissolved in ethyl lactate (EL) to make a resist solution containing the copolymer at a concentration of 15 wt. %. The resist solution was spin-coated at 2,000 rpm on a silicon substrate which has been treated with HMDS, and prebaked at 100° C. for 60 seconds on a hot plate to form a 1.0-μm thick resist coating.

After prebaking, the resist coating was selectively exposed to a pattern of laser light having a wavelength of 193 nm on a ArF excimer laser exposure system (Nikon, NA=0.55). The exposed resist coating was then subjected to the post-exposure baking (PEB) at 150° C. for 60 seconds. The postbaked resist coating was developed with an alkaline developer, NMD-3 commercially available from Tokyo Ohka Kogyo Co., Ltd., for 60 seconds, and rinsed for 30 seconds in a purified water. The positive resist patterns which correspond to the pattern of the exposure mask used were thus obtained without cracking and peeling-off of the patterns from the substrate. In this example, the resolution of the patterns was 0.50 μm L/S.

Example 37

This example is a comparative example.

The procedure of Example 36 was repeated. However, in this example, for the comparison purpose, the copolymer as the resist material was replaced with the copolymer which is represented by the following formula:

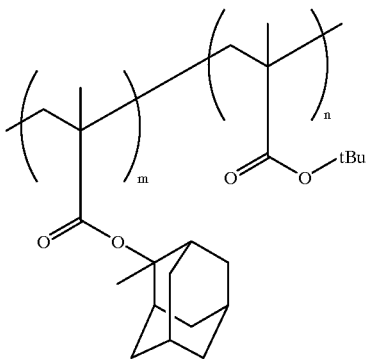

and has a composition ratio (m:n) of 5:5 and weight average molecular weight (Mw) of 14,000 (polystyrene standard-equivalent).

The positive resist patterns which correspond to the pattern of the exposure mask used were thus obtained with a resolution of the patterns of 0.50 μm L/S, however, cracking was resulted in the peripheral portion of the patterns.

Example 38

The procedure of Example 36 was repeated with the proviso that, in this example, the copolymer as the resist material was replaced with the copolymer which is represented by the following formula:

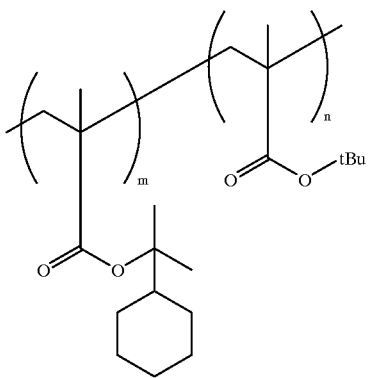

and has a composition ratio (m:n) of 5:5 and weight average molecular weight (Mw) of 18,000 (polystyrene standard-equivalent).

The positive resist patterns which correspond to the pattern of the exposure mask used were thus obtained without cracking and peeling-off of the patterns from the substrate. In this example, the resolution of the patterns was 0.50 μm L/S.

Example 39

The procedure of Example 36 was repeated with the proviso that, in this example, the copolymer as the resist material was replaced with the copolymer which is represented by the following formula:

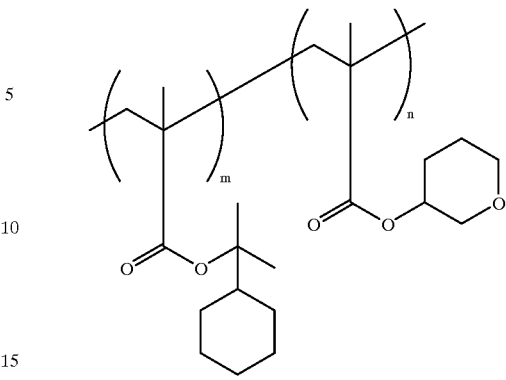

and has a composition ratio (m:n) of 5:5 and weight average molecular weight (Mw) of 11,000 (polystrene standard-equivalent).

The positive resist patterns which correspond to the pattern of the exposure mask used were thus obtained without cracking and peeling-off of the patterns from the substrate. In this example, the resolution of the patterns was 0.50 μm L/S.

Example 40

The procedure of Example 36 was repeated with the proviso that, in this example, the copolymer as the resist material was replaced with the copolymer which is represented by the following formula:

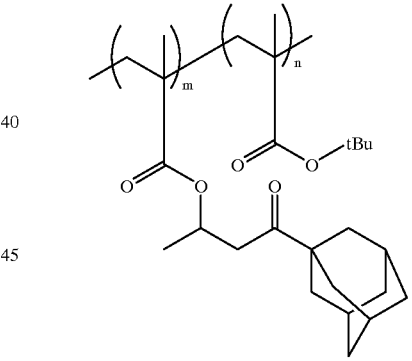

and has a composition ratio (m:n) of 5:5 and weight average molecular weight (Mw) of 8,000 (polystyrene standard-equivalent).

The positive resist patterns which correspond to the pattern of the exposure mask used were thus obtained without cracking and peeling-off of the patterns from the substrate. In this example, the resolution of the patterns was 0.50 μm L/S.

Example 41

The procedure of Example 36 was repeated with the proviso that, in this example, the copolymer as the resist material was replaced with the copolymer which is represented by the following formula:

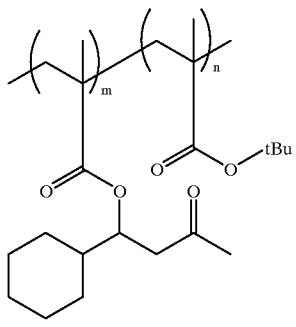

and has a composition ratio (m:n) of 5:5 and weight average molecular weight (Mw) of 9,000 (polystyrene standard-equivalent).

The positive resist patterns which correspond to the pattern of the exposure mask used were thus obtained without cracking and peeling-off of the patterns from the substrate. In this example, the resolution of the patterns was 0.50 µm L/S.

Example 42

The procedure of Example 36 was repeated with the proviso that, in this example, the copolymer as the resist material was replaced with the copolymer which is represented by the following formula:

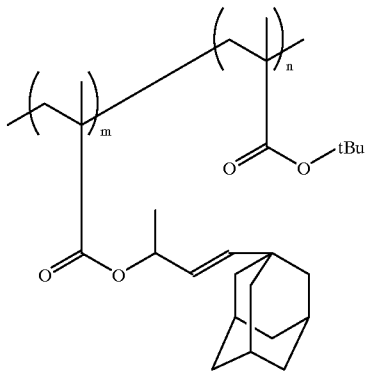

and has a composition ratio (m:n) of 5:5 and weight average molecular weight (Mw) of 7,800 (polystyrene standard-equivalent).

The positive resist patterns which correspond to the pattern of the exposure mask used were thus obtained without cracking and peeling-off of the patterns from the substrate. In this example, the resolution of the patterns was 0.50 µm L/S.

Example 43

The procedure of Example 36 was repeated with the proviso that, in this example, the copolymer as the resist material was replaced with the copolymer which is represented by the following formula:

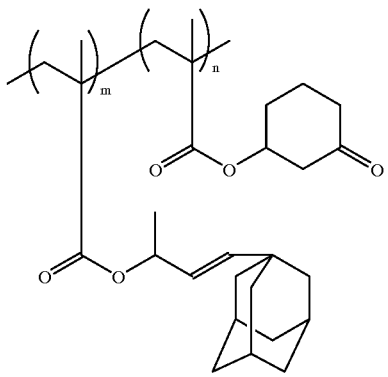

and has a composition ratio (m:n) of 5:5 and weight average molecular weight (Mw) of 6,500 (polystyrene standard-equivalent).

The positive resist patterns which correspond to the pattern of the exposure mask used were thus obtained without cracking and peeling-off of the patterns from the substrate. In this example, the resolution of the patterns was 0.50 µm L/S.

Example 44

The procedure of Example 36 was repeated with the proviso that, in this example, the copolymer as the resist material was replaced with the copolymer which is represented by the following formula:

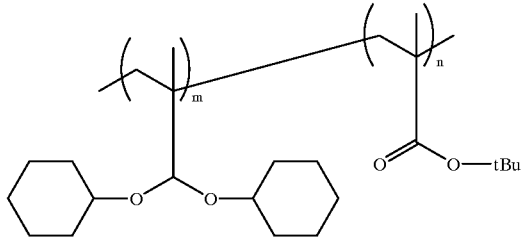

and has a composition ratio (m:n) of 5:5 and weight average molecular weight (Mw) of 16,000 (polystyrene standard-equivalent).

The positive resist patterns which correspond to the pattern of the exposure mask used were thus obtained without cracking and peeling-off of the patterns from the substrate. In this example, the resolution of the patterns was 0.60 µm L/S.

Example 45

The procedure of Example 36 was repeated with the proviso that, in this example, the copolymer as the resist material was replaced with the copolymer which is represented by the following formula:

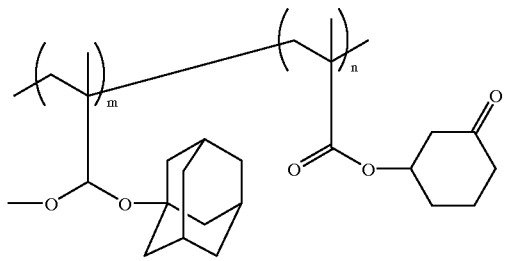

and has a composition ratio (m:n) of 5:5 and weight average molecular weight (Mw) of 12,500 (polystyrene standard-equivalent).

The positive resist patterns which correspond to the pattern of the exposure mask used were thus obtained without cracking and peeling-off of the patterns from the substrate. In this example, the resolution of the patterns was 0.50 μm L/S.

Example 46

The procedure of Example 36 was repeated with the proviso that, in this example, the copolymer as the resist material was replaced with the copolymer which is represented by the following formula:

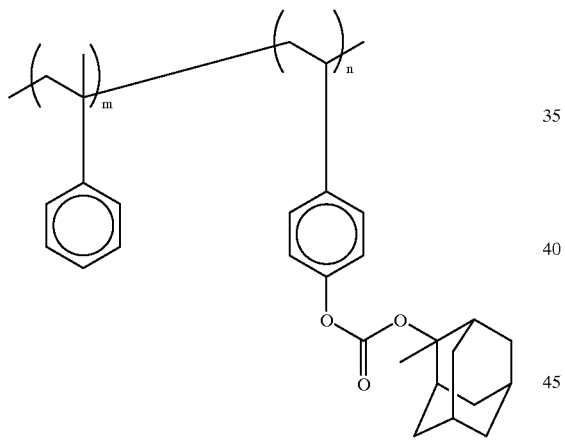

and has a composition ratio (m:n) of 5:5 and weight average molecular weight (Mw) of 18,000 (polystyrene standard-equivalent), and a deep UV contact aligner as an exposure system was used in place of the ArF excimer laser exposure system.

The positive resist patterns which correspond to the pattern of the exposure mask used were thus obtained without cracking and peeling-off of the patterns from the substrate. In this example, the resolution of the patterns was 0.50 μm L/S.

Example 47

The procedure of Example 36 was repeated with the proviso that, in this example, the copolymer as the resist material was replaced with the copolymer which is represented by the following formula:

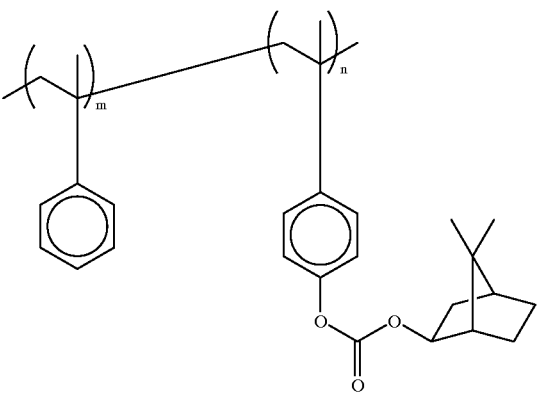

and has a composition ratio (m:n) of 5:5 and weight average molecular weight (Mw) of 17,500 (polystyrene standard-equivalent), and a deep UV contact aligner as an exposure system was used in place of the ArF excimer laser exposure system.

The positive resist patterns which correspond to the pattern of the exposure mask used were thus obtained without cracking and peeling-off of the patterns from the substrate. In this example, the resolution of the patterns was 0.55 μm L/S.

Example 48

The procedure of Example 36 was repeated with the proviso that, in this example, the copolymer as the resist material was replaced with the copolymer which is represented by the following formula:

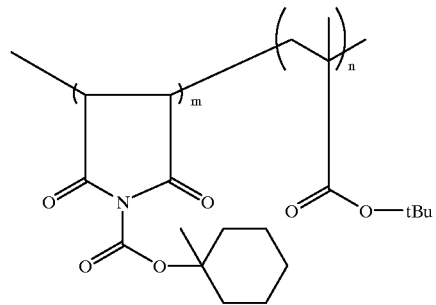

and has a composition ratio (m:n) of 5:5 and weight average molecular weight (Mw) of 9,500 (polystyrene standard-equivalent).

The positive resist patterns which correspond to the pattern of the exposure mask used were thus obtained without cracking and peeling-off of the patterns from the substrate. In this example, the resolution of the patterns was 0.60 μm L/S.

Example 49

2-methyl-2-adamantyl methacrylate and methacrylic acid in a ratio of 7:3 as starting monomers were charged into a polymerization container to make a 1,4-dioxane solution containing 1 mole/L of the monomers. After addition of 20 mole % of 2,2'-azobisisobutylonitrile (AIBN) to the 1,4-dioxane solution, the monomers were polymerized at 80° C. for 8 hours. After completion of the polymerization, the polymerization product was purified by using n-hexane as a precipitant. The copolymer of 2-methyl-2-adamantyl methacrylate and methacrylic acid represented by the following formula was obtained.

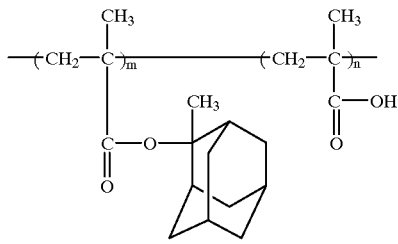

The resulting copolymer had a composition ratio (m:n) of 7:3, weight average molecular weight (Mw) of 8,500 (polystyrene standard-equivalent) and degree of polydispersion (Mw/Mn) of 2.10.

Example 50

Triphenylsulfonium triflate (TPSSO$_3$CF$_3$) as a photoacid generator (PAG) in an amount of 2 wt. % with regard to the copolymer was added to the copolymer of 2-methyl-2-adamantyl methacrylate and methacrylic acid prepared in Example 49, and the mixture was dissolved in propyleneglycol monomethyletheracetate (PGMEA) to make a resist solution. The resist solution was spin-coated at 2,000 rpm on a silicon substrate which has been treated with HMDS, and prebaked at 120° C. for 60 seconds on a hot plate to form a 0.4-μm thick resist coating.

After prebaking, the resist coating was selectively exposed to a pattern of laser light having a wavelength of 195 nm on a ArF excimer laser exposure system (Nikon, NA=0.55). The exposed resist coating was then subjected to the post-exposure baking (PEB) at 150° C. for 60 seconds. The postbaked resist coating was developed with an aqueous solution of 0.118 wt. % tetramethylammonium hydroxide (TMAH) for 60 seconds, and rinsed for 30 seconds in a purified water. The positive resist patterns which correspond to the pattern of the laser light as an exposure source were thus obtained without peeling-off of the patterns from the substrate. In this example, a threshold energy Eth of the exposure dose was 21.5 mJ/cm$^2$, and the resolution of the patterns was 0.175 μm L/S.

Example 51

The procedure of Example 50 was repeated with the proviso that, in this example, a KrF excimer laser stepper (Nikon, NA=0.45) was used to produce a pattern of laser light having a wavelength of 248 nm, in place of the ArF excimer laser exposure system. The positive resist patterns which correspond to the pattern of the laser light as an exposure source were thus obtained without peeling-off of the patterns from the substrate. In this example, a threshold energy Eth of the exposure dose was 1.48 mJ/cm$^2$, and the resolution of the patterns was 0.275 μm L/S.

Example 52

2-methyl-2-adamantyl methacrylate, t-butyl methacrylate and methacrylic acid in a ratio of 8:7:5 as starting monomers were charged into a polymerization container to make a 1,4-dioxane solution containing 1 mole/L of the monomers. After addition of 20 mole % of 2,2'-azobisisobutylonitrile (AIBN) to the 1,4-dioxane solution, the monomers were polymerized at 80° C. for 8 hours. After completion of the polymerization, the polymerization product was purified by using n-hexane as a precipitant. The copolymer of 2-methyl-2-adamantyl methacrylate, t-butyl methacrylate and methacrylic acid represented by the following formula was obtained.

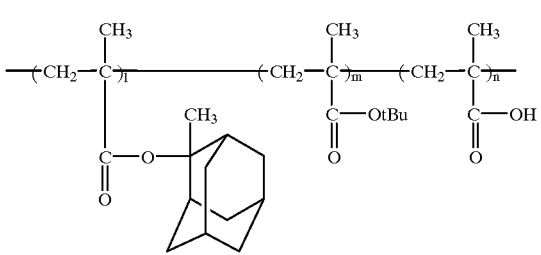

The resulting copolymer had a composition ratio (l:m:n) of 50:29:21, weight average molecular weight (Mw) of 7,800 (polystyrene standard-equivalent) and degree of polydispersion (Mw/Mn) of 2.20.

Example 53

Triphenylsulfonium triflate (TPSSO$_3$CF$_3$) as a photoacid generator (PAG) in an amount of 2 wt. % with regard to the copolymer was added to the copolymer of 2-methyl-2-adamantyl methacrylate, t-butyl methacrylate and methacrylic acid prepared in Example 52, and the mixture was dissolved in propyleneglycol monomethyletheracetate (PGMEA) to make a resist solution. The resist solution was spin-coated at 2,000 rpm on a silicon substrate which has been treated with HMDS, and prebaked at 120° C. for 60 seconds on a hot plate to form a 0.4-μm thick resist coating.

After prebaking, the resist coating was selectively exposed to a pattern of laser light having a wavelength of 195 nm on a ArF excimer laser exposure system (Nikon, NA=0.55). The exposed resist coating was then subjected to the post-exposure baking (PEB) at 150° C. for 60 seconds. The postbaked resist coating was developed with an aqueous solution of 0.118 wt. % tetramethylammonium hydroxide (TMAH) for 60 seconds, and rinsed for 30 seconds in a purified water. The positive resist patterns which correspond to the pattern of the laser light as an exposure source were thus obtained without peeling-off of the patterns from the substrate.

In this example, a threshold energy Eth of the exposure dose was 1.4 mJ/cm$^2$, and the resolution of the patterns was 0.170 μm L/S.

Example 54

The procedure of Example 53 was repeated with the proviso that, in this example, a KrF excimer laser stepper (Nikon, NA=0.45) was used to produce a pattern of laser light having a wavelength of 248 nm, in place of the ArF excimer laser exposure system. The positive resist patterns which correspond to the pattern of the laser light as an exposure source were thus obtained without peeling-off of the patterns from the substrate.

In this example, a threshold energy Eth of the exposure dose was 14.4 mJ/cm$^2$, and the resolution of the patterns was 0.250 μm L/S.

Example 55

2-methyl-2-adamantyl methacrylate and itaconic acid in a ratio of 9:1 as starting monomers were charged into a polymerization container to make a 1,4-dioxane solution containing 1 mole/L of the monomers. After addition of mole % of 2,2'-azobisisobutylonitrile (AIBN) to the 1,4-dioxane solution, the monomers were polymerized at 80° C. for 8 hours. After completion of the polymerization, the polymerization product was purified by using n-hexane as a precipitant. The copolymer of 2-methyl-2-adamantyl methacrylate and itaconic acid represented by the following formula was obtained.

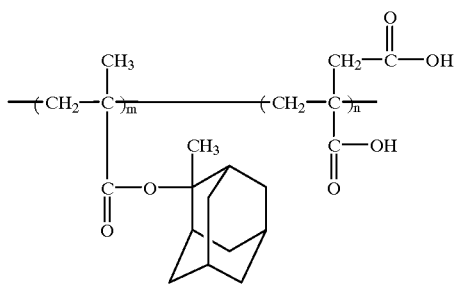

The resulting copolymer had a composition ratio (m:n) of 88:12, weight average molecular weight (Mw) of 6,700 (polystyrene standard-equivalent) and degree of polydispersion (Mw/Mn) of 2.18.

Example 56

Triphenylsulfonium triflate ($TPSSO_3CF_3$) as a photoacid generator (PAG) in an amount of 2 wt. % with regard to the copolymer was added to the copolymer of 2-methyl-2-adamantyl methacrylate and itaconic acid prepared in Example 55, and the mixture was dissolved in ethyl lactate (EL) to make a resist solution. The resist solution was spin-coated at 2,000 rpm on a silicon substrate which has been treated with HMDS, and prebaked at 120° C. for 60 seconds on a hot plate to form a 0.4-$\mu$m thick resist coating.

After prebaking, the resist coating was selectively exposed to a pattern of laser light having a wavelength of 195 nm on a ArF excimer laser exposure system (Nikon, NA=0.55). The exposed resist coating was then subjected to the post-exposure baking (PEB) at 150° C. for 60 seconds. The postbaked resist coating was developed with an aqueous solution of 0.118 wt. % tetramethylammonium hydroxide (TMAH) for 60 seconds, and rinsed for 30 seconds in a purified water. The positive resist patterns which correspond to the pattern of the laser light as an exposure source were thus obtained without peeling-off of the patterns from the substrate. In this example, a threshold energy Eth of the exposure dose was 2.8 mJ/cm$^2$, and the resolution of the patterns was 0.175 $\mu$m L/S.

Example 57

The procedure of Example 56 was repeated with the proviso that, in this example, a KrF excimer laser stepper (Nikon, NA=0.45) was used to produce a pattern of laser light having a wavelength of 248 nm, in place of the ArF excimer laser exposure system. The positive resist patterns which correspond to the pattern of the laser light as an exposure source were thus obtained without peeling-off of the patterns from the substrate. In this example, a threshold energy Eth of the exposure dose was 25.0 mJ/cm$^2$, and the resolution of the patterns was 0.275 $\mu$m L/S.

Example 58

2-methyl-2-adamantyl methacrylate and vinylbenzenesulfonic acid in a ratio of 8:2 as starting monomers were charged into a polymerization container to make a 1,4-dioxane solution containing 1 mole/L of the monomers. After addition of 20 mole % of 2,2'-azobisisobutylonitrile (AIBN) to the 1,4-dioxane solution, the monomers were polymerized at 80° C. for 8 hours. After completion of the polymerization, the polymerization product was purified by using n-hexane as a precipitant. The copolymer of 2-methyl-2-adamantyl methacrylate and vinylbenzenesulfonic acid represented by the following formula was obtained.

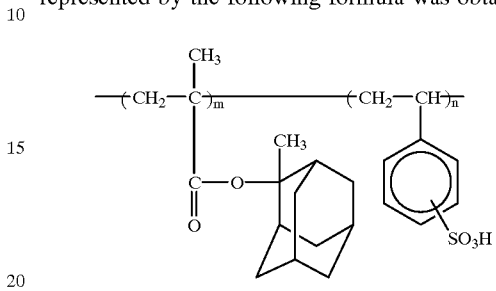

The resulting copolymer had a composition ratio (m:n) of 76:24, weight average molecular weight (Mw) of 6,400 (polystyrene standard-equivalent) and degree of polydispersion (Mw/Mn) of 2.42.

Example 59

Triphenylsulfonium triflate ($TPSSO_3CF_3$) as a photoacid generator (PAG) in an amount of 2 wt. % with regard to the copolymer was added to the copolymer of 2-methyl-2-adamantyl methacrylate and vinylbenzenesulfonic acid prepared in Example 58, and the mixture was dissolved in ethyl lactate (EL) to make a resist solution. The resist solution was spin-coated at 2,000 rpm on a silicon substrate which has been treated with HMDS, and prebaked at 120° C. for 60 seconds on a hot plate to form a 0.4-$\mu$m thick resist coating.

After prebaking, the resist coating was selectively exposed to a pattern of laser light having a wavelength of 248 nm on a KrF excimer laser stepper (Nikon, NA=0.45). The exposed resist coating was then subjected to the post-exposure baking (PEB) at 150° C. for 60 seconds. The postbaked resist coating was developed with an aqueous solution of 0.236 wt. % tetramethylammonium hydroxide (TMAH) for 60 seconds, and rinsed for 30 seconds in a purified water. The positive resist patterns which correspond to the pattern of the laser light as an exposure source were thus obtained without peeling-off of the patterns from the substrate. In this example, a threshold energy Eth of the exposure dose was 12.4 mJ/cm$^2$, and the resolution of the patterns was 0.250 $\mu$m L/S.

Example 60

2-methyl-2-adamantyl methacrylate and methacrylic amide in a ratio of 7:3 as starting monomers were charged into a polymerization container to make a 1,4-dioxane solution containing 1 mole/L of the monomers. After addition of 20 mole % of 2,2'-azobisisobutylonitrile (AIBN) to the 1,4-dioxane solution, the monomers were polymerized at 80° C. for 8 hours. After completion of the polymerization, the polymerization product was purified by using n-hexane as a precipitant. The copolymer of 2-methyl-2-adamantyl methacrylate and methacrylic amide represented by the following formula was obtained.

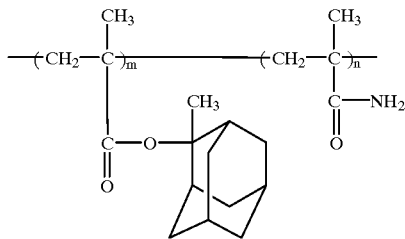 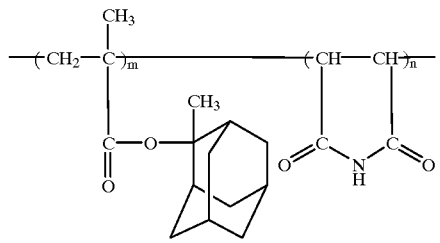

The resulting copolymer had a composition ratio (m:n) of 75:25, weight average molecular weight (Mw) of 7,600 (polystyrene standard-equivalent) and degree of polydispersion (Mw/Mn) of 2.13.

The resulting copolymer had a composition ratio (m:n) of 71:29, weight average molecular weight (Mw) of 8,200 (polystyrene standard-equivalent) and degree of polydispersion (Mw/Mn) of 2.55.

Example 61

Triphenylsulfonium triflate (TPSSO$_3$CF$_3$) as a photoacid generator (PAG) in an amount of 2 wt. % with regard to the copolymer was added to the copolymer of 2-methyl-2-adamantyl methacrylate and methacrylic amide prepared in Example 60, and the mixture was dissolved in ethyl lactate (EL) to make a resist solution. The resist solution was spin-coated at 2,000 rpm on a silicon substrate which has been treated with HMDS, and prebaked at 120° C. for 60 seconds on a hot plate to form a 0.4-μm thick resist coating.

After prebaking, the resist coating was selectively exposed to a pattern of laser light having a wavelength of 248 nm on a KrF excimer laser stepper (Nikon, NA=0.45). The exposed resist coating was then subjected to the post-exposure baking (PEB) at 150° C. for 60 seconds. The postbaked resist coating was developed with an aqueous solution of 0.236 wt. % tetramethylammonium hydroxide (TMAH) for 60 seconds, and rinsed for 30 seconds in a purified water. The positive resist patterns which correspond to the pattern of the laser light as an exposure source were thus obtained without peeling-off of the patterns from the substrate. In this example, a threshold energy Eth of the exposure dose was 24.0 mJ/cm$^2$, and the resolution of the patterns was 0.275 μm L/S.

Example 62

2-methyl-2-adamantyl methacrylate and maleimide in a ratio of 7:3 as starting monomers were charged into a polymerization container to make a 1,4-dioxane solution containing 1 mole/L of the monomers. After addition of 20 mole % of 2,2'-azobisisobutylonitrile (AIBN) to the 1,4-dioxane solution, the monomers were polymerized at 80° C. for 8 hours. After completion of the polymerization, the polymerization product was purified by using n-hexane as a precipitant. The copolymer of 2-methyl-2-adamantyl methacrylate and maleimide represented by the following formula was obtained.

Example 63

Triphenylsulfonium triflate (TPSSO$_3$CF$_3$) as a photoacid generator (PAG) in an amount of 2 wt. % with regard to the copolymer was added to the copolymer of 2-methyl-2-adamantyl methacrylate and maleimide prepared in Example 62, and the mixture was dissolved in ethyl lactate (EL) to make a resist solution. The resist solution was spin-coated at 2,000 rpm on a silicon substrate which has been treated with HMDS, and prebaked at 120° C. for 60 seconds on a hot plate to form a 0.4-μm thick resist coating.

After prebaking, the resist coating was selectively exposed to a pattern of laser light having a wavelength of 248 nm on a KrF excimer laser stepper (Nikon, NA=0.45). The exposed resist coating was then subjected to the post-exposure baking (PEB) at 150° C. for 60 seconds. The postbaked resist coating was developed with an aqueous solution of 0.236 wt. % tetramethylammonium hydroxide (TMAH) for 60 seconds, and rinsed for 30 seconds in a purified water. The positive resist patterns which correspond to the pattern of the laser light as an exposure source were thus obtained without peeling-off of the patterns from the substrate. In this example, a threshold energy Eth of the exposure dose was 30.0 mJ/cm$^2$, and the resolution of the patterns was 0.275 μm L/S.

Example 64

2-methyl-2-adamantyl methacrylate and anhydrous itaconic acid in a ratio of 8:2 as starting monomers were charged into a polymerization container to make a 1,4-dioxane solution containing 1 mole/L of the monomers. After addition of 20 mole % of 2,2'-azobisisobutylonitrile (AIBN) to the 1,4-dioxane solution, the monomers were polymerized at 80° C. for 8 hours. After completion of the polymerization, the polymerization product was purified by using n-hexane as a precipitant. The copolymer of 2-methyl-2-adamantyl methacrylate and maleimide represented by the following formula was obtained.

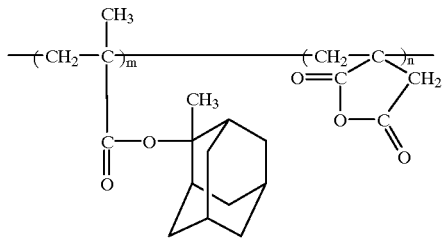

The resulting copolymer had a composition ratio (m:n) of 72:28, weight average molecular weight (Mw) of 8,700 (polystyrene standard-equivalent) and degree of polydispersion (Mw/Mn) of 2.31.

Example 65

Triphenylsulfonium triflate (TPSSO$_3$CF$_3$) as a photoacid generator (PAG) in an amount of 2 wt. % with regard to the copolymer was added to the copolymer of 2-methyl-2-adamantyl methacrylate and anhydrous itaconic acid prepared in Example 64, and the mixture was dissolved in ethyl lactate (EL) to make a resist solution. The resist solution was spin-coated at 2,000 rpm on a silicon substrate which has been treated with HMDS, and prebaked at 120° C. for 60 seconds on a hot plate to form a 0.4-μm thick resist coating.

After prebaking, the resist coating was selectively exposed to a pattern of laser light having a wavelength of 248 nm on a KrF excimer laser stepper (Nikon, NA=0.45). The exposed resist coating was then subjected to the post-exposure baking (PEB) at 150° C. for 60 seconds. The postbaked resist coating was developed with an aqueous solution of 0.118 wt. % tetramethylammonium hydroxide (TMAH) for 60 seconds, and rinsed for 30 seconds in a purified water. The positive resist patterns which correspond to the pattern of the laser light as an exposure source were thus obtained without peeling-off of the patterns from the substrate. In this example, a threshold energy Eth of the exposure dose was 26.1 mJ/cm$^2$, and the resolution of the patterns was 0.275 μm L/S.

Example 66

2-methyl-2-adamantyl methacrylate and α-acrylic acid-(R)-(+)-β, β-dimethyl-γ-butylolactone in a ratio of 7:3 as starting monomers were charged into a polymerization container to make a 1,4-dioxane solution containing 1 mole/L of the monomers. After addition of 20 mole % of 2,2'-azobisisobutylonitrile (AIBN) to the 1,4-dioxane solution, the monomers were polymerized at 80° C. for 8 hours. After completion of the polymerization, the polymerization product was purified by using n-hexane as a precipitant. The copolymer of 2-methyl-2-adamantyl methacrylate and α-acrylic acid-(R)-(+)-β, β-dimethyl-γ-butylolactone represented by the following formula was obtained.

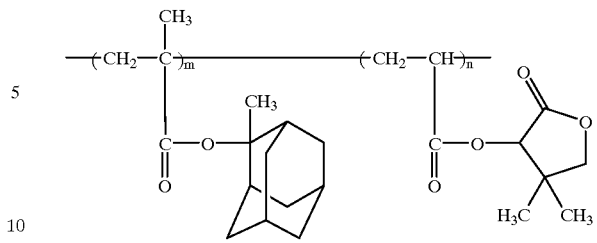

The resulting copolymer had a composition ratio (m:n) of 74:26, weight average molecular weight (Mw) of 6,200 (polystyrene standard-equivalent) and degree of polydispersion (Mw/Mn) of 2.25.

Example 67

Triphenylsulfonium triflate (TPSSO$_3$CF$_3$) as a photoacid generator (PAG) in an amount of 2 wt. % with regard to the copolymer was added to the copolymer of 2-methyl-2-adamantyl methacrylate and a-acrylic acid-(R)-(+)-β, β-dimethyl-γ-butylolactone prepared in Example 66, and the mixture was dissolved in ethyl lactate (EL) to make a resist solution. The resist solution was spin-coated at 2,000 rpm on a silicon substrate which has been treated with HMDS, and prebaked at 120° C. for 60 seconds on a hot plate to form a 0.4-μm thick resist coating.

After prebaking, the resist coating was selectively exposed to a pattern of laser light having a wavelength of 193 nm on a ArF excimer laser exposure system (Nikon, NA=0.55). The exposed resist coating was then subjected to the post-exposure baking (PEB) at 150° C. for 60 seconds. The postbaked resist coating was developed with an aqueous solution of 2.38 wt. % tetramethylammonium hydroxide (TMAH) for 60 seconds, and rinsed for 30 seconds in a purified water. The positive resist patterns which correspond to the pattern of the laser light as an exposure source were thus obtained without peeling-off of the patterns from the substrate. In this example, a threshold energy Eth of the exposure dose was 1.9 mJ/cm$^2$, and the resolution of the patterns was 0.170 μm L/S.

Example 68

The procedure of Example 67 was repeated with the proviso that, in this example, a KrF excimer laser stepper (Nikon, NA=0.45) was used to produce a pattern of laser light having a wavelength of 248 nm, in place of the ArF excimer laser exposure system. The positive resist patterns which correspond to the pattern of the laser light as an exposure source were thus obtained without peeling-off of the patterns from the substrate. In this example, a threshold energy Eth of the exposure dose was 15.0 mJ/cm$^2$, and the resolution of the patterns was 0.250 μm L/S.

Example 69

2-methyl-2-adamantyl methacrylate and vinylhydroxyloxime in a ratio of 4:6 as starting monomers were charged into a polymerization container to make a 1,4-dioxane solution containing 1 mole/L of the monomers. After addition of 20 mole % of 2,2'-azobisisobutylonitrile (AIBN) to the 1,4-dioxane solution, the monomers were polymerized at 80° C. for 8 hours. After completion of the polymerization, the polymerization product was purified by using n-hexane as a precipitant. The copolymer of 2-methyl-2-adamantyl methacrylate and vinylhydroxyloxime represented by the following formula was obtained.

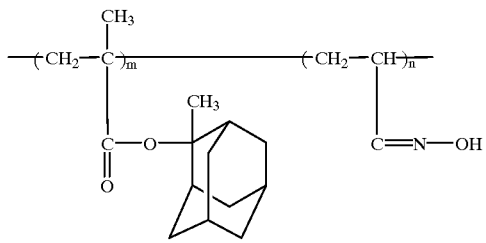

The resulting copolymer had a composition ratio (m:n) of 66:44, weight average molecular weight (Mw) of 6,200 (polystyrene standard-equivalent) and degree of polydispersion (Mw/Mn) of 2.08.

Example 70

Triphenylsulfonium triflate (TPSSO$_3$CF$_3$) as a photoacid generator (PAG) in an amount of 2 wt. % with regard to the copolymer was added to the copolymer of 2-methyl-2-adamantyl methacrylate and vinylhydroxyloxime prepared in Example 69, and the mixture was dissolved in ethyl lactate (EL) to make a resist solution. The resist solution was spin-coated at 2,000 rpm on a silicon substrate which has been treated with HMDS, and prebaked at 120° C. for 60 seconds on a hot plate to form a 0.4-μm thick resist coating.

After prebaking, the resist coating was selectively exposed to a pattern of laser light having a wavelength of 248 nm on a KrF excimer laser stepper (Nikon, NA=0.45). The exposed resist coating was then subjected to the post-exposure baking (PEB) at 150° C. for 60 seconds. The postbaked resist coating was developed with an aqueous solution of 2.38 wt. % tetramethylammonium hydroxide (TMAH) for 60 seconds, and rinsed for 30 seconds in a purified water. The positive resist patterns which correspond to the pattern of the laser light as an exposure source were thus obtained without peeling-off of the patterns from the substrate. In this example, a threshold energy Eth of the exposure dose was 34.0 mJ/cm$^2$, and the resolution of the patterns was 0.275 μm L/S.

Example 71

2-methyl-2-adamantyl methacrylate and vinylcarbonate in a ratio of 1:9 as starting monomers were charged into a polymerization container to make a 1,4-dioxane solution containing 1 mole/L of the monomers. After addition of 20 mole % of 2,2'-azobisisobutylonitrile (AIBN) to the 1,4-dioxane solution, the monomers were polymerized at 80° C. for 8 hours. After completion of the polymerization, the polymerization product was purified by using n-hexane as a precipitant. The copolymer of 2-methyl-2-adamantyl methacrylate and vinylcarbonate represented by the following formula was obtained.

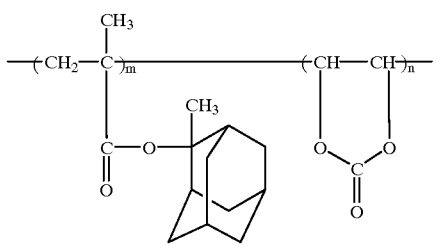

The resulting copolymer had a composition ratio (m:n) of 82:18, weight average molecular weight (Mw) of 9,300 (polystyrene standard-equivalent) and degree of polydispersion (Mw/Mn) of 1.99.

Example 72

Triphenylsulfonium triflate (TPSSO$_3$CF$_3$) as a photoacid generator (PAG) in an amount of 2 wt. % with regard to the copolymer was added to the copolymer of 2-methyl-2-adamantyl methacrylate and vinylcarbonate prepared in Example 71, and the mixture was dissolved in ethyl lactate (EL) to make a resist solution. The resist solution was spin-coated at 2,000 rpm on a silicon substrate which has been treated with HMDS, and prebaked at 120° C. for 60 seconds on a hot plate to form a 0.4-μm thick resist coating.

After prebaking, the resist coating was selectively exposed to a pattern of laser light having a wavelength of 248 nm on a KrF excimer laser stepper (Nikon, NA=0.45). The exposed resist coating was then subjected to the post-exposure baking (PEB) at 150° C. for 60 seconds. The postbaked resist coating was developed with an aqueous solution of 2.38 wt. % tetramethylammonium hydroxide (TMAH) for 60 seconds, and rinsed for 30 seconds in a purified water. The positive resist patterns which correspond to the pattern of the laser light as an exposure source were thus obtained without peeling-off of the patterns from the substrate. In this example, a threshold energy Eth of the exposure dose was 31.0 mJ/cm$^2$, and the resolution of the patterns was 0.275 μm L/S.

Example 73

2-methyl-2-adamantyl methacrylate and vinylazalactone in a ratio of 7:3 as starting monomers were charged into a polymerization container to make a 1,4-dioxane solution containing 1 mole/L of the monomers.

After addition of 20 mole % of 2,2'-azobisisobutylonitrile (AIBN) to the 1,4-dioxane solution, the monomers were polymerized at 80° C. for 8 hours. After completion of the polymerization, the polymerization product was purified by using n-hexane as a precipitant. The copolymer of 2-methyl-2-adamantyl methacrylate and vinylazalactone represented by the following formula was obtained.

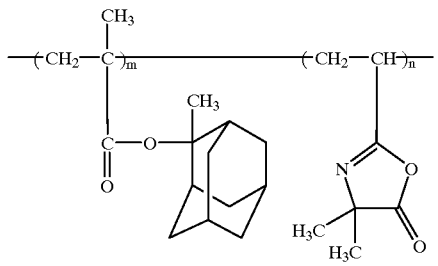

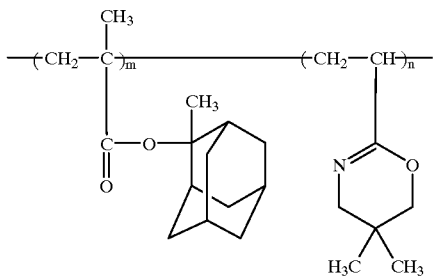

The resulting copolymer had a composition ratio (m:n) of 71:29, weight average molecular weight (Mw) of 10,200 (polystyrene standard-equivalent) and degree of polydispersion (Mw/Mn) of 1.61.

Example 74

Triphenylsulfonium triflate (TPSSO$_3$CF$_3$) as a photoacid generator (PAG) in an amount of 2 wt. % with regard to the copolymer was added to the copolymer of 2-methyl-2-adamantyl methacrylate and vinylazalactone prepared in Example 73, and the mixture was dissolved in ethyl lactate (EL) to make a resist solution. The resist solution was spin-coated at 2,000 rpm on a silicon substrate which has been treated with HMDS, and prebaked at 120° C. for 60 seconds on a hot plate to form a 0.4-μm thick resist coating.

After prebaking, the resist coating was selectively exposed to a pattern of laser light having a wavelength of 248 nm on a KrF excimer laser stepper (Nikon, NA=0.45). The exposed resist coating was then subjected to the post-exposure baking (PEB) at 150° C. for 60 seconds. The postbaked resist coating was developed with an aqueous solution of 0.118 wt. % tetramethylammonium hydroxide (TMAH) for 60 seconds, and rinsed for 30 seconds in a purified water. The positive resist patterns which correspond to the pattern of the laser light as an exposure source were thus obtained without peeling-off of the patterns from the substrate. In this example, a threshold energy Eth of the exposure dose was 28.2 mJ/cm$^2$, and the resolution of the patterns was 0.250 μm L/S.

Example 75

2-methyl-2-adamantyl methacrylate and vinyloxazine in a ratio of 7:3 as starting monomers were charged into a polymerization container to make a 1,4-dioxane solution containing 1 mole/L of the monomers. After addition of 20 mole % of 2,2'-azobisisobutylonitrile (AIBN) to the 1,4-dioxane solution, the monomers were polymerized at 80° C. for 8 hours. After completion of the polymerization, the polymerization product was purified by using n-hexane as a precipitant. The copolymer of 2-methyl-2-adamantyl methacrylate and vinyloxazine represented by the following formula was obtained.

The resulting copolymer had a composition ratio (m:n) of 70:30, weight average molecular weight (Mw) of 11,000 (polystyrene standard-equivalent) and degree of polydispersion (Mw/Mn) of 1.59.

Example 76

Triphenylsulfonium triflate (TPSSO$_3$CF$_3$) as a Photoacid generator (PAG) in an amount of 2 wt. % with regard to the copolymer was added to the copolymer of 2-methyl-2-adamantyl methacrylate and vinyloxazine prepared in Example 75, and the mixture was dissolved in ethyl lactate (EL) to make a resist solution. The resist solution was spin-coated at 2,000 rpm on a silicon substrate which has been treated with HMDS, and prebaked at 120° C. for 60 seconds on a hot plate to form a 0.4-μm thick resist coating.

After prebaking, the resist coating was selectively exposed to a pattern of laser light having a wavelength of 248 nm on a KrF excimer laser stepper (Nikon, NA=0.45). The exposed resist coating was then subjected to the Post-exposure baking (PEB) at 150° C. for 60 seconds. The postbaked resist coating was developed with an aqueous solution of 0.118 wt. % tetramethylammonium hydroxide (TMAH) for 60 seconds, and rinsed for 30 seconds in a purified water. The positive resist patterns which correspond to the pattern of the laser light as an exposure source were thus obtained without peeling-off of the patterns from the substrate. In this example, a threshold energy Eth of the exposure dose was 27.5 mJ/cm$^2$, and the resolution of the patterns was 0.250 μm L/S.

Example 77

2-methyl-2-adamantyl methacrylate and vinylpyrrolidone in a ratio of 7:3 as starting monomers were charged into a polymerization container to make a 1,4-dioxane solution containing 1 mole/L of the monomers. After addition of 20 mole % of 2,2'-azobisisobutylonitrile (AIBN) to the 1,4-dioxane solution, the monomers were polymerized at 80° C. for 8 hours. After completion of the polymerization, the polymerization product was purified by using n-hexane as a precipitant. The copolymer of 2-methyl-2-adamantyl methacrylate and vinylpyrrolidone represented by the following formula was obtained.

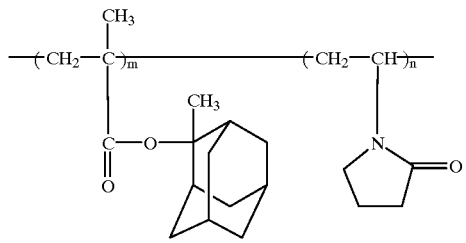

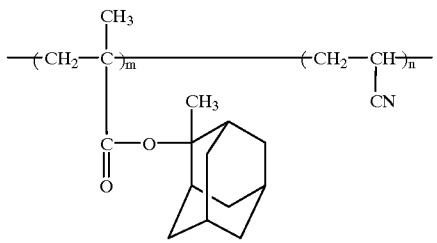

The resulting copolymer had a composition ratio (m:n) of 68:32, weight average molecular weight (Mw) of 9,000 (polystyrene standard-equivalent) and degree of polydispersion (Mw/Mn) of 1.89.

The resulting copolymer had a composition ratio (m:n) of 80:20, weight average molecular weight (Mw) of 6,000 (polystyrene standard-equivalent) and degree of polydispersion (Mw/Mn) of 2.35.

Example 78

Triphenylsulfonium triflate (TPSSO$_3$CF$_3$) as a photoacid generator (PAG) in an amount of 2 wt. % with regard to the copolymer was added to the copolymer of 2-methyl-2-adamantyl methacrylate and vinylpyrrolidone prepared in Example 77, and the mixture was dissolved in ethyl lactate (EL) to make a resist solution. The resist solution was spin-coated at 2,000 rpm on a silicon substrate which has been treated with HMDS, and prebaked at 120° C. for 60 seconds on a hot plate to form a 0.4-$\mu$m thick resist coating.

After prebaking, the resist coating was selectively exposed to a pattern of laser light having a wavelength of 248 nm on a KrF excimer laser stepper (Nikon, NA=0.45). The exposed resist coating was then subjected to the post-exposure baking (PEB) at 150° C. for 60 seconds. The postbaked resist coating was developed with an aqueous solution of 0.118 wt. % tetramethylammonium hydroxide (TMAH) for 60 seconds, and rinsed for 30 seconds in a purified water. The positive resist patterns which correspond to the pattern of the laser light as an exposure source were thus obtained without peeling-off of the patterns from the substrate. In this example, a threshold energy Eth of the exposure dose was 30.5 mJ/cm$^2$, and the resolution of the patterns was 0.275 $\mu$m L/S.

Example 79

2-methyl-2-adamantyl methacrylate and acrylonitrile in a ratio of 1:1 as starting monomers were charged into a polymerization container to make a 1,4-dioxane solution containing 1 mole/L of the monomers. After addition of 20 mole % of 2,2'-azobisisobutylonitrile (AIBN) to the 1,4-dioxane solution, the monomers were polymerized at 80° C. for 8 hours. After completion of the polymerization, the polymerization product was purified by using n-hexane as a precipitant. The copolymer of 2-methyl-2-adamantyl methacrylate and acrylonitrile represented by the following formula was obtained.

Example 80

Triphenylsulfonium triflate (TPSSO$_3$CF$_3$) as a photoacid generator (PAG) in an amount of 2 wt. % with regard to the copolymer was added to the copolymer of 2-methyl-2-adamantyl methacrylate and acrylonitrile prepared in Example 79, and the mixture was dissolved in cyclohexanone to make a resist solution. The resist solution was spin-coated at 2,000 rpm on a silicon substrate which has been treated with HMDS, and prebaked at 120° C. for 60 seconds on a hot plate to form a 0.4-$\mu$m thick resist coating.

After prebaking, the resist coating was selectively exposed to a pattern of laser light having a wavelength of 248 nm on a KrF excimer laser stepper (Nikon, NA=0.45). The exposed resist coating was then subjected to the post-exposure baking (PEB) at 150° C. for 60 seconds. The postbaked resist coating was developed with an aqueous solution of 2.38 wt. % tetramethylammonium hydroxide (TMAH) for 60 seconds, and rinsed for 30 seconds in a purified water. The positive resist patterns which correspond to the pattern of the laser light as an exposure source were thus obtained without peeling-off of the patterns from the substrate. In this example, a threshold energy Eth of the exposure dose was 38.2 mJ/cm$^2$, and the resolution of the patterns was 0.275 $\mu$m L/S.

Example 81

2-methyl-2-adamantyl methacrylate and nitrostyrene in a ratio of 1:1 as starting monomers were charged into a polymerization container to make a 1,4-dioxane solution containing 1 mole/L of the monomers. After addition of 20 mole % of 2,2'-azobisisobutylonitrile (AIBN) to the 1,4-dioxane solution, the monomers were polymerized at 80° C. for 8 hours. After completion of the polymerization, the polymerization product was purified by using n-hexane as a precipitant. The copolymer of 2-methyl-2-adamantyl methacrylate and nitrostyrene represented by the following formula was obtained.

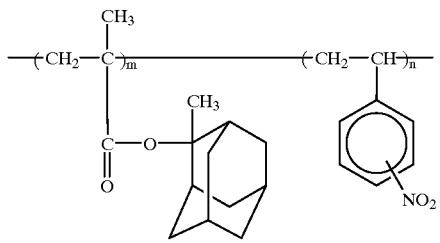
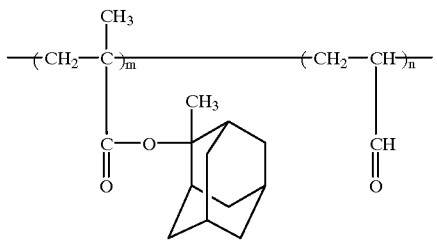

The resulting copolymer had a composition ratio (m:n) of 74:26, weight average molecular weight (Mw) of 14,000 (polystyrene standard-equivalent) and degree of polydispersion (Mw/Mn) of 1.79.

Example 82

Triphenylsulfonium triflate ($TPSSO_3CF_3$) as a photoacid generator (PAG) in an amount of 2 wt. % with regard to the copolymer was added to the copolymer of 2-methyl-2-adamantyl methacrylate and nitrostyrene prepared in Example 81, and the mixture was dissolved in cyclohexanone to make a resist solution. The resist solution was spin-coated at 2,000 rpm on a silicon substrate which has been treated with HMDS, and prebaked at 120° C. for 60 seconds on a hot plate to form a 0.4-μm thick resist coating.

After prebaking, the resist coating was selectively exposed to a pattern of laser light having a wavelength of 248 nm on a KrF excimer laser stepper (Nikon, NA=0.45). The exposed resist coating was then subjected to the post-exposure baking (PEB) at 150° C. for 60 seconds. The postbaked resist coating was developed with an aqueous solution of 2.38 wt. % tetramethylammonium hydroxide (TMAH) for 60 seconds, and rinsed for 30 seconds in a purified water. The positive resist patterns which correspond to the pattern of the laser light as an exposure source were thus obtained without peeling-off of the patterns from the substrate. In this example, a threshold energy Eth of the exposure dose was 37.5 mJ/cm$^2$, and the resolution of the patterns was 0.275 μm L/S.

Example 83

2-methyl-2-adamantyl methacrylate and acrolein in a ratio of 1:1 as starting monomers were charged into a polymerization container to make a 1,4-dioxane solution containing 1 mole/L of the monomers. After addition of 20 mole % of 2,2'-azobisisobutylonitrile (AIBN) to the 1,4-dioxane solution, the monomers were polymerized at 80° C. for 8 hours. After completion of the polymerization, the polymerization product was purified by using n-hexane as a precipitant. The copolymer of 2-methyl-2-adamantyl methacrylate and acrolein represented by the following formula was obtained.

The resulting copolymer had a composition ratio (m:n) of 70:30, weight average molecular weight (Mw) of 10,000 (polystyrene standard-equivalent) and degree of polydispersion (Mw/Mn) of 2.10.

Example 84

Triphenylsulfonium triflate ($TPSSO_3CF_3$) as a photoacid generator (PAG) in an amount of 2 wt. % with regard to the copolymer was added to the copolymer of 2-methyl-2-adamantyl methacrylate and acrolein prepared in Example 83, and the mixture was dissolved in cyclohexanone to make a resist solution. The resist solution was spin-coated at 2,000 rpm on a silicon substrate which has been treated with HMDS, and prebaked at 120° C. for 60 seconds on a hot plate to form a 0.4-μm thick resist coating.

After prebaking, the resist coating was selectively exposed to a pattern of laser light having a wavelength of 193 nm on a ArF excimer laser exposure system (Nikon, NA=0.55). The exposed resist coating was then subjected to the post-exposure baking (PEB) at 150° C. for 60 seconds. The postbaked resist coating was developed with an aqueous solution of 2.38 wt. % tetramethylammonium hydroxide (TMAH) for 60 seconds, and rinsed for 30 seconds in a purified water. The positive resist patterns which correspond to the pattern of the laser light as an exposure source were thus obtained without peeling-off of the patterns from the substrate. In this example, a threshold energy Eth of the exposure dose was 1.4 mJ/cm$^2$, and the resolution of the patterns was 0.170 μm L/S.

Example 85

The procedure of Example 84 was repeated with the proviso that, in this example, a KrF excimer laser stepper (Nikon, NA=0.45) was used to produce a pattern of laser light having a wavelength of 248 nm, in place of the ArF excimer laser exposure system. The positive resist patterns which correspond to the pattern of the laser light as an exposure source were thus obtained without peeling-off of the patterns from the substrate. In this example, a threshold energy Eth of the exposure dose was 21.0 mJ/cm$^2$, and the resolution of the patterns was 0.250 μm L/S.

Example 86

2-methyl-2-adamantyl methacrylate and vinyl acetate in a ratio of 7:3 as starting monomers were charged into a polymerization container to make a 1,4-dioxane solution containing 1 mole/L of the monomers. After addition of 20 mole % of 2,2'-azobisisobutylonitrile (AIBN) to the 1,4-dioxane solution, the monomers were polymerized at 80° C. for 8 hours. After completion of the polymerization, the polymerization product was purified by using n-hexane as a precipitant. The copolymer of 2-methyl-2-adamantyl methacrylate and vinyl acetate represented by the following formula was obtained.

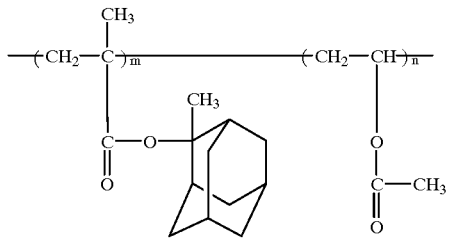
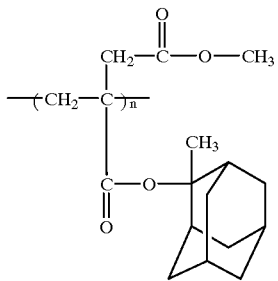

The resulting copolymer had a composition ratio (m:n) of 74:26, weight average molecular weight (Mw) of 8,200 (polystyrene standard-equivalent) and degree of polydispersion (Mw/Mn) of 1.82.

Example 87

Triphenylsulfonium triflate (TPSSO$_3$CF$_3$) as a photoacid generator (PAG) in an amount of 2 wt. % with regard to the copolymer was added to the copolymer of 2-methyl-2-adamantyl methacrylate and vinyl acetate prepared in Example 86, and the mixture was dissolved in cyclohexanone to make a resist solution. The resist solution was spin-coated at 2,000 rpm on a silicon substrate which has been treated with HMDS, and prebaked at 120° C. for 60 seconds on a hot plate to form a 0.4-μm thick resist coating.

After prebaking, the resist coating was selectively exposed to a pattern of laser light having a wavelength of 193 nm on a ArF excimer laser exposure system (Nikon, NA=0.55). The exposed resist coating was then subjected to the post-exposure baking (PEB) at 150° C. for 60 seconds. The postbaked resist coating was developed with an aqueous solution of 2.38 wt. % tetramethylammonium hydroxide (TMAH) for 60 seconds, and rinsed for 30 seconds in a purified water. The positive resist patterns which correspond to the pattern of the laser light as an exposure source were thus obtained without peeling-off of the patterns from the substrate. In this example, a threshold energy Eth of the exposure dose was 2.2 mJ/cm$^2$, and the resolution of the patterns was 0.170 μm L/S.

Example 88

The procedure of Example 87 was repeated with the proviso that, in this example, a KrF excimer laser stepper (Nikon, NA=0.45) was used to produce a pattern of laser light having a wavelength of 248 nm, in place of the ArF excimer laser exposure system. The positive resist patterns which correspond to the pattern of the laser light as an exposure source were thus obtained without peeling-off of the patterns from the substrate. In this example, a threshold energy Eth of the exposure dose was 22.0 mJ/cm$^2$, and the resolution of the patterns was 0.250 μm L/S.

Example 89

α-2-methyl-2-adamantyl-β-methylitaconic acid as a starting monomer was charged into a polymerization container to make a 1,4-dioxane solution containing 1 mole/L of the monomer. After addition of 20 mole % of 2,2'-azobisisobutylonitrile (AIBN) to the 1,4-dioxane solution, the monomer was polymerized at 80° C. for 8 hours. After completion of the polymerization, the polymerization product was purified by using methanol as a precipitant. The polymer of α-2-methyl-2-adamantyl-β-methylitaconic acid represented by the following formula was obtained.

The resulting polymer had a weight average molecular weight (Mw) of 18,000 (polystyrene standard-equivalent) and degree of polydispersion (Mw/Mn) of 1.66.

Example 90

Triphenylsulfonium triflate (TPSSO$_3$CF$_3$) as a photoacid generator (PAG) in an amount of 2 wt. % with regard to the polymer was added to the polymer of a-2-methyl-2-adamantyl-β-methylitaconic acid prepared in Example 89, and the mixture was dissolved in cyclohexanone to make a resist solution. The resist solution was spin-coated at 2,000 rpm on a silicon substrate which has been treated with HMDS, and prebaked at 120° C. for 60 seconds on a hot plate to form a 0.4-μm thick resist coating.

After prebaking, the resist coating was selectively exposed to a pattern of laser light having a wavelength of 193 nm on a ArF excimer laser exposure system (Nikon, NA=0.55). The exposed resist coating was then subjected to the post-exposure baking (PEB) at 150° C. for 60 seconds. The postbaked resist coating was developed with an aqueous solution of 2.38 wt. % tetramethylammonium hydroxide (TMAH) for 60 seconds, and rinsed for 30 seconds in a purified water. The positive resist patterns which correspond to the pattern of the laser light as an exposure source were thus obtained without peeling-off of the patterns from the substrate. In this example, a threshold energy Eth of the exposure dose was 2.0 mJ/cm$^2$, and the resolution of the patterns was 0.175 μm L/S.

Example 91

The procedure of Example 90 was repeated with the proviso that, in this example, a KrF excimer laser stepper (Nikon, NA=0.45) was used to produce a pattern of laser light having a wavelength of 248 nm, in place of the ArF excimer laser exposure system. The positive resist patterns which correspond to the pattern of the laser light as an exposure source were thus obtained without peeling-off of the patterns from the substrate. In this example, a threshold energy Eth of the exposure dose was 28.5 mJ/cm$^2$, and the resolution of the patterns was 0.275 μm L/S.

Example 92

Bis-2-methyl-2-adamantyl fumarate and fumaric acid in a molar ratio of 9:1 as starting monomers were charged into a polymerization container to make a 1,4-dioxane solution containing 1 mole/L of the monomers. After addition of 20 mole % of 2,2'-azobisisobutylonitrile (AIBN) to the 1,4-dioxane solution, the monomers were polymerized at 80° C. for 8 hours. After completion of the polymerization, the polymerization product was purified by using n-hexane as a precipitant. The copolymer of bis-2-methyl-2-adamantyl fumarate and fumaric acid represented by the following formula was obtained.

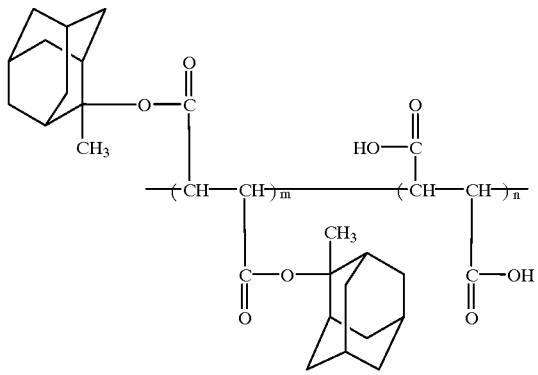

The resulting copolymer had a composition ratio (m:n) of 95:5, weight average molecular weight (Mw) of 5,100 (polystyrene standard-equivalent) and degree of polydispersion (Mw/Mn) of 2.84.

Example 93

Triphenylsulfonium triflate (TPSSO$_3$CF$_3$) as a photoacid generator (PAG) in an amount of 2 wt. % with regard to the copolymer was added to the copolymer of bis-2-methyl-2-adamantyl fumarate and fumaric acid prepared in Example 92, and the mixture was dissolved in cyclohexanone to make a resist solution. The resist solution was spin-coated at 2,000 rpm on a silicon substrate which has been treated with HMDS, and prebaked at 120° C. for 60 seconds on a hot plate to form a 0.4-μm thick resist coating.

After prebaking, the resist coating was selectively exposed to a pattern of laser light having a wavelength of 193 nm on a ArF excimer laser exposure system (Nikon, NA=0.55). The exposed resist coating was then subjected to the post-exposure baking (PEB) at 150° C. for 60 seconds. The postbaked resist coating was developed with an aqueous solution of 0.118 wt. % tetramethylammonium hydroxide (TMAH) for 60 seconds, and rinsed for 30 seconds in a purified water. The positive resist patterns which correspond to the pattern of the laser light as an exposure source were thus obtained without peeling-off of the patterns from the substrate. In this example, a threshold energy Eth of the exposure dose was 2.8 mJ/cm$^2$, and the resolution of the patterns was 0.180 μm L/S.

Example 94

The procedure of Example 93 was repeated with the proviso that, in this example, a KrF excimer laser stepper (Nikon, NA=0.45) was used to produce a pattern of laser light having a wavelength of 248 nm, in place of the ArF excimer laser exposure system. The positive resist patterns which correspond to the pattern of the laser light as an exposure source were thus obtained without peeling-off of the patterns from the substrate. In this example, a threshold energy Eth of the exposure dose was 30.5 mJ/cm$^2$, and the resolution of the patterns was 0.275 μm L/S.

Example 95

2-methyl-2-adamantyl methacrylate and methacrylic acid in a molar ratio of 9:1 as starting monomers were charged into a polymerization container to make a 1,4-dioxane solution containing 1 mole/L of the monomers. After addition of 20 mole % of 2,2'-azobisisobutylonitrile (AIBN) to the 1,4-dioxane solution, the monomers were polymerized at 80° C. for 7 hours. After completion of the polymerization, the polymerization product was dissolved in tetrahydrofuran (THF), and the resulting solution was introduced into much amount of ethanol. The precipitated solution was filtered to obtain the copolymer of 2-methyl-2-adamantyl methacrylate and methacrylic acid at a yield of 44%. The resulting copolymer had a composition ratio (m:n) of 9:1, and weight average molecular weight (Mw) of 9,600 (polystyrene standard-equivalent).

Example 96

Triphenylsulfonium hexafluoroantimonate (TPSSbF$_4$) as a photoacid generator (PAG) in an amount of 5 wt. % with regard to the copolymer was added to the copolymer of 2-methyl-2-adamantyl methacrylate and methacrylic acid prepared in Example 95, and the mixture was dissolved in cyclohexanone to make a resist solution having a resin concentration of 15 wt. %. The resist solution was spin-coated at 2,000 rpm on a silicon substrate which has been treated with HMDS to form a 0.7-μm thick resist coating.

The resist coating was selectively exposed through a masking means to a pattern of laser light having a wavelength of 248 nm on a KrF excimer laser stepper (Nikon, NA=0.45). The exposed resist coating was then subjected to the post-exposure baking (PEB) at 150° C. for 60 seconds on a hot plate. The postbaked resist coating was developed with an aqueous solution of 2.38 wt. % tetramethylammonium hydroxide (TMAH) for 60 seconds, and rinsed for 30 seconds in a purified water. The positive resist patterns which correspond to the pattern of the laser light as an exposure source were thus obtained without peeling-off of the patterns from the substrate. The resist patterns of 0.25 μm L/S were resolved at a ratio of about 1:1.

Further, the resist coating produced in accordance with the above-mentioned manner was exposed to a light pattern of holes each having a diameter of 0.325 μm on a KrF excimer laser stepper. The resist patterns having the holes of the diameter of 0.325 μm which correspond to the pattern of the laser light as an exposure source were obtained.

Example 97

The procedure of Example 97 was repeated with the proviso that, in this example, the amount of TPSSbF$_4$ added was reduced from 5 wt. % to 2 wt. %, the thickness of the resist coating was reduced from 0.7 μm to 0.4 μm, and ArF excimer laser exposure system (Nikon, NA=0.55) was used in place of the KrF excimer laser stepper. The positive resist patterns which correspond to the pattern of the laser light as an exposure source were thus obtained without peeling-off of the patterns from the substrate. The resist patterns of 0.18 μm L/S were resolved at a ratio of about 1:1.

Example 98

2-methyl-2-adamantyl methacrylate, t-butylmethacrylic acid and methacrylic acid in a molar ratio of 40:35:25 as starting monomers were charged into a polymerization container to make a 1,4-dioxane solution containing 1 mole/L of the monomers. After addition of 20 mole % of 2,2'-azobisisobutylonitrile (AIBN) to the 1,4-dioxane solution, the monomers were polymerized at 80° C. for 7 hours. After completion of the polymerization, the polymerization product was dissolved in tetrahydrofuran (THF), and the resulting solution was introduced into much amount of n-hexane. The precipitated solution was filtered to obtain the copolymer of 2-methyl-2-adamantyl methacrylate, t-butylmethacrylic acid and methacrylic acid at a yield of 58%. The resulting copolymer had a composition ratio (l:m:n) of 50:29:21, and weight average molecular weight (Mw) of 12,000 (polystyrene standard-equivalent).

Example 99

Triphenylsulfonium hexafluoroantimonate (TPSSbF$_4$) as a photoacid generator (PAG) in an amount of 5 wt. % with regard to the copolymer was added to the copolymer of 2-methyl-2-adamantyl methacrylate, t-butylmethacrylic acid and methacrylic acid prepared in Example 98, and the mixture was dissolved in cyclohexanone to make a resist solution having a resin concentration of 15 wt. %. The resist solution was spin-coated at 2,000 rpm on a silicon substrate which has been treated with HMDS to form a 0.7-$\mu$m thick resist coating.

The resist coating was selectively exposed through a masking means to a pattern of laser light having a wavelength of 248 nm on a KrF excimer laser stepper (Nikon, NA 0.45). The exposed resist coating was then subjected to the post-exposure baking (PEB) at 130° C. for 60 seconds on a hot plate. The postbaked resist coating was developed with an aqueous solution of 0.17 wt. % tetramethylammonium hydroxide (TMAH) for 60 seconds, and rinsed for 30 seconds in a purified water. The positive resist patterns which correspond to the pattern of the laser light as an exposure source were thus obtained without peeling-off of the patterns from the substrate. The resist patterns of 0.25 $\mu$m L/S were resolved at a ratio of about 1:1.

Further, the resist coating produced in accordance with the above-mentioned manner was exposed to a light pattern of holes each having a diameter of 0.325 $\mu$m on a KrF excimer laser stepper. The resist patterns having the holes of the diameter of 0.325 $\mu$m which correspond to the pattern of the laser light as an exposure source were obtained.

Example 100

The procedure of Example 99 was repeated with the proviso that, in this example, the amount of TPSSbF$_4$ added was reduced from 5 wt. % to 2 wt. %, and ArF excimer laser exposure system (Nikon, NA=0.55) was used in place of the KrF excimer laser stepper. The positive resist patterns which correspond to the pattern of the laser light as an exposure source were thus obtained without peeling-off of the patterns from the substrate. The resist patterns of 0.19 $\mu$m L/S were resoluted at a ratio of about 1:1.

Example 101

2-methyl-2-adamantyl methacrylate, 3-oxocyclohexylmethacrylate and methacrylic acid in a molar ratio of 50:35:15 as starting monomers were charged into a polymerization container to make a 1,4-dioxane solution containing 1 mole/L of the monomers. After addition of 20 mole % of 2,2'-azobisisobutylonitrile (AIBN) to the 1,4-dioxane solution, the monomers were polymerized at 80° C. for 7 hours. After completion of the polymerization, the polymerization product was dissolved in tetrahydrofuran (THF), and the resulting solution was introduced into much amount of the mixed solvent (10:1) of methanol and water. The precipitated solution was filtered to obtain the copolymer of 2-methyl-2-adamantyl methacrylate, 3-oxocyclohexylmethacrylate and methacrylic acid at a yield of 43%. The resulting copolymer had a composition ratio (l:m:n) of 50:35:15, and weight average molecular weight (Mw) of 11,000 (polystyrene standard-equivalent).

Example 102

Triphenylsulfonium hexafluoroantimonate (TPSSbF$_4$) as a photoacid generator (PAG) in an amount of 5 wt. % with regard to the copolymer was added to the copolymer of 2-methyl-2-adamantyl methacrylate, 3-oxocyclohexylmethacrylate and methacrylic acid prepared in Example 101, and the mixture was dissolved in cyclohexanone to make a resist solution having a resin concentration of 15 wt. %. The resist solution was spin-coated at 2,000 rpm on a silicon substrate which has been treated with HMDS to form a 0.7-$\mu$m thick resist coating.

The resist coating was selectively exposed through a masking means to a pattern of laser light having a wavelength of 248 nm on a KrF excimer laser stepper (Nikon, NA=0.45). The exposed resist coating was then subjected to the post-exposure baking (PEB) at 130° C. for 60 seconds on a hot plate. The postbaked resist coating was developed with an aqueous solution of 0.17 wt. % tetramethylammonium hydroxide (TMAH) for 60 seconds, and rinsed for 30 seconds in a purified water. The positive resist patterns which correspond to the pattern of the laser light as an exposure source were thus obtained without peeling-off of the patterns from the substrate. The resist patterns of 0.25 $\mu$m L/S were resolved at a ratio of about 1:1.

Further, the resist coating produced in accordance with the above-mentioned manner was exposed to a light pattern of holes each having a diameter of 0.325 $\mu$m on a KrF excimer laser stepper. The resist patterns having the holes of the diameter of 0.325 $\mu$m which correspond to the pattern of the laser light as an exposure source were obtained.

Example 103

The procedure of Example 102 was repeated with the proviso that, in this example, ArF excimer laser exposure system (Nikon, NA=0.55) was used in place of the KrF excimer laser stepper. The positive resist patterns which correspond to the pattern of the laser light as an exposure source were thus obtained without peeling-off of the patterns from the substrate. The resist patterns of 0.19 $\mu$m L/S were resoluted at a ratio of about 1:1.

Example 104

2-methylcyclohexylmethacrylate, t-butylmethacrylate and methacrylic acid in a molar ratio of 40:35:25 as starting monomers were charged into a polymerization container to make a 1,4-dioxane solution containing 1 mole/L of the monomers. After addition of 20 mole % of 2,2'-azobisisobutylonitrile (AIBN) to the 1,4-dioxane solution, the monomers were polymerized at 80° C. for 7 hours. After completion of the polymerization, the polymerization product was dissolved in tetrahydrofuran (THF), and the resulting solution was introduced into much amount of n-hexane. The precipitated solution was filtered to obtain the copolymer of 2-methylcyclohexylm ethacrylate, t-butylmethacrylate and methacrylic acid at a yield of 63%. The resulting copolymer had a composition ratio (l:m:n) of 50:29:21, and weight average molecular weight (Mw) of 21,000 (polystyrene standard-equivalent).

Example 105

Triphenylsulfonium hexafluoroantimonate (TPSSbF$_4$) as a photoacid generator (PAG) in an amount of 5 wt. % with regard to the copolymer was added to the copolymer of 2-methylcyclohexylmethacrylate, t-butylmethacrylate and methacrylic acid prepared in Example 104, and the mixture was dissolved in cyclohexanone to make a resist solution having a resin concentration of 15 wt. %. The resist solution was spin-coated at 2,000 rpm on a silicon substrate which has been treated with HMDS to form a 35 0.7-$\mu$m thick resist coating.

The resist coating was selectively exposed through a masking means to a pattern of laser light having a wavelength of 248 nm on a KrF excimer laser stepper (Nikon, NA=0.45). The exposed resist coating was then subjected to the post-exposure baking (PEB) at 130° C. for 60 seconds on a hot plate. The postbaked resist coating was developed with an aqueous solution of 0.17 wt. % tetramethylammonium hydroxide (TMAH) for 60 seconds, and rinsed for 30 seconds in a purified water. The positive resist patterns which correspond to the pattern of the laser light as an exposure source were thus obtained without peeling-off of the patterns from the substrate. The resist patterns of 0.25 μm L/S were resolved at a ratio of about 1:1.

Further, the resist coating produced in accordance with the above-mentioned manner was exposed to a light pattern of holes each having a diameter of 0.325 μm on a KrF excimer laser stepper. The resist patterns having the holes of the diameter of 0.325 μm which correspond to the pattern of the laser light as an exposure source were obtained.

Example 106

The procedure of Example 105 was repeated with the proviso that, in this example, the amount of TPSSbF$_4$ added was reduced from 5 wt. % to 2 wt. %, and ArF excimer laser exposure system (Nikon, NA=0.55) was used in place of the KrF excimer laser stepper. The positive resist patterns which correspond to the pattern of the laser light as an exposure source were thus obtained without peeling-off of the patterns from the substrate. The resist patterns of 0.19 μm L/S were resoluted at a ratio of about 1:1.

Example 107

2-butyl-2-adamantyl methacrylate and mevalonic lactone methacrylate in a ratio of 1:1 as starting monomers were charged into a polymerization container to make a 1,4-dioxane solution containing 3 mole/L of the monomers. After addition of 15 mole % of 2,2'-azobisisobutylonitrile (AIBN) as a polymerization initiator to the 1,4-dioxane solution, the monomers were polymerized at 80° C. for about 9 hours. After completion of the polymerization, the polymerization product was purified by using methanol as a precipitant. The copolymer of 2-butyl-2-adamantyl methacrylate and mevalonic lactone methacrylate represented by the following formula was obtained.

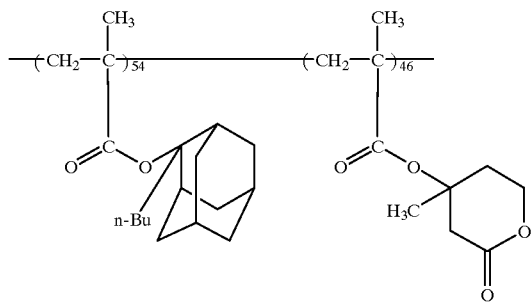

The resulting copolymer had a composition ratio (m:n) of 54:46, weight average molecular weight (Mw) of 7,540 (polystyrene standard-equivalent) and degree of polydispersion (Mw/Mn) of 1.8.

Example 108

Triphenylsulfonium triflate (TPSSO$_3$CF$_3$) as a photoacid generator (PAG) in an amount of 2 wt. % with regard to the copolymer was added to the copolymer of 2-butyl-2-adamantyl methacrylate and mevalonic lactone methacrylate prepared in Example 107, and the mixture was dissolved in cyclohexanone to make a resist solution containing the copolymer in an amount of 14 wt. %. The resist solution was spin-coated on a silicon substrate which has been treated with HMDS, and prebaked at 100° C. for 60 seconds on a hot plate to form a 0.4-μm thick resist coating.

After prebaking, the resist coating was selectively exposed to a pattern of laser light having a wavelength of 193 nm on a ArF excimer laser exposure system (Nikon, NA=0.55). The exposed resist coating was then subjected to the post-exposure baking (PEB) on a hot plate at 100° C. for 60 seconds. The postbaked resist coating was developed with an aqueous solution of 2.38% (0.27N) tetramethylammonium hydroxide (TMAH), NMD-3 (trade name) commercially available from Tokyo Ohka Co., for 60 seconds, and rinsed for 30 seconds in a purified water. The positive resist patterns which correspond to the pattern of the laser light as an exposure source were thus obtained. In this example, a threshold energy Eth of the exposure dose was 3 mJ/cm$^2$, and the resolution of the patterns was 0.17 μm L/S (line & space).

Example 109

This example is a comparative example.

The procedures of Example 108 was repeated. However, in this example, for the comparison purpose, the copolymer used as the resist material was a copolymer of 2-methyl-2-adamantyl methacrylate and mevalonic lactone methacrylate by represented the following formula:

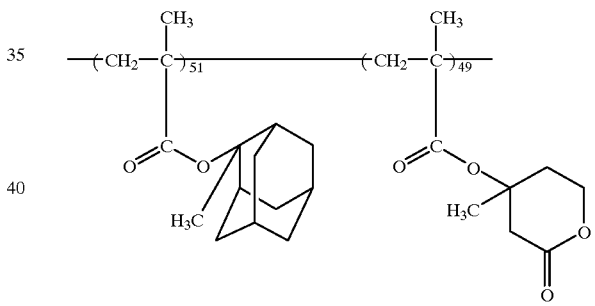

The above copolymer was prepared in accordance with the method similar to that of Example 107, and had a composition ratio (m:n) of 51:40 and weight average molecular weight (Mw) of 8,900.

Using this copolymer, the resist process was carried out in accordance with the method described in Example 108. That is, the photoacid generator TPSSO$_3$CF$_3$ in an amount of 2 wt. % with regard to the copolymer was added to the copolymer of 2-methyl-2-adamantyl methacrylate and mevalonic lactone methacrylate, and the mixture was dissolved in cyclohexanone to make a resist solution containing the copolymer in an amount of 14 wt. %. The resist solution was spin-coated on a silicon substrate which has been treated with HMDS, and prebaked at 100° C. for 60 seconds on a hot plate to form a 0.4-μm thick resist coating.

After prebaking, the resist coating was selectively exposed to a pattern of laser light having a wavelength of 193 nm on a ArF excimer laser exposure system (Nikon, NA=0.55). The exposed resist coating was then subjected to the post-exposure baking (PEB) on a hot plate at 100° C. for 60 seconds. The postbaked resist coating was developed with an aqueous solution of 2.38% (0.27N) tetramethylammonium hydroxide (NMD-3) for 60 seconds, and rinsed for 30 seconds in a purified water. The positive resist patterns which correspond to the pattern of the laser light as an exposure source were thus obtained. In this example, a threshold energy Eth of the exposure dose was 8 mJ/cm², however, the resolution was poor. That is, the patterns of 0.20 μm L/S could not be produced due to falling down of the patterns.

Example 110

This example was carried out to consider the reason why remarkable differences were produced in the resulting resist patterns due to a small difference of the substituent group between Example 108 (containing 2-butyl substituent) and Example 109 (2-methyl substituent; comparative example).

The procedures of Examples 108 and 109 were repeated with the proviso that the amount of the photoacid generator TPSSO₃CF₃ was increased to 5 wt. % with regard to the copolymer. A 0.4-μm resist coating was thus formed.

The resist coating was selectively exposed to a pattern of laser light having a wavelength of 193 nm on a ArF excimer laser exposure system (Nikon, NA=0.55). To evaluate an exposure dose dependency of the resist coating, the exposure energy was changed as is illustrated in the graph of FIG. 1.

After the selective exposure has been completed, the resist coating was post-baked on a hot plate at 100° C. for 60 seconds, developed with the developer (NMD-3) for 60 seconds, and rinsed for 30 seconds in a purified water. The positive resist patterns which correspond to the pattern of the laser light as an exposure source were thus obtained.

To evaluate an exposure dose dependency of the carboxylic acid generation, each of the obtained resist patterns was subjected to an infrared (IR) spectral analysis. The IR absorption spectrum plotted in FIG. 1 was obtained. The obtained absorption spectrum indicates that a height of carbonyl peak due to presence of —COOH group is increased with increase of exposure energy, and is saturated when the exposure energy was increased to a certain level. However, in comparison of the graph of Example 108 (present invention; butyl substituent) with that of Example 109 (comparative example; methyl substituent), it is appreciated that the curve of Example 108 is rapidly rised than that of Example 109. Thus, it is considered from this result that the butyl substituent ensures an effective and significant release of the carboxylic acid, thus resulting in increase of sensitivity, exposure margin and environmental resistance.

Further, the above procedure was repeated to obtain a graph illustrating a degree of shrinkage for various 2-alkyl-2-AdMA (adamantyl methacrylate) homopolymers with different ArF exposure doses with the proviso that the amount of the photoacid generator TPSSO₃CF₃ was changed from 5 wt. % to 2 wt. %. The degree of shrinkage, i.e. reduced thickness after PEB, was calculated from the following equation:

$$\text{degree of shrinkage} = \frac{\text{shrinkage}}{\text{saturated shrinkage}}$$

Figure 2:
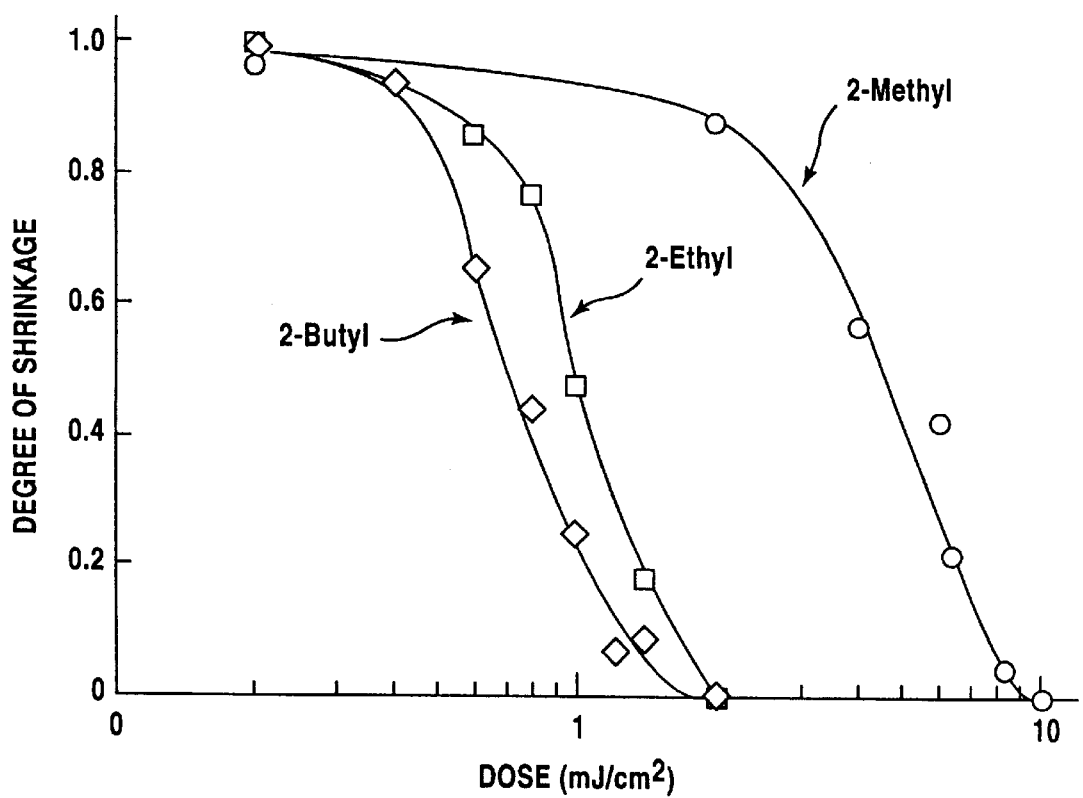
FIG. 2 is a graph illustrating a degree of shrinkage for various 2-alkyl-AdMA homopolymers with different ArF exposure doses.

The results plotted in FIG. 2 indicate that the degree for shrinkage was substantially saturated at the dose of about 2 mJ/cm² for 2-butyl and 2-ethyl substituents, whereas it was substantially saturated at the dose of about 10 mJ/cm² for 2-methyl substituent.

Example 111

The procedure of Example 108 was repeated. However, in this example, the copolymer used as the resist material was a copolymer of 2-ethyl-2-adamantyl methacrylate and mevalonic lactone methacrylate which was prepared in accordance with the method similar to that of Example 107, is represented by the following formula, and has a composition ratio (m:n) of 53:47, weight average molecular weight (Mw) of 9,200 and degree of polydispersion (Mw/Mn) of 2.0.

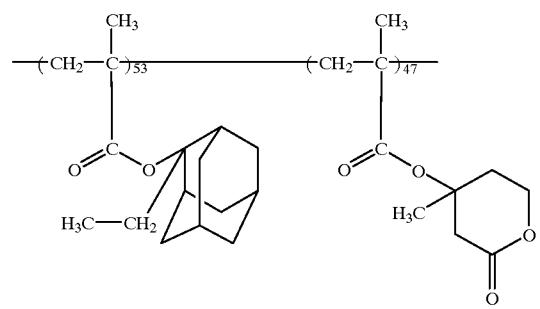

Using this copolymer, the resist process was carried out in accordance with the method described in Example 108. That is, the photoacid generator TPSSO₃CF₃ in an amount of 2 wt. % with regard to the copolymer was added to the copolymer of 2-ethyl-2-adamantyl methacrylate and mevalonic lactone methacrylate, and the mixture was dissolved in cyclohexanone to make a resist solution containing the copolymer in an amount of 14 wt. %. The resist solution was spin-coated on a silicon substrate which has been treated with HMDS, and prebaked at 100° C. for 60 seconds on a hot plate to form a 0.4-μm thick resist coating.

After prebaking, the resist coating was selectively exposed to a pattern of laser light having a wavelength of 193 nm on a ArF excimer laser exposure system (Nikon, NA=0.55). The exposed resist coating was then subjected to the post-exposure baking (PEB) on a hot plate at 100° C. for 60 seconds. The postbaked resist coating was developed with the alkaline developer, NMD-3 (trade name) commercially available from Tokyo Ohka Co., for 60 seconds, and rinsed for 30 seconds in a purified water. The positive resist patterns which correspond to the pattern of the laser light as an exposure source were thus obtained. In this example, a threshold energy Eth of the exposure dose was 4 mJ/cm², and the resolution of the patterns was 0.18 μm L/S.

Example 112

The procedure of Example 108 was repeated. However, in this example, the copolymer used as the resist material was a copolymer of 2-butyl-2-adamantyl methacrylate and methacrylic acid which was prepared in accordance with the method similar to that of Example 107, is represented by the following formula, and has a composition ratio (m:n) of 65:35, weight average molecular weight (Mw) of 3,900 and degree of polydispersion (Mw/Mn) of 2.5.

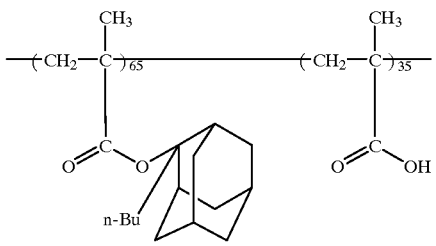

Using this copolymer, the resist process was carried out in accordance with the method described in Example 108. That is, the photoacid generator TPSSO$_3$CF$_3$ in an amount of 2 wt. % with regard to the copolymer was added to the copolymer of 2-butyl-2-adamantyl methacrylate and methacrylic acid, and the mixture was dissolved in cyclohexanone to make a resist solution containing the copolymer in an amount of 14 wt. %. The resist solution was spin-coated on a silicon substrate which has been treated with HMDS, and prebaked at 100° C. for 60 seconds on a hot plate to form a 0.4-μm thick resist coating.

After prebaking, the resist coating was selectively exposed to a pattern of laser light having a wavelength of 193 nm on a ArF excimer laser exposure system (Nikon, NA=0.55). The exposed resist coating was then subjected to the post-exposure baking (PEB) on a hot plate at 130° C. for 60 seconds. The postbaked resist coating was developed with the alkaline developer, 20 times-diluted solution of NMD-3 (trade name) commercially available from Tokyo Ohka Co., for 60 seconds, and rinsed for 30 seconds in a purified water. The positive resist patterns which correspond to the pattern of the laser light as an exposure source were thus obtained. In this example, a threshold energy Eth of the exposure dose was 2 mJ/cm$^2$, and the resolution of the patterns was 0.17 μm L/S.

Example 113

The procedure of Example 108 was repeated. However, in this example, the copolymer used as the resist material was a copolymer of 2-butyl-2-adamantyl methacrylate and anhydrous itaconic acid which was prepared in accordance with the method similar to that of Example 107, is represented by the following formula, and has a composition ratio (m:n) of 58:42, weight average molecular weight (Mw) of 6,500 and degree of polydispersion (Mw/Mn) of 1.8.

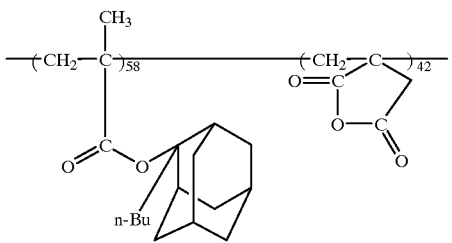

Using this copolymer, the resist process was carried out in accordance with the method described in Example 108. That is, the photoacid generator TPSSO$_3$CF$_3$ in an amount of 2 wt. % with regard to the copolymer was added to the copolymer of 2-butyl-2-adamantyl methacrylate and anhydrous itaconic acid, and the mixture was dissolved in cyclohexanone to make a resist solution containing the copolymer in an amount of 14 wt. %. The resist solution was spin-coated on a silicon substrate which has been treated with HMDS, and prebaked at 100° C. for 60 seconds on a hot plate to form a 0.4-μm thick resist coating.

After prebaking, the resist coating was selectively exposed to a pattern of laser light having a wavelength of 193 nm on a ArF excimer laser exposure system (Nikon, NA=0.55). The exposed resist coating was then subjected to the post-exposure baking (PEB) on a hot plate at 100° C. for 60 seconds. The postbaked resist coating was developed with the alkaline developer, NMD-3 (trade name) commercially available from Tokyo Ohka Co., for 60 seconds, and rinsed for 30 seconds in a purified water. The positive resist patterns which correspond to the pattern of the laser light as an exposure source were thus obtained. In this example, a threshold energy Eth of the exposure dose was 5 mJ/cm$^2$, and the resolution of the patterns was 0.20 μm L/S.

Example 114

This example is a comparative example.

The procedure of Example 113 was repeated. However, in this example, for the comparison purpose, the copolymer used as the resist material was a copolymer of 2-methyl-2-adamantyl methacrylate and anhydrous itaconic acid which was prepared in accordance with the method similar to that of Example 107, is represented by the following formula, and has a composition ratio (m:n) of 55:45, weight average molecular weight (Mw) of 8,500 and degree of polydispersion (Mw/Mn) of 1.9.

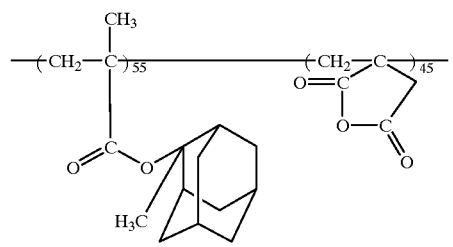

Using this copolymer, the resist process was carried out in accordance with the method described in Example 108. That is, the photoacid generator TPSSO$_3$CF$_3$ in an amount of 2 wt. % with regard to the copolymer was added to the copolymer of 2-methyl-2-adamantyl methacrylate and anhydrous itaconic acid, and the mixture was dissolved in cyclohexanone to make a resist solution containing the copolymer in an amount of 14 wt. %. The resist solution was spin-coated on a silicon substrate which has been treated with HMDS, and prebaked at 100° C. for 60 seconds on a hot plate to form a 0.4-μm thick resist coating.

After prebaking, the resist coating was selectively exposed to a pattern of laser light having a wavelength of 193 nm on a ArF excimer laser exposure system (Nikon, NA=0.55). The exposed resist coating was then subjected to the post-exposure baking (PEB) on a hot plate at 100° C for 60 seconds. The postbaked resist coating was developed with the alkaline developer, NMD-3 (trade name) commercially available from Tokyo Ohka Co., for 60 seconds, and rinsed for 30 seconds in a purified water. No resist pattern was formed, because the resist coating was dissolved and removed from the silicon substrate. In this example, a threshold energy Eth of the exposure dose was 15 mJ/cm$^2$, i.e., very low sensitivity.

Example 115

The procedure of Example 108 was repeated with the proviso that in the development step, an aqueous solution of the same concentration (2.38%; 0.27N) of tetrabutylammonium hydroxide (TBAH) was used as a developer in place of 0.27N tetramethylammonium hydroxide (NMD-3). Satisfactory positive resist patterns comparable to those of Example 108 were obtained. The threshold energy Eth was 5 mJ/cm$^2$, and the resolution was 0.16 μm L/S.

Example 116

The procedure of Example 108 was repeated. However, in this example, the copolymer used as the resist material was a terpolymer of 2-butyl-2-adamantyl methacrylate, t-butyl methacrylate and methacrylic acid which was prepared in accordance with the method similar to that of Example 107, is represented by the following formula, and has a composition ratio (l:m:n) of 58:22:20, weight average molecular weight (Mw) of 12,000 and degree of polydispersion (Mw/Mn) of 2.6.

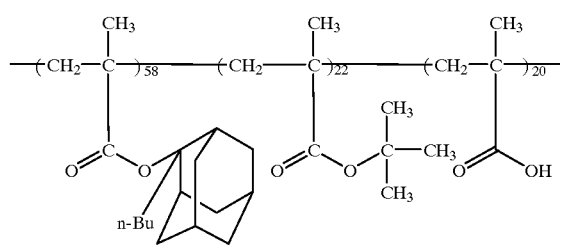

Using this terpolymer, the resist process was carried out in accordance with the method described in Example 108. That is, the photoacid generator TPSSO$_3$CF$_3$ in an amount of 2 wt. % with regard to the terpolymer was added to the terpolymer of 2-butyl-2-adamantyl methacrylate, t-butyl methacrylate and methacrylic acid, and the mixture was dissolved in cyclohexanone to make a resist solution containing the terpolymer in an amount of 14 wt. %. The resist solution was spin-coated on a silicon substrate which has been treated with HMDS, and prebaked at 100° C. for 60 seconds on a hot plate to form a 0.4-μm thick resist coating.

After prebaking, the resist coating was selectively exposed to a pattern of laser light having a wavelength of 193 nm on a ArF excimer laser exposure system (Nikon, NA=0.55). The exposed resist coating was then subjected to the post-exposure baking (PEB) on a hot plate at 100° C. for 60 seconds. The postbaked resist coating was developed with the alkaline developer, 10 times-diluted solution of NMD-3 (trade name) commercially available from Tokyo Ohka Co., for 60 seconds, and rinsed for 30 seconds in a purified water. The positive resist patterns which correspond to the pattern of the laser light as an exposure source were thus obtained. In this example, a threshold energy Eth of the exposure dose was 3 mJ/cm$^2$, and the resolution of the patterns was 0.18 μm L/S.

Example 117

This example is a comparative example.

The procedure of Example 116 was repeated. However, in this example, the terpolymer used as the resist material was a terpolymer of 2-methyl-2-adamantyl methacrylate, t-butyl methacrylate and methacrylic acid which was prepared in accordance with the method similar to that of Example 107, is represented by the following formula, and has a composition ratio (l:m:n) of 55:27:20, weight average molecular weight (Mw) of 160,000 and degree of polydispersion (Mw/Mn) of 1.6.

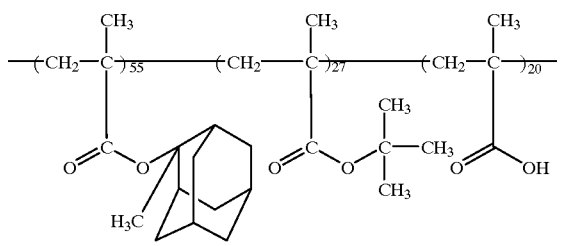

Using this terpolymer, the resist process was carried out in accordance with the method described in Example 108. That is, the photoacid generator TPSSO$_3$CF$_3$ in an amount of 2 wt. % with regard to the terpolymer was added to the terpolymer of 2-methyl-2-adamantyl methacrylate, t-butyl methacrylate and methacrylic acid, and the mixture was dissolved in cyclohexanone to make a resist solution containing the terpolymer in an amount of 14 wt. %. The resist solution was spin-coated on a silicon substrate which has been treated with HMDS, and prebaked at 100° C. for 60 seconds on a hot plate to form a 0.4-μm thick resist coating.

After prebaking, the resist coating was selectively exposed to a pattern of laser light having a wavelength of 193 nm on a ArF excimer laser exposure system (Nikon, NA=0.55). The exposed resist coating was then subjected to the post-exposure baking (PEB) on a hot plate at 100° C. for 60 seconds. The postbaked resist coating was developed with the alkaline developer, 10 times-diluted solution of NMD-3 (trade name) commercially available from Tokyo Ohka Co., for 60 seconds, and rinsed for 30 seconds in a purified water. The positive resist patterns which correspond to the pattern of the laser light as an exposure source were thus obtained. In this example, a threshold energy Eth of the exposure dose was 4 mJ/cm$^2$, however, the resolution was poor. That is, notable falling down and breakage of the patterns were observed at the patterns of 0.19 μm L/S or less.

What is claimed is:

1. A process for the formation of resist patterns which comprises the steps of:

coating a chemically amplified resist composition on a substrate to be fabricated in order to form a resist coating thereon, said resist composition comprising:

I. an alkali-insoluble compound having a structural unit containing a protected alkali-soluble group in which unit a protective moiety of said protected alkali-soluble group is cleaved upon action of an acid generated from a photoacid generator used in combination with said compound, thereby releasing said protective moiety from the alkali-soluble group and converting said compound to an alkali-soluble one, said alkali-soluble group being protected with an alicyclic hydrocarbon group-containing moiety represented by the following

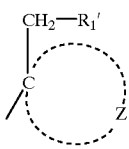

(II′)

$R_1'$ is a methyl, ethyl, propyl or isopropyl group which may be substituted or unsubstituted, and Z represents atoms necessary to complete an alicyclic hydrocarbon group along with a carbon atom to which said —$CH_2$—$R_1'$ is bonded; and II. a photoacid generator capable of being decomposed upon exposure to a patterning radiation to thereby produce an acid capable of causing cleavage of said protective moiety;

selectively exposing said resist coating to a patterning radiation capable of causing generation of an acid from said photoacid generator;

heating the exposed resist coating to a temperature at which the cleavage of said protective moiety is induced; and developing a latent image in the exposed and heated resist coating with an alkaline developer.

* * * * *